(12) United States Patent
Hosaka et al.

(10) Patent No.: US 10,692,994 B2
(45) Date of Patent: Jun. 23, 2020

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Yasuharu Hosaka, Tochigi (JP); Takahiro Iguchi, Kanuma (JP); Masami Jintyou, Shimotsuga (JP); Takashi Hamochi, Tochigi (JP); Junichi Koezuka, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/846,657

(22) Filed: Dec. 19, 2017

(65) Prior Publication Data
US 2018/0182870 A1    Jun. 28, 2018

(30) Foreign Application Priority Data

Dec. 23, 2016  (JP) ................................ 2016-250246
Jan. 26, 2017  (JP) ................................ 2017-012309

(51) Int. Cl.
*H01L 29/10*     (2006.01)
*H01L 29/66*     (2006.01)
(Continued)

(52) U.S. Cl.
CPC .... *H01L 29/66969* (2013.01); *H01L 21/0234* (2013.01); *H01L 21/02323* (2013.01);
(Continued)

(58) Field of Classification Search
CPC ......... H01L 21/47635; H01L 21/47576; H01L 21/385; H01L 29/66969; H01L 29/78648;
(Continued)

(56) References Cited

U.S. PATENT DOCUMENTS 7,674,650 B2   3/2010 Akimoto et al.
8,148,245 B2   4/2012 Ikisawa et al.
(Continued)

FOREIGN PATENT DOCUMENTS

JP    2006-165528 A   6/2006
JP    2012-033908 A   2/2012
(Continued)

*Primary Examiner* — Stephen M Bradley
*Assistant Examiner* — Wasiul Hader
(74) *Attorney, Agent, or Firm* — Robinson Intellectual Property Law Office; Eric J. Robinson

(57) ABSTRACT

To provide a semiconductor device with favorable electrical characteristics. To provide a method for manufacturing a semiconductor device with high productivity. To reduce the temperatures in a manufacturing process of a semiconductor device. An island-like oxide semiconductor layer is formed over a first insulating film; a second insulating film and a first conductive film are formed in this order, covering the oxide semiconductor layer; oxygen is supplied to the second insulating film through the first conductive film; a metal oxide film is formed over the second insulating film in an atmosphere containing oxygen; a first gate electrode is formed by processing the metal oxide film; a third insulating film is formed, covering the first gate electrode and the second insulating film; and first heat treatment is performed. The second insulating film and the third insulating film each include oxide. The highest temperature in the above steps is 340° C. or lower.

11 Claims, 35 Drawing Sheets

(51) Int. Cl.
*H01L 29/786* (2006.01)
*H01L 21/4757* (2006.01)
*H01L 21/4763* (2006.01)
*H01L 21/385* (2006.01)
*H01L 21/02* (2006.01)
*H01L 29/49* (2006.01)

(52) U.S. Cl.
CPC ...... *H01L 21/385* (2013.01); *H01L 21/47576* (2013.01); *H01L 21/47635* (2013.01); *H01L 29/7869* (2013.01); *H01L 29/78603* (2013.01); *H01L 29/78606* (2013.01); *H01L 29/78648* (2013.01); *H01L 29/78696* (2013.01); *H01L 29/4908* (2013.01)

(58) Field of Classification Search
CPC ......... H01L 29/78603; H01L 29/78606; H01L 29/7869; H01L 29/4908
See application file for complete search history.

(56) References Cited

U.S. PATENT DOCUMENTS

| | | | |
|---|---|---|---|
| 8,237,166 B2 | 8/2012 | Kumomi et al. | |
| 8,445,903 B2 | 5/2013 | Inoue et al. | |
| 8,748,879 B2 | 6/2014 | Yano et al. | |
| 8,785,240 B2 | 7/2014 | Watanabe | |
| 8,785,928 B2 | 7/2014 | Yamazaki et al. | |
| 8,878,173 B2 | 11/2014 | Yamazaki | |
| 8,993,386 B2 | 3/2015 | Ohara et al. | |
| 9,171,938 B2 | 10/2015 | Yamazaki et al. | |
| 9,224,758 B2 | 12/2015 | Yamazaki et al. | |
| 9,449,991 B2 | 9/2016 | Yamazaki | |
| 9,530,872 B2 | 12/2016 | Yamazaki et al. | |
| 9,748,403 B2 | 8/2017 | Koezuka et al. | |
| 9,799,290 B2 | 10/2017 | Yamazaki et al. | |
| 9,887,297 B2 | 2/2018 | Tanaka et al. | |
| 10,008,609 B2 | 6/2018 | Koezuka et al. | |
| 10,032,929 B2 | 7/2018 | Koezuka et al. | |
| 2006/0035452 A1 | 2/2006 | Carcia et al. | |
| 2010/0051940 A1 | 3/2010 | Yamazaki et al. | |
| 2010/0051949 A1 | 3/2010 | Yamazaki et al. | |
| 2011/0018915 A1* | 1/2011 | Umezaki ............... G09G 3/3677 345/698 |
| 2011/0227060 A1 | 9/2011 | Miyanaga et al. | |
| 2013/0001612 A1* | 1/2013 | Lee ..................... H01L 27/3211 257/98 |
| 2013/0056719 A1* | 3/2013 | Komatsu ............ H01L 27/3276 257/40 |
| 2013/0105865 A1* | 5/2013 | Honda ................ H01L 29/7869 257/255 |
| 2013/0203214 A1* | 8/2013 | Isobe .................. H01L 21/0237 438/104 |
| 2013/0228775 A1* | 9/2013 | Noda .................. H01L 29/7869 257/43 |
| 2014/0042419 A1* | 2/2014 | Okumoto ............ H01L 27/3276 257/40 |
| 2014/0367682 A1* | 12/2014 | Yamazaki ........... H01L 27/1225 257/43 |
| 2015/0162359 A1* | 6/2015 | Kaneyasu ........... H01L 27/1225 257/43 |
| 2015/0255139 A1* | 9/2015 | Atsumi ............... H01L 29/7869 257/43 |
| 2015/0263141 A1* | 9/2015 | Yamazaki ......... H01L 29/66969 438/104 |
| 2016/0237566 A1* | 8/2016 | Hattori ............. H01L 21/02178 |
| 2016/0260751 A1 | 9/2016 | Okazaki et al. | |

FOREIGN PATENT DOCUMENTS

| | | |
|---|---|---|
| JP | 2014-007396 A | 1/2014 |
| JP | 2015-084412 A | 4/2015 |
| JP | 2016-167585 A | 9/2016 |
| JP | 2016-178299 A | 10/2016 |
| JP | 2016-219801 A | 12/2016 |
| WO | WO-2012/002292 | 1/2012 |
| WO | WO-2016/189414 | 12/2016 |

* cited by examiner

9100

9200

9101

9201

9102

9201

9201

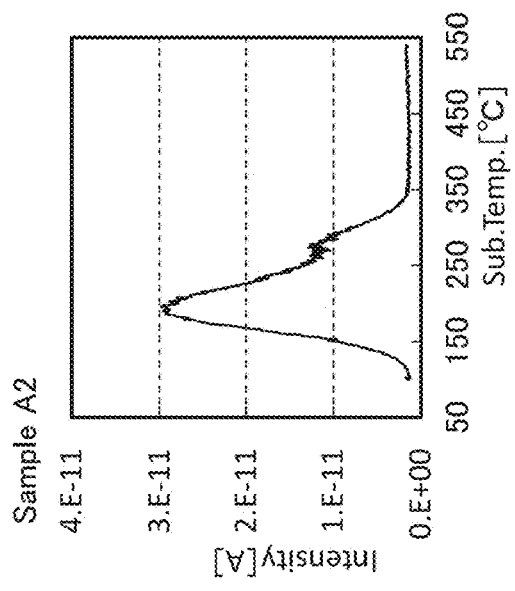
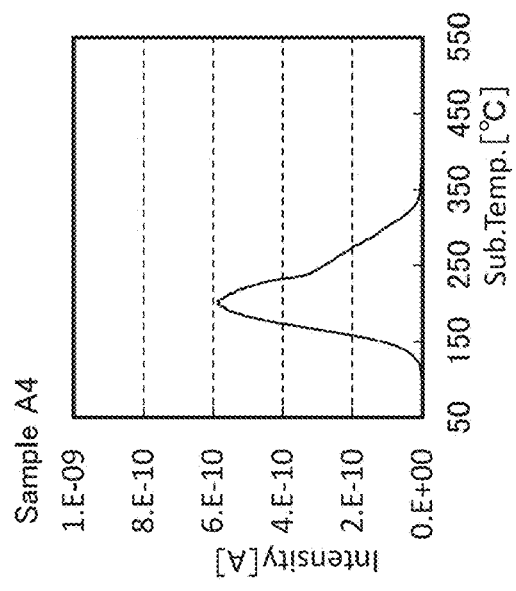
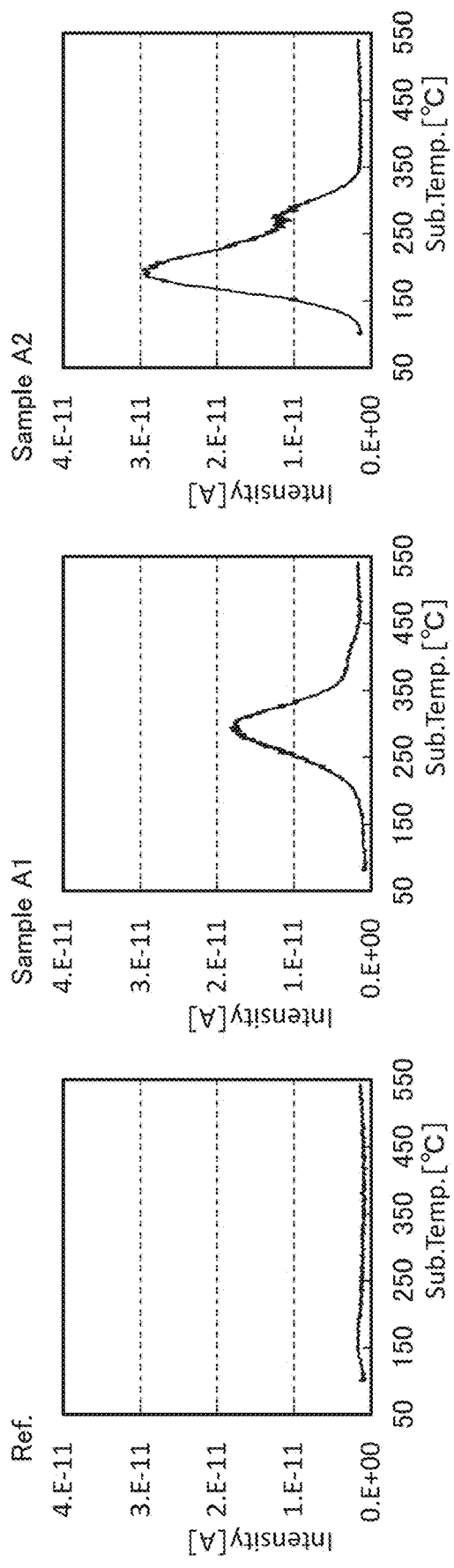
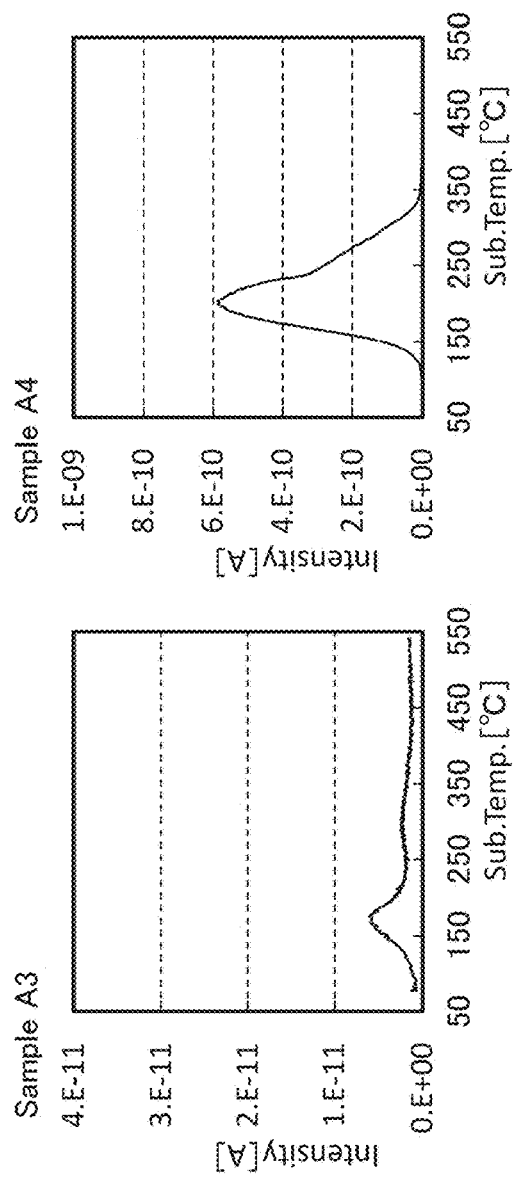
FIG. 24A Ref.
FIG. 24B Sample A1
FIG. 24C Sample A2
FIG. 24D Sample A3
FIG. 24E Sample A4

FIG. 31A  after film deposition of AlOx
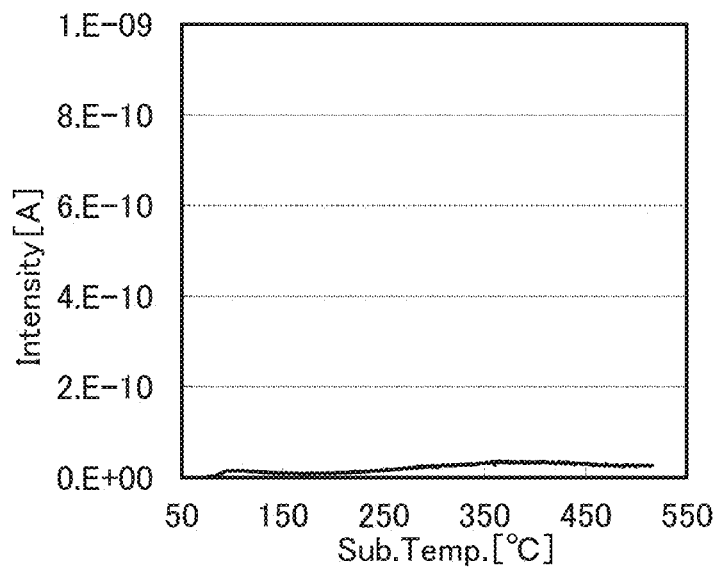
FIG. 31B  after removal of AlOx
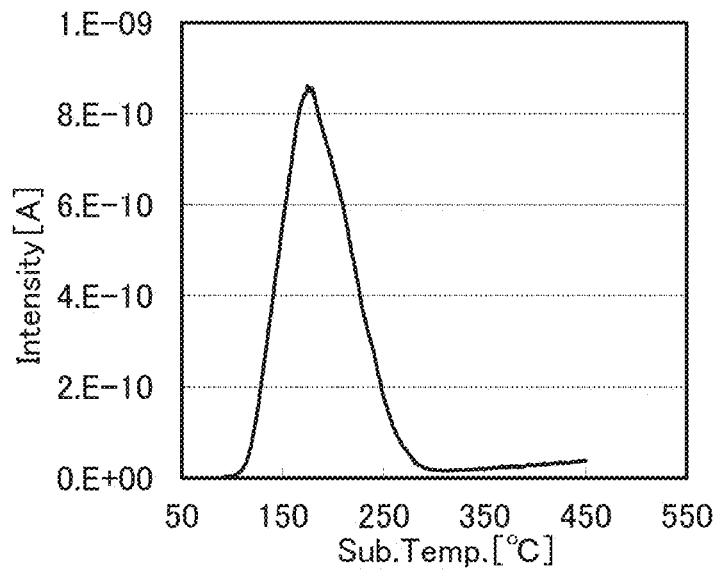

SEMICONDUCTOR DEVICE AND METHOD FOR MANUFACTURING THE SAME

BACKGROUND OF THE INVENTION

1. Field of the Invention

One embodiment of the present invention relates to a semiconductor device and a method for manufacturing the semiconductor device. One embodiment of the present invention particularly relates to a semiconductor device including an oxide semiconductor film and a method for manufacturing the semiconductor device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

In this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device each may include a semiconductor device.

2. Description of the Related Art

A metal oxide has attracted attention recently as a material used for a semiconductor layer of a transistor. For example, a transistor using an amorphous oxide containing indium, gallium, and zinc is known (see Patent Document 1).

A metal oxide that can be used for a semiconductor layer can be formed by a sputtering method or the like, and thus can be used for a semiconductor layer of a transistor in a large display device. In addition, there is an advantage that capital investment can be reduced because part of production equipment for a transistor including amorphous silicon can be retrofitted and utilized. A transistor including an oxide has high field-effect mobility; therefore, a high-performance display device where a display portion and a driver circuit are formed over the same substrate can be obtained.

REFERENCE

[Patent Document]
[Patent Document 1] Japanese Published Patent Application No. 2006-165528

SUMMARY OF THE INVENTION

One object of one embodiment of the present invention is to provide a semiconductor device which has favorable electrical characteristics. Another object is to provide a semiconductor device with stable electrical characteristics. Another object is to provide a method for manufacturing a semiconductor device with high productivity. Another object is to reduce the temperature in a manufacturing process of a semiconductor device. Another object is to provide a method for manufacturing a semiconductor device with a high yield. Another object is to provide a semiconductor device using a flexible substrate.

Note that the descriptions of these objects do not disturb the existence of other objects. In one embodiment of the present invention, there is no need to achieve all the objects. Objects other than the above objects can be derived from the description of the specification and like.

A manufacturing method of a semiconductor device of one embodiment of the present invention includes a first step of forming an island-like oxide semiconductor layer over a first insulating film; a second step of forming a second insulating film and a first conductive film in this order to cover the oxide semiconductor layer; a third step of supplying oxygen to the second insulating film through the first conductive film; a fourth step of forming a metal oxide film over the second insulating film in an atmosphere containing oxygen; a fifth step of forming a first gate electrode by processing the metal oxide film; a sixth step of forming a third insulating film to cover the first gate electrode and the second insulating film; and a seventh step of performing first heat treatment. The second insulating film and the third insulating film each include an oxide. The first to the seventh steps are performed in this order, and the highest temperature in the first to the seventh steps is lower than or equal to 340° C.

In the above embodiment, it is preferable that an eighth step of removing the first conductive film be included between the third step and the fourth step.

In the above embodiment, it is preferable that a ninth step of forming a first layer including an organic compound over a substrate and forming the first insulating film over the first layer be included before the first step, and that a tenth step of separating the substrate and the first layer from each other be included after the seventh step.

In the third step, it is preferable to perform oxygen plasma treatment with an apparatus including a pair of parallel-plate electrodes in a state where a bias voltage is applied between the pair of electrodes.

In the fourth step, it is preferable to form the metal oxide film by a sputtering method in an atmosphere in which oxygen partial pressure is higher than or equal to 50% and lower than or equal to 100%.

In the second step, it is preferable to form the first conductive film to include a metal or a metal oxide and have a thickness of greater than or equal to 2 nm and less than or equal to 10 nm.

In the above embodiment, it is preferable that an eleventh step of performing second heat treatment be included between the first step and the second step. At this time, it is preferable that the second heat treatment be performed in an atmosphere containing nitrogen, and that the highest temperature in the second heat treatment be lower than or equal to 340° C.

In the above embodiment, it is preferable that a twelfth step of forming a second gate electrode be included before the first step. At this time, it is preferable that the first insulating film be formed to cover the second gate electrode.

In the fifth step, it is preferable to process the metal oxide film and the second insulating film so that a part of the oxide semiconductor layer is exposed. At this time, it is preferable that a thirteenth step of forming a fourth insulating film including hydrogen in contact with the exposed part of the oxide semiconductor layer be included between the fifth step and the sixth step.

It is preferable that a fourteenth step of supplying, through the second insulating film, an impurity to the part of the oxide semiconductor layer that is not covered with the first gate electrode be included between the fifth step and the sixth step.

Another embodiment of the present invention is a semiconductor device including a first insulating film, a second insulating film, a third insulating film, a semiconductor layer, a first conductive layer, and a second conductive layer. The semiconductor layer is positioned over the first insulating film. The second insulating film, the first conductive layer, and the second conductive layer are stacked over the semiconductor layer in this order, and top surface shapes of the second insulating film, the first conductive layer, and the second conductive layer are approximately the same. The third insulating film covers the semiconductor layer, the second insulating film, the first conductive layer, and the second conductive layer and is in contact with a part of the semiconductor layer that does not overlap with the first conductive layer. The semiconductor layer and the second conductive layer each include indium, gallium, zinc, and oxygen. The second conductive layer includes a metal or a metal oxide and has a thickness of greater than or equal to 2 nm and less than or equal to 10 nm. The second insulating film includes an oxide, and the third insulating film includes hydrogen and a nitride.

In the above embodiment, the first insulating film is preferably positioned over a layer including an organic compound.

With one embodiment of the present invention, a semiconductor device which has favorable electrical characteristics can be provided. A semiconductor device with stable electrical characteristics can be provided. A method for manufacturing a semiconductor device with high productivity can be provided. The temperature of a manufacturing process of a semiconductor device can be reduced. A method for manufacturing a semiconductor device with a high yield can be provided. A semiconductor device using a flexible substrate can be provided.

Note that the description of these effects does not preclude the existence of other effects. One embodiment of the present invention does not necessarily achieve all the effects listed above. Other effects can be derived from the description of the specification, the drawings, the claims, and the like.

BRIEF DESCRIPTION OF THE DRAWINGS

FIGS. 24A to 24E show TDS measurement results.
FIGS. 31A and 31B show TDS measurement results.

DETAILED DESCRIPTION OF THE INVENTION

Figure 1A:
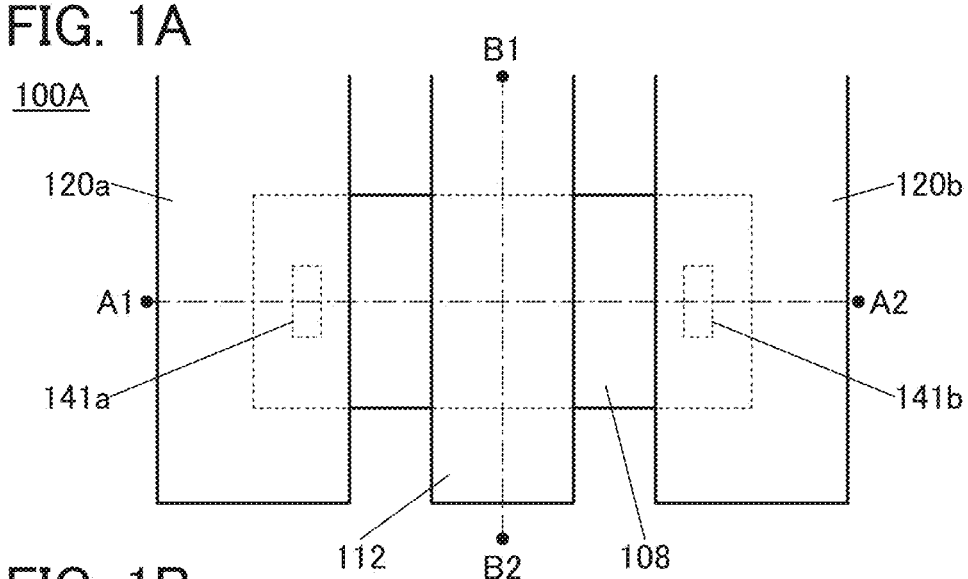
FIGS. 1A to 1C show a structure example of a transistor.

Hereinafter, embodiments will be described with reference to drawings. However, the embodiments can be implemented in many different modes, and it will be readily appreciated by those skilled in the art that modes and details thereof can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and the embodiments are not limited to shapes or values shown in the drawings.

Note that in this specification, ordinal numbers such as "first", "second", and "third" are used in order to avoid confusion among components, and the terms do not limit the components numerically.

In this specification, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor includes a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of different polarity is employed or a direction of current flow is changed in circuit operation, for example. Therefore, the terms "source" and "drain" can be switched in this specification and the like.

Note that in this specification and the like, the term "electrically connected" includes the case where components are connected through an object having any electric function. There is no particular limitation on the "object having any electric function" as long as electric signals can be transmitted and received between components that are connected through the object. Examples of the "object having any electric function" are a switching element such as a transistor, a resistor, an inductor, a capacitor, and an element with a variety of functions as well as an electrode and a wiring.

In this specification and the like, the term "parallel" indicates that the angle formed between two straight lines is greater than or equal to −10° and less than or equal to 10°, and accordingly also includes the case where the angle is greater than or equal to −5° and less than or equal to 50. The term "perpendicular" indicates that the angle formed between two straight lines is greater than or equal to 800 and less than or equal to 1000, and accordingly also includes the case where the angle is greater than or equal to 850 and less than or equal to 95°.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Unless otherwise specified, off-state current in this specification and the like refers to drain current of a transistor in an off state (also referred to as a non-conducting state and a cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean "there is $V_{gs}$ with which the off-state current of the transistor becomes lower than or equal to I". Furthermore, "the off-state current of a transistor" means "the off-state current in an off state at predetermined $V_{gs}$", "the off-state current in an off state at $V_{gs}$ in a predetermined range", "the off-state current in an off state at $V_{gs}$ with which sufficiently reduced off-state current is obtained", or the like.

As an example, the assumption is made of an n-channel transistor where the threshold voltage $V_{th}$ is 0.5 V and the drain current is $1\times10^{-9}$ A at a voltage $V_{gs}$ of 0.5 V, $1\times10^{-13}$ A at a voltage $V_{gs}$ of 0.1 V, $1\times10^{-19}$ A at a voltage $V_{gs}$ of −0.5 V, and $1\times10^{-22}$ A at a voltage $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it can be said that the off-state current of the transistor is $1\times10^{-19}$ A or lower. Since there is $V_{gs}$ at which the drain current of the transistor is $1\times10^{-22}$ A or lower, it may be said that the off-state current of the transistor is $1\times10^{-22}$ A or lower.

In this specification and the like, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is $V_{gs}$ at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at $V_{ds}$ at which the required reliability of a semiconductor device or the like including the transistor is ensured or $V_{ds}$ at which the semiconductor device or the like including the transistor is used. The description "an off-state current of a transistor is lower than or equal to a current I" may mean that there is $V_{gs}$ at which the off-state current of the transistor is lower than or equal to the current I at a voltage $V_{ds}$ of 0.1 V, 0.8 V, 1 V, 1.2 V, 1.8 V, 2.5 V, 3 V, 3.3 V, 10V, 12V, 16 V, or 20 V, at a voltage $V_{ds}$ at which the reliability of a semiconductor device or the like including the transistor is ensured, or at a voltage $V_{ds}$ at which the semiconductor device or the like including the transistor is used.

In the above description of off-state current, a drain may be replaced with a source. That is, the off-state current sometimes refers to a current that flows through a source of a transistor in the off state.

In this specification and the like, the term "leakage current" sometimes expresses the same meaning as "off-state current". In this specification and the like, the off-state current sometimes refers to current that flows between a source and a drain of a transistor in the off state, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of 0 ($I_d$=0 A) and an extrapolated straight line that is tangent with the highest inclination to a plotted curve ($V_g$-$\sqrt{I_d}$ characteristics). Alternatively, the threshold voltage of a transistor may refer to a gate voltage ($V_g$) at which the value of $I_d$ [A]×L [μm]/W [μm] is $1\times10^{-9}$ [A] where L is channel length and W is channel width.

In this specification and the like, a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases, and vice versa.

In this specification and the like, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases, and vice versa.

In this specification and the like, "In:Ga:Zn=4:2:3 or a neighborhood of In:Ga:Zn=4:2:3" refers to an atomic ratio where, when In is 4 with respect to the total number of In, Ga, and Zn atoms, Ga is greater than or equal to 1 and less than or equal to 3 and Zn is greater than or equal to 2 and less than or equal to 4. Furthermore, "In:Ga:Zn=5:1:6 or a neighborhood of In:Ga:Zn=5:1:6" refers to an atomic ratio where, when In is 5 with respect to the total number of In, Ga, and Zn atoms, Ga is greater than 0.1 and less than or equal to 2 and Zn is greater than or equal to 5 and less than or equal to 7. Furthermore, "In:Ga:Zn=1:1:1 or a neighborhood of In:Ga:Zn=1:1:1" refers to an atomic ratio where, when In is 1 with respect to the total number of In, Ga, and Zn atoms, Ga is greater than 0.1 and less than or equal to 2 and Zn is greater than 0.1 and less than or equal to 2.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. An "OS FET" refers to a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" may be stated in some cases. CAAC refers to an example of a crystal structure, and CAC refers to an example of a function or a material composition.

In this specification and the like, a CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC metal oxide, separation of the functions can maximize each function.

In this specification and the like, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, a high on-state current and high field-effect mobility, can be obtained.

In other words, CAC-OS or CAC metal oxide can be called a matrix composite or a metal matrix composite.

An example of a crystal structure of a metal oxide is described. Note that a metal oxide deposited by a sputtering method using an In—Ga—Zn oxide target (In:Ga:Zn=4:2:4.1 in an atomic ratio) is described below as an example. A metal oxide formed by a sputtering method using the above-mentioned target at a substrate temperature of higher than or equal to 100° C. and lower than or equal to 130° C. is referred to as sIGZO, and a metal oxide formed by a sputtering method using the above-mentioned target with the substrate temperature set at room temperature (R.T.) is referred to as tIGZO. For example, sIGZO has one or both crystal structures of nano crystal (nc) and CAAC. Furthermore, tIGZO has a crystal structure of nc. Note that room temperature (R.T.) herein also refers to a temperature of the time when a substrate is not heated intentionally.

Note that the CAAC structure is a crystal structure of a thin film or the like that has a plurality of nanocrystals. The nanocrystals each have c-axis alignment in a particular direction. The nanocrystals each have neither a-axis alignment nor b-axis alignment, and have continuous crystal connection without a grain boundary in the a-axis and b-axis directions.

Note that in crystallography, a general way of choosing a unit cell formed with three axes (crystal axes) of the a-axis, the b-axis, and the c-axis is to choose a unit cell in which a unique axis is used as the c-axis. In particular, in the case of a crystal having a layered structure, a general way of choosing a unit cell is to choose a unit cell in which two axes parallel to the plane direction of a layer are used as the a-axis and the b-axis and an axis intersecting with the layer is used as the c-axis. Typical examples of a crystal having such a layered structure include graphite, which is classified as a hexagonal system. In a unit cell of graphite, the a-axis and the b-axis are parallel to the cleavage plane and the c-axis is orthogonal to the cleavage plane. For example, an $InGaZnO_4$ crystal having a $YbFe_2O_4$ type crystal structure can be classified as a hexagonal system, and, in a unit cell thereof, the a-axis and the b-axis are parallel to the plane direction of the layer and the c-axis is orthogonal to the layer (i.e., orthogonal to the a-axis and the b-axis).

In this specification and the like, a display panel as one embodiment of the display device has a function of displaying (outputting) an image or the like on (to) a display surface; hence, the display panel is one embodiment of an output device.

In this specification and the like, a structure in which a connector such as a flexible printed circuit (FPC) or a tape carrier package (TCP) is attached to a substrate of a display panel, or a structure in which an IC is mounted on a substrate by a chip on glass (COG) method or the like is referred to as a display panel module or a display module, or simply referred to as a display panel or the like in some cases.

In this specification and the like, a touch sensor has a function of sensing the contact, press, approach, or the like of an object such as a finger or a stylus. In addition, the touch sensor may have a function of sensing the positional information. Therefore, the touch sensor is one embodiment of an input device. For example, the touch sensor can include one or more sensor elements.

In this specification and the like, a substrate provided with a touch sensor is referred to as a touch sensor panel or simply referred to as a touch sensor or the like in some cases. Furthermore, in this specification and the like, a structure in which a connector such as an FPC or a TCP is attached to a substrate of a touch sensor panel, or a structure in which an IC is mounted on a substrate by a COG method or the like is referred to as a touch sensor panel module, a touch sensor module, or a sensor module, or simply referred to as a touch sensor or the like in some cases.

Note that in this specification and the like, a touch panel which is one embodiment of the display device has a function of displaying (outputting) an image or the like on (to) a display surface and a function as a touch sensor capable of sensing contact, press, approach, or the like of an object such as a finger or a stylus on or to the display surface. Therefore, the touch panel is an embodiment of an input/output device.

A touch panel can be referred to, for example, a display panel (or a display device) with a touch sensor or a display panel (or a display device) having a touch sensor function.

A touch panel can include a display panel and a touch sensor panel. Alternatively, a touch panel can have a function of a touch sensor inside a display panel or on a surface of the display panel.

In this specification and the like, a structure in which a connector such as an FPC or a TCP is attached to a substrate of a touch panel, or a structure in which an IC is mounted on a substrate by a COG method or the like is referred to as a touch panel module or a display module, or simply referred to as a touch panel or the like in some cases.

Embodiment 1

In this embodiment, a manufacturing method of a semiconductor device that is one embodiment of the present invention and a structure of a semiconductor device capable of being manufactured by the method are described.

One embodiment of the present invention is a manufacturing method of a transistor including, over a formation surface, a semiconductor layer in which a channel is formed, a gate insulating layer over the semiconductor layer, and a gate electrode over the gate insulating layer. The semiconductor layer includes a metal oxide exhibiting a semiconductor property (hereinafter also referred to as an oxide semiconductor). The gate insulating layer includes an oxide.

When a large amount of oxygen vacancy exists in an oxide semiconductor film, the density of defect states in the oxide semiconductor is increased, and accordingly the electrical characteristics of the transistor are adversely affected. Furthermore, oxygen vacancy in the oxide semiconductor interacts with a hydrogen atom in the film to serve as a carrier generation source in some cases. Thus, in a manufacturing process of the transistor, an enough amount of oxygen is introduced into the oxide semiconductor film to reduce the amount of oxygen vacancy, so that a transistor with excellent electrical characteristics can be obtained.

To reduce the amount of oxygen vacancy in the oxide semiconductor film, for example, an oxide film from which oxygen can be released by heating is provided in the vicinity of the oxide semiconductor film and subjected to heat treatment, whereby oxygen can be supplied from the oxide film to the oxide semiconductor film. At this time, as the temperature of the heat treatment is higher, more oxygen can be supplied to the oxide semiconductor film.

Meanwhile, in view of productivity, the highest temperature in the manufacturing process of the transistor is preferably low. In particular, in the case where a large glass substrate is used, the highest temperature in the manufacturing process of the transistor is preferably lower than 350° C., further preferably lower than or equal to 340° C. Furthermore, in the case of manufacturing a transistor over an organic resin or the like with low heat resistance in a flexible device or the like, the highest temperature in the manufacturing process of the transistor needs to be further reduced. When the temperature in the process is high, even a resin material with high heat resistance is decomposed or degassed, for example.

However, when the temperature of the manufacturing process is lowered, particularly when the temperature of the heat treatment is lowered, the amount of oxygen that can be supplied from an oxide insulating film to the semiconductor layer is reduced, so that the amount of oxygen vacancy in the oxide semiconductor film cannot be reduced sufficiently in some cases.

In view of the above, a gate insulating film capable of releasing a sufficient amount of oxygen even at a reduced heat treatment temperature is formed by adding a sufficient amount of oxygen to an insulating film serving as a gate insulating layer over the semiconductor layer. Thus, a semiconductor device (e.g., a transistor) with excellent electrical characteristics can be obtained even when the highest temperature in the process is lowered.

Specifically, two kinds of treatment described below are performed as the treatment for supplying oxygen to the gate insulating layer.

As the gate insulating layer, an insulating film including an oxide is formed to cover the semiconductor layer.

After that, first treatment described below is performed. First, an extremely thin conductive film is formed over the insulating film. Then, treatment for supplying oxygen to the insulating film is performed through the conductive film. At this time, the conductive film serves as a cap film that prevents oxygen from being released from the insulating film in the treatment for supplying oxygen to the insulating film. Thus, excess oxygen can be contained in the insulating film.

As the treatment for supplying oxygen to the insulating film through the conductive film, plasma treatment is preferably performed in an oxygen atmosphere. The plasma treatment is preferably performed using a treatment apparatus including a pair of parallel-plate electrodes and in a state where a bias voltage is applied between the pair of electrodes. The conductive film over the insulating film enables oxygen to be supplied more efficiently.

Note that the method for supplying oxygen is not limited thereto. For example, oxygen may be supplied to the insulating film through the conductive film by an ion implantation method, an ion doping method, a plasma immersion ion implantation method, or the like. At this time, the conductive film can serve as a relieving layer for reducing damage to the insulating film.

Note that the conductive film may be removed after the first treatment. In the case where the conductive film is not removed, the conductive film can serve as a part of a gate electrode. Particularly in the case where the conductive film is formed using a metal, the conductive film is insulated by oxidation by the first treatment, or the conductive film is embrittled by the first treatment. Hence, the conductive film is preferably removed.

In second treatment, an oxide film is formed over the insulating film by a sputtering method in an atmosphere containing oxygen. It is particularly preferable to use a metal oxide film as the oxide film. The metal oxide film is a film that can be used as a gate electrode after being processed into an island shape in a later step. The higher the proportion of an oxygen flow rate to the total flow rate of a deposition gas introduced into a deposition chamber of a deposition apparatus is, the larger the amount of oxygen that is supplied to the insulating film can be. For example, the proportion of the oxygen flow rate (the oxygen flow rate ratio) or the partial pressure of oxygen is set higher than or equal to 50% and lower than or equal to 100%, preferably higher than or equal to 65% and lower than or equal to 100%, further preferably higher than or equal to 80% and lower than or equal to 100%, still further preferably higher than or equal to 90% and lower than or equal to 100%.

Note that the oxide film formed in the second treatment may be an oxide film having a high insulating property (e.g., a silicon oxide film or an aluminum oxide film). In that case, the oxide film can be used as a part of the gate insulating layer. In this case, a conductive film that serves as a gate electrode is formed over the oxide film. The conductive film may be a metal oxide film, a metal film, or an alloy film.

Then, the metal oxide film (or the conductive film) is processed to form the gate electrode. Then, an insulating film is formed to cover the semiconductor layer, the gate insulating layer, and the gate electrode, and then, heat treatment is performed, whereby oxygen can be supplied from the gate insulating layer to the semiconductor layer.

As described above, by performing the treatment of two kinds, an extremely large amount of oxygen can be introduced into the insulating film. The oxygen is supplied to the semiconductor layer by heat treatment performed later and can fill oxygen vacancy in the semiconductor layer. Furthermore, oxygen can be supplied to the semiconductor layer through the insulating film in the first treatment and the second treatment. As a result, even when the temperature of the heat treatment for supplying oxygen from the insulating film to the semiconductor layer is decreased to, for example, a temperature lower than 350° C., lower than or equal to 340° C., or lower than or equal to 300° C., a transistor with excellent electrical characteristics can be obtained.

A more specific example is described below with reference to drawings.

Structure Example 1

A structure example of a transistor that can be manufactured by a manufacturing method of a semiconductor device of one embodiment of the present invention will be described below.

Figure 1B:
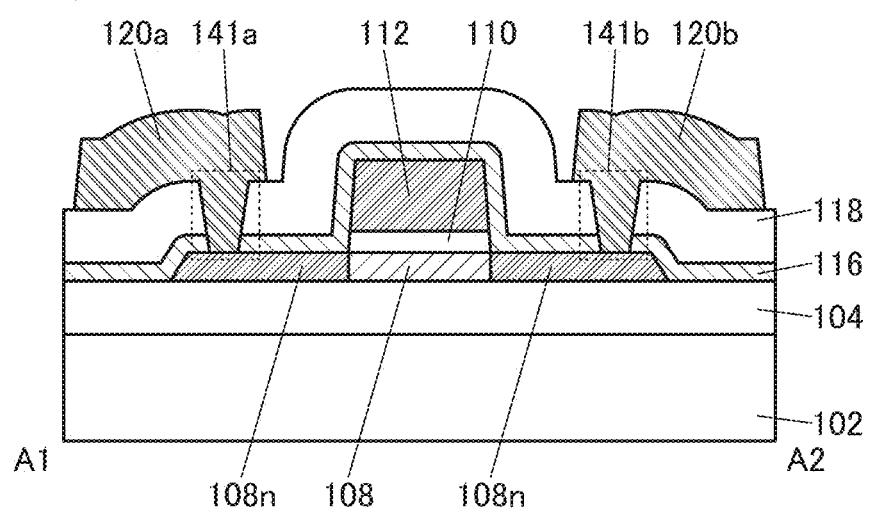
Figure 1C:
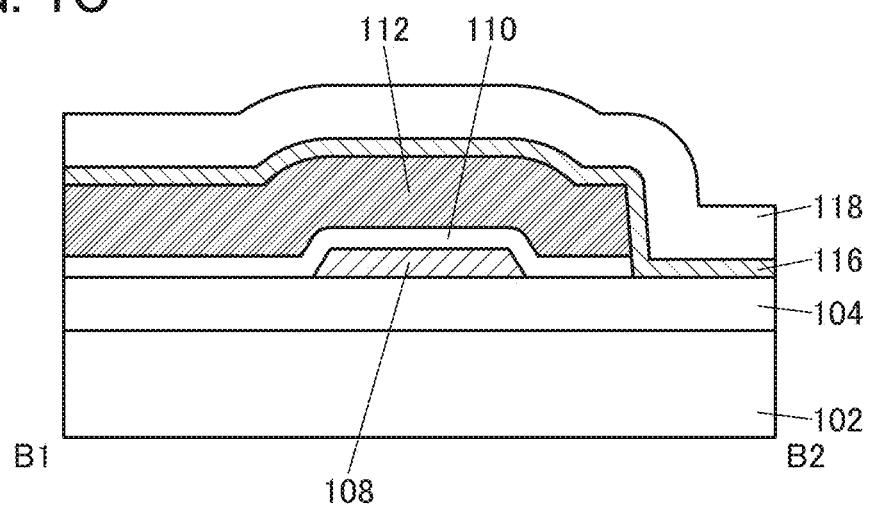

FIG. 1A is a top view of a transistor 100A, FIG. 1B is a cross-sectional view taken along the dashed-dotted line A1-A2 in FIG. 1A, and FIG. 1C is a cross-sectional view taken along the dashed-dotted line B1-B2 in FIG. 1A. Note that in FIG. 1A, some components of the transistor 100A (e.g., a gate insulating layer) are not illustrated. In some cases, the direction of the dashed-dotted line A1-A2 is referred to as a channel length direction, and the direction of the dashed-dotted line B1-B2 is referred to as a channel width direction. As in FIG. 1A, some components are not illustrated in some cases in top views of transistors described below.

The transistor 100A shown in FIGS. 1A to 1C is a transistor having a top-gate structure.

The transistor 100A includes an insulating layer 104 over a substrate 102, a semiconductor layer 108 over the insulating layer 104, an insulating layer 110 over the semiconductor layer 108, a conductive layer 112 over the insulating layer 110, and an insulating layer 116 over the insulating layer 104, the semiconductor layer 108, and the conductive layer 112. A region of the semiconductor layer 108 that overlaps with the conductive layer 112 serves as a channel formation region.

It is preferable that the semiconductor layer 108 include a metal oxide. It is particularly preferable that the semiconductor layer 108 include In, M (M is Al, Ga, Y, or Sn), and Zn.

The semiconductor layer 108 includes regions 108n that do not overlap with the conductive layer 112 and are in contact with the insulating layer 116. The regions 108n are parts of the semiconductor layer 108 and have resistance lower than that of the channel formation region. The regions 108n can also be referred to as regions with high carrier density or n-type regions, for example. The insulating layer 116 in contact with the regions 108n includes nitrogen or hydrogen. Hence, nitrogen or hydrogen in the insulating layer 116 is added to the regions 108n to increase the carrier density, so that the regions 108n can be n-type and have low resistance.

The semiconductor layer 108 preferably includes a region in which the atomic proportion of In is larger than the atomic proportion of M. For example, the atomic ratio of In to M and Zn in the semiconductor layer 108 is preferably In:M:Zn=4:2:3 or the neighborhood thereof.

Note that the composition of the semiconductor layer 108 is not limited to the above. For example, the atomic ratio of In to M and Zn in the semiconductor layer 108 is preferably In:M:Zn=5:1:6 or the neighborhood thereof. The term "neighborhood" includes the following: when In is 5, M is greater than or equal to 0.5 and less than or equal to 1.5, and Zn is greater than or equal to 5 and less than or equal to 7.

In the composition of the semiconductor layer 108, the proportions of In, M, and Zn in the atomic ratio of the semiconductor layer 108 may be approximately equal to each other. That is, a material having an atomic ratio of In:M:Zn=1:1:1 or the neighborhood thereof may be included.

When the semiconductor layer 108 has a region in which the atomic proportion of In is larger than the atomic proportion of M, the transistor 100A can have high field-effect mobility. Specifically, the field-effect mobility of the transistor 100A can be higher than 10 $cm^2$/Vs, preferably higher than 30 $cm^2$/Vs.

For example, the use of the transistor with high field-effect mobility in a gate driver that generates a gate signal allows a display device to have a narrow frame. The use of the transistor with high field-effect mobility in a source driver (particularly in a demultiplexer connected to an output terminal of a shift register included in the source driver) that is included in a display device can reduce the number of wirings connected to the display device.

Even when the semiconductor layer 108 includes a region in which the atomic proportion of In is higher than the atomic proportion of M, the field-effect mobility might be low if the semiconductor layer 108 has high crystallinity.

Note that the crystallinity of the semiconductor layer 108 can be determined by analysis by X-ray diffraction (XRD) or with a transmission electron microscope (TEM), for example.

The conductive layer 112 serving as a gate electrode preferably includes a metal oxide. Accordingly, when a conductive film to be the conductive layer 112 is formed by a sputtering method or the like in an atmosphere containing oxygen, oxygen can be supplied to the insulating layer 110.

The conductive layer 112 can be formed using a conductive oxide such as indium tin oxide (ITO) or indium tin oxide including silicon (ITSO). A conductive oxide including indium is particularly preferable because of its high conductivity.

The conductive layer 112 may be formed using a metal oxide similar to that used to form the semiconductor layer 108. The insulating layer 116 is in contact with the conductive layer 112, whereby the conductive layer 112 can have low resistance like the regions 108n. When the conductive layer 112 and the semiconductor layer 108 are formed using materials having the same composition, a deposition apparatus can be shared, so that the manufacturing cost can be reduced.

As shown in FIGS. 1B and 1C, the transistor 100A includes an insulating layer 118 over the insulating layer 116. The transistor 100A may further include a conductive layer 120a and a conductive layer 120b that are electrically connected to the regions 108n through an opening 141a and an opening 141b that are provided in the insulating layer 116 and the insulating layer 118.

In this specification and the like, the insulating layer 104 may be referred to as a first insulating film, the insulating layer 110 may be referred to as a second insulating film, the insulating layer 116 may be referred to as a third insulating film, and the insulating layer 118 may be referred to as a fourth insulating film. The conductive layer 112 serves as a gate electrode, the conductive layer 120a serves as a source electrode, and the conductive layer 120b serves as a drain electrode.

The insulating layer 110 serving as a gate insulating layer includes an excess oxygen region. Since the insulating layer 110 includes the excess oxygen region, excess oxygen can be supplied to the semiconductor layer 108. As a result, oxygen vacancies that might be formed in the semiconductor layer 108 can be filled with excess oxygen, and the semiconductor device can have high reliability.

To supply excess oxygen to the semiconductor layer 108, excess oxygen may be supplied to the insulating layer 104 that is formed under the semiconductor layer 108. In that case, excess oxygen contained in the insulating layer 104 might also be supplied to the regions 108n, which is not desirable because the resistance of the regions 108n might be increased. In contrast, in the structure in which the insulating layer 110 formed over the semiconductor layer 108 contains excess oxygen, excess oxygen can be selectively supplied only to a region overlapping with the conductive layer 112.

Oxygen vacancy that might be formed in the semiconductor layer 108 will be described.

Oxygen vacancy formed in the semiconductor layer 108 adversely affects the transistor characteristics and therefore cause a problem. For example, hydrogen is trapped in oxygen vacancy formed in the semiconductor layer 108 to serve as a carrier supply source. The carrier supply source generated in the semiconductor layer 108 causes a change in the electrical characteristics, typically, shift in the threshold voltage, of the transistor 100A including the semiconductor layer 108. Therefore, it is preferable that the amount of oxygen vacancy in the semiconductor layer 108 be as small as possible.

In view of this, one embodiment of the present invention is a structure in which an insulating film near the semiconductor layer 108, specifically the insulating layer 110 formed over the semiconductor layer 108, includes excess oxygen. Oxygen or excess oxygen is transferred from the insulating layer 110 to the semiconductor layer 108, whereby the amount of oxygen vacancy in the semiconductor layer 108 can be reduced.

Note that the insulating layer 104 positioned below the semiconductor layer 108 may include excess oxygen. In that case, the excess oxygen is transferred also from the insulating layer 104 to the semiconductor layer 108, whereby oxygen vacancy in the semiconductor layer 108 can be further reduced.

Impurities such as hydrogen or moisture entering the semiconductor layer 108 adversely affect the transistor characteristics and therefore cause a problem. Thus, it is preferable that the amount of impurities such as hydrogen or moisture in the semiconductor layer 108 be as small as possible.

When a metal oxide film in which the impurity concentration is low and the density of defect states is low is used as the semiconductor layer 108, the transistor can have excellent electrical characteristics, which is preferable. Here, the state in which impurity concentration is low and density of defect states is low (the amount of oxygen vacancy is small) is referred to as "highly purified intrinsic" or "substantially highly purified intrinsic". A highly purified intrinsic or substantially highly purified intrinsic metal oxide film has few carrier generation sources, and thus has a low carrier density. Thus, a transistor in which a channel formation region is formed in the metal oxide film rarely has a negative threshold voltage (is rarely normally on). The highly purified intrinsic or substantially highly purified intrinsic metal oxide film has a low density of defect states and accordingly has a low density of trap states in some cases. Furthermore, the highly purified intrinsic or substantially highly purified intrinsic metal oxide film has an extremely low off-state current; even when an element has a channel width of $1\times10^6$ μm and a channel length of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

Structure Example 2

Figure 2A:
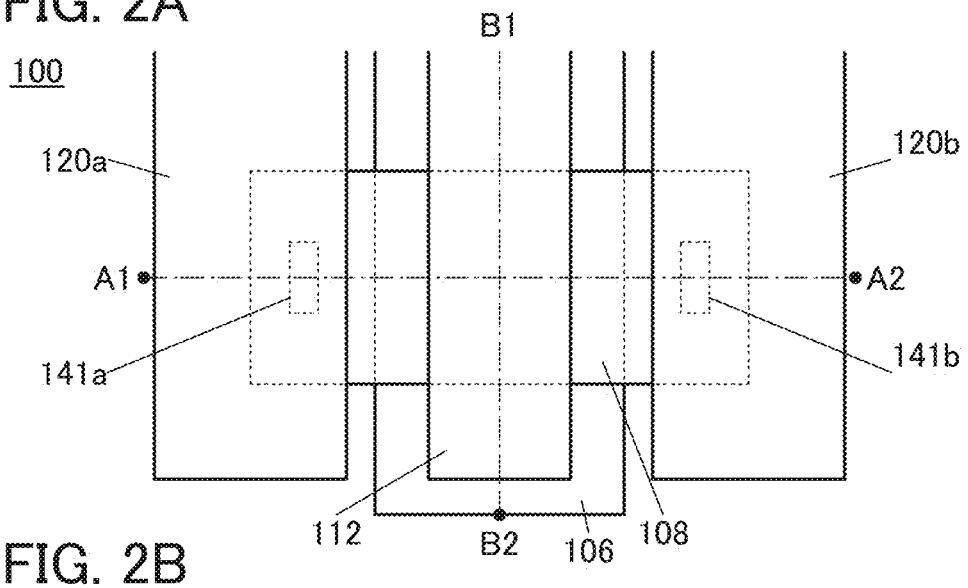
FIGS. 2A to 2C show a structure example of a transistor.
Figure 2B:
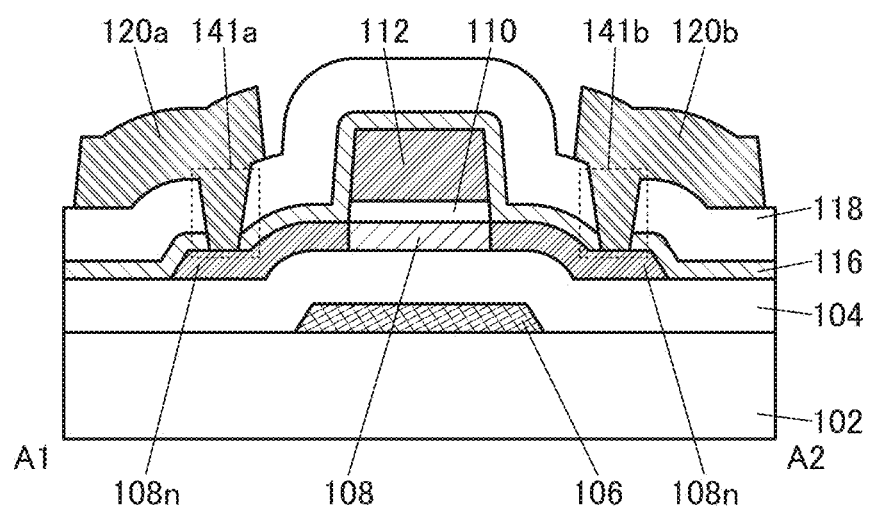
Figure 2C:
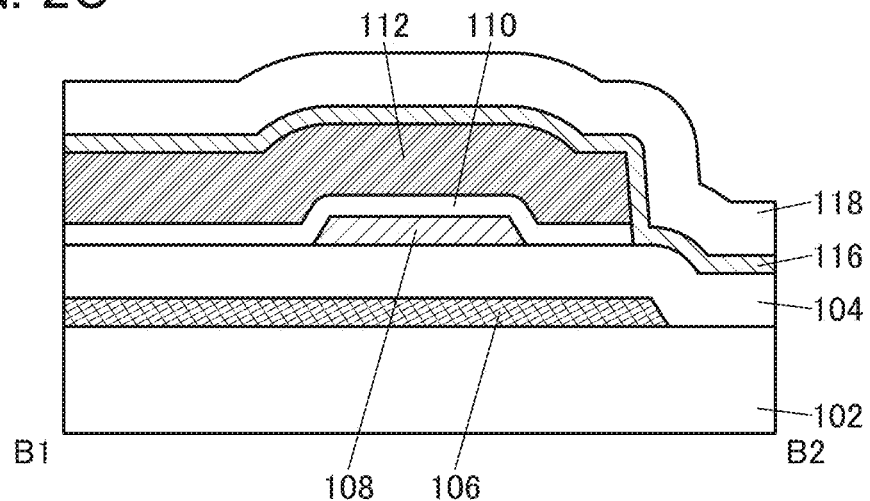

A transistor 100 shown in FIGS. 2A to 2C is partly different from the transistor of Structure example 1.

FIG. 2A is a top view of the transistor 100, FIG. 2B is a cross-sectional view of the transistor 100 in the channel length direction, and FIG. 2C is a cross-sectional view of the transistor 100 in the channel width direction.

The transistor 100 is different from the transistor of Structure example 1 mainly in that the transistor 100 includes a conductive layer 106 between the substrate 102 and the insulating layer 104. The conductive layer 106 includes a region overlapping with the semiconductor layer 108 with the insulating layer 104 positioned therebetween.

In the transistor 100, the conductive layer 106 serves as a first gate electrode (also referred to as bottom gate electrode), and the conductive layer 112 serves as a second gate electrode (also referred to as top gate electrode). A part of the insulating layer 104 serves as a first gate insulating layer, and a part of the insulating layer 110 serves as a second gate insulating layer.

Note that the conductive layer 106 may be electrically connected to the conductive layer 112 through an opening provided in the insulating layer 104 and the insulating layer 110 in a region not shown. In that case, the conductive layer 106 and the conductive layer 112 can be supplied with the same potential.

The conductive layer 106 can be formed using a material similar to that used to form the conductive layer 112, the conductive layer 120a, or the conductive layer 120b. It is particularly suitable to use a material containing copper as the conductive layer 106 because the resistance can be reduced.

As shown in FIG. 2A, the conductive layer 112 and the conductive layer 106 are each preferably longer than the semiconductor layer 108 in the channel width direction. In that case, as shown in FIG. 2C, the semiconductor layer 108 in the channel width direction is wholly covered with the conductive layer 112 and the conductive layer 106 with the insulating layer 110 between the semiconductor layer 108 and the conductive layer 112 and with the insulating layer 104 between the semiconductor layer 108 and the conductive layer 106.

In such a structure, the semiconductor layer 108 can be electrically surrounded by an electric field generated by the pair of gate electrodes. At this time, it is particularly preferable that the same potential be supplied to the conductive layer 106 and the conductive layer 112. In that case, an electric field for inducing a channel can be effectively applied to the semiconductor layer 108, whereby the on-state current of the transistor 100 can be increased. Thus, the transistor 100 can be miniaturized.

Note that a constant potential may be supplied to one of the pair of gate electrodes, and a signal for driving the transistor 100 may be supplied to the other. In this case, the potential supplied to one of the pair of electrodes can control the threshold voltage at the time of driving the transistor 100 with the other electrode.

[Components of Semiconductor Device]

Next, components of the semiconductor device of this embodiment are described in detail.

[Substrate]

There is no particular limitation on the property of a material and the like of the substrate 102 as long as the material has heat resistance enough to withstand at least heat treatment to be performed later. For example, a glass substrate, a ceramic substrate, a quartz substrate, or a sapphire substrate may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Still alternatively, any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated.

Alternatively, a flexible substrate may be used as the substrate 102, and the transistor 100 may be provided directly on the flexible substrate. Alternatively, a separation layer may be provided between the substrate 102 and the transistor 100. The separation layer can be used when a part or the whole of a semiconductor device formed over the separation layer is separated from the substrate 102 and transferred onto another substrate. In such a case, the transistor 100 can be transferred to a substrate having low heat resistance or a flexible substrate as well.

[First Insulating Film]

The insulating layer 104 can be formed by a sputtering method, a CVD method, an evaporation method, a pulsed laser deposition (PLD) method, a printing method, a coating method, or the like as appropriate. The insulating layer 104 can be formed with a single layer or a stack using an oxide insulating film or a nitride insulating film, for example. To improve the properties of the interface with the semiconductor layer 108, at least a region of the insulating layer 104 which is in contact with the semiconductor layer 108 is preferably formed using an oxide insulating film. When the insulating layer 104 is formed using an oxide insulating film from which oxygen is released by heating, oxygen contained in the insulating layer 104 can be moved to the semiconductor layer 108 by heat treatment.

The thickness of the insulating layer 104 can be greater than or equal to 50 nm, greater than or equal to 100 nm and less than or equal to 3000 nm, or greater than or equal to 200 nm and less than or equal to 1000 nm. By increasing the thickness of the insulating layer 104, the amount of oxygen released from the insulating layer 104 can be increased, and interface states at the interface between the insulating layer 104 and the semiconductor layer 108 and oxygen vacancy included in the semiconductor layer 108 can be reduced.

For example, the insulating layer 104 can be formed to have a single-layer structure or stacked-layer structure of a silicon oxide, a silicon oxynitride, a silicon nitride oxide, a silicon nitride, an aluminum oxide, a hafnium oxide, a gallium oxide, a Ga—Zn oxide, or the like. In this embodiment, a stacked-layer structure of a silicon nitride film and a silicon oxynitride film is used as the insulating layer 104. With the insulating layer 104 having such a stacked-layer structure including a silicon nitride film as a lower layer and a silicon oxynitride film as an upper layer, oxygen can be efficiently introduced into the semiconductor layer 108.

A film other than the oxide film, e.g., a silicon nitride film, can be used in the part of the insulating layer 104 that is in contact with the semiconductor layer 108. In this case, pretreatment such as oxygen plasma treatment is preferably performed on a surface of the insulating layer 104 that is in contact with the semiconductor layer 108 to oxidize the surface of the insulating layer 104 or the part near the surface.

[Conductive Film]

The conductive layer 106 serving as a gate electrode and the conductive layers 120a and 120b serving as a source electrode and a drain electrode can be formed using a metal element selected from chromium, copper, aluminum, gold, silver, zinc, molybdenum, tantalum, titanium, tungsten, manganese, nickel, iron, and cobalt; an alloy including any of these metal elements as its component; an alloy including a combination of any of these metal elements; or the like.

Furthermore, the conductive layers 112 and 106 serving as gate electrodes and the conductive layers 120a and 120b serving as a source electrode and a drain electrode can be formed using an oxide conductor or a metal oxide film, such as an oxide including indium and tin (In—Sn oxide), an oxide including indium and tungsten (In—W oxide), an oxide including indium, tungsten, and zinc (In—W—Zn oxide), an oxide including indium and titanium (In—Ti oxide), an oxide including indium, titanium, and tin (In—Ti—Sn oxide), an oxide including indium and zinc (In—Zn oxide), an oxide including indium, tin, and silicon (In—Sn—Si oxide), or an oxide including indium, gallium, and zinc (In—Ga—Zn oxide).

Here, an oxide conductor is described. In this specification and the like, an oxide conductor can also be referred to as OC. For example, oxygen vacancies are formed in a metal oxide, and then hydrogen is added to the oxygen vacancies, so that a donor level is formed in the vicinity of the conduction band. As a result, the conductivity of the metal oxide is increased, so that the metal oxide becomes a conductor. The metal oxide having become a conductor can be referred to as an oxide conductor. A metal oxide generally has a visible light transmitting property because of its large energy gap. An oxide conductor is a metal oxide having a donor level in the vicinity of the conduction band. Therefore, the influence of absorption due to the donor level is small in an oxide conductor, and an oxide conductor has a visible light transmitting property comparable to that of a metal oxide.

It is particularly preferred to use the oxide conductor described above as the conductive layer 112, in which case excess oxygen can be added to the insulating layer 110.

The conductive layer 112 may have a stacked-layer structure of a conductive film including the above-described oxide conductor (metal oxide) and a conductive film including a metal or an alloy. The use of the conductive film including a metal or an alloy can reduce the wiring resistance. At this time, a conductive film including an oxide conductor is preferably used in the part in contact with the insulating layer serving as a gate insulating film.

A Cu—X alloy film (X is Mn, Ni, Cr, Fe, Co, Mo, Ta, or Ti) may be used as the conductive layers 112, 120a, and 120b. The use of a Cu—X alloy film results in lower fabrication costs because the film can be processed by wet etching.

Among the above-mentioned metal elements, any one or more elements selected from titanium, tungsten, tantalum, and molybdenum are preferably included in the conductive layers 112, 120a, and 120b. In particular, a tantalum nitride film is preferably used for the conductive layers 112, 120a, and 120b. A tantalum nitride film has conductivity and a high barrier property against copper or hydrogen. Because a tantalum nitride film releases little hydrogen from itself, it can be favorably used as a conductive film in contact with the semiconductor layer 108 or a conductive film near the semiconductor layer 108.

[Second Insulating Film]

As the insulating layer 110 serving as a gate insulating film of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the insulating layer 110 may have a two-layer structure or a stacked-layer structure including three or more layers.

The insulating layer 110 that is in contact with the semiconductor layer 108 serving as a channel formation region of the transistor 100 is preferably an oxide insulating film and preferably includes a region including oxygen in excess of the stoichiometric composition (oxygen excess region). In other words, the insulating layer 110 is an insulating film capable of releasing oxygen. In order to provide the oxygen excess region in the insulating layer 110, the insulating layer 110 is formed in an oxygen atmosphere, or the deposited insulating layer 110 is subjected to heat treatment in an oxygen atmosphere, for example.

In the case of using hafnium oxide for the insulating layer 110, the following effects are attained. Hafnium oxide has higher dielectric constant than silicon oxide and silicon oxynitride. Therefore, by using hafnium oxide, the thickness of the insulating layer 110 can be made large as compared with the case of using silicon oxide; thus, leakage current due to tunnel current can be low. That is, it is possible to provide a transistor with a low off-state current. Moreover, hafnium oxide with a crystal structure has a higher dielectric constant than hafnium oxide with an amorphous structure. Therefore, it is preferable to use hafnium oxide with a crystal structure in order to provide a transistor with low off-state current. Examples of the crystal structure include a monoclinic crystal structure and a cubic crystal structure. Note that one embodiment of the present invention is not limited to the above examples.

It is preferable that the insulating layer 110 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating layer 110, a silicon oxide film or a silicon oxynitride film whose spin density of a signal due to the E' center is lower than or equal to $3 \times 10^{17}$ spins/cm$^3$ and preferably lower than or equal to $5 \times 10^{16}$ spins/cm$^3$ may be used.

[Metal Oxide Film]

The semiconductor layer 108 can be formed of the metal oxide described above.

Preferred ranges of the atomic ratio of indium, the element M, and zinc contained in the metal oxide according to the present invention are described with reference to FIGS. 13A to 13C. Note that the proportion of oxygen atoms is not illustrated in FIGS. 13A to 13C. The terms of the atomic ratio of indium to the element M and zinc contained in the metal oxide are denoted by [In], [M], and [Zn], respectively.

Figure 13A:
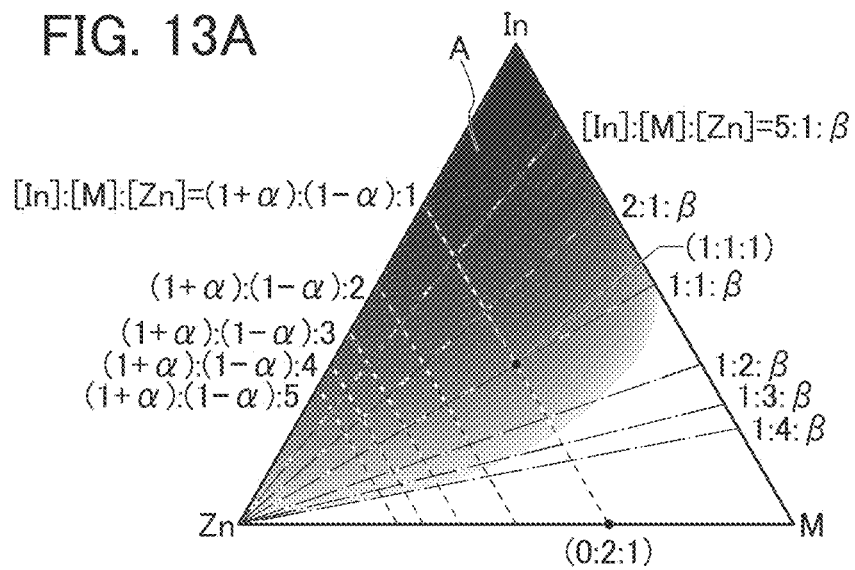
FIGS. 13A to 13C each show an atomic ratio range of a metal oxide of the present invention.
Figure 13B:
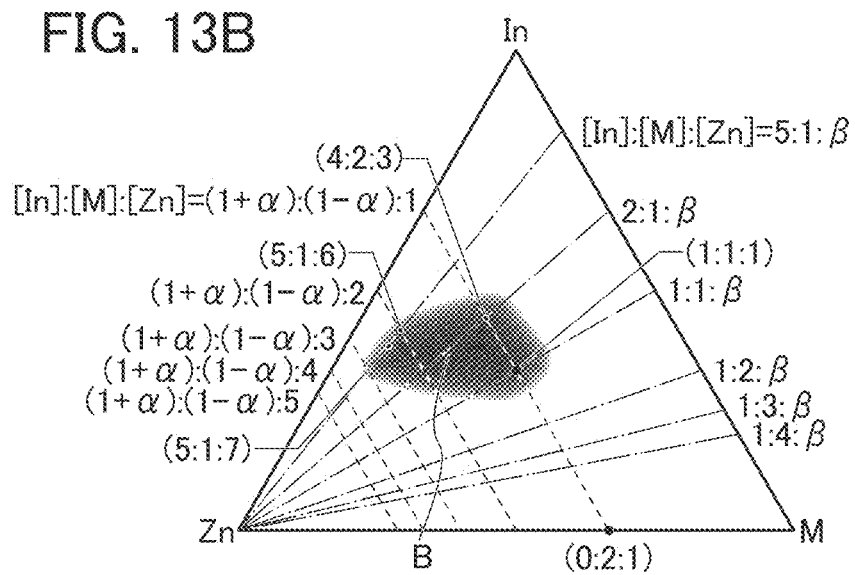
Figure 13C:
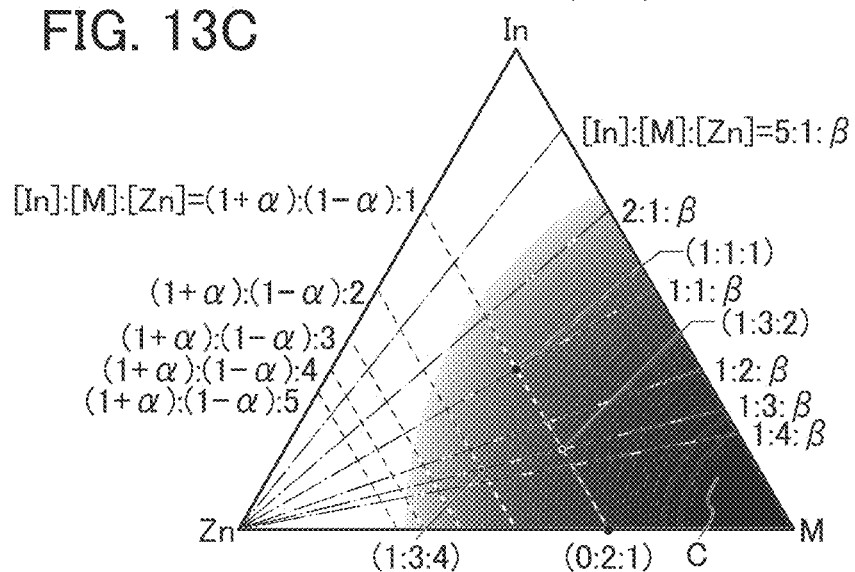

In FIGS. 13A to 13C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$, where $\beta \geq 0$, a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

Furthermore, a metal oxide with the atomic ratio of [In]:[M]:[Zn]=0:2:1 or a neighborhood thereof in FIGS. 13A to 13C tends to have a spinel crystal structure.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

A region A in FIG. 13A shows an example of the preferred ranges of the atomic ratio of indium to the element M and zinc contained in a metal oxide.

The metal oxide containing indium in a higher proportion can have high carrier mobility (electron mobility). Thus, a metal oxide containing indium in a higher proportion has higher carrier mobility than a metal oxide having a low content of indium.

In contrast, when the indium content and the zinc content in a metal oxide become lower, carrier mobility becomes lower. Thus, with an atomic ratio [In]:[M]:[Zn] that is 0:1:0 and the neighborhood thereof (e.g., a region C in FIG. 13C), insulation performance becomes better.

Accordingly, the metal oxide of one embodiment of the present invention preferably has an atomic ratio represented by the region A in FIG. 13A. With the atomic ratio, high carrier mobility is obtained.

A metal oxide having an atomic ratio in the region A, particularly in a region B in FIG. 13B, has high carrier mobility and high reliability and is excellent.

Note that the region B includes an atomic ratio of [In]:[M]:[Zn]=4:2:3 to 4.1 and the neighborhood thereof. The neighborhood includes an atomic ratio of [In]:[M]:[Zn]=5:3:4. Note that the region B includes an atomic ratio of [In]:[M]:[Zn]=5:1:6 and the neighborhood thereof and an atomic ratio of [In]:[M]:[Zn]=5:1:7 and the neighborhood thereof.

Note that the property of a metal oxide is not uniquely determined by an atomic ratio. Even with the same atomic ratio, the property of a metal oxide might be different depending on a formation condition. For example, in the case where the metal oxide is formed with a sputtering apparatus, a film having an atomic ratio deviated from the atomic ratio of a target is formed. In particular, [Zn] in the film might be smaller than [Zn] in the target depending on the substrate temperature in deposition. Thus, the illustrated regions each represent an atomic ratio with which a metal oxide tends to have specific characteristics, and boundaries of the regions A to C are not clear.

In the case where the semiconductor layer 108 is formed of an In-M-Zn oxide, it is preferable to use a target including a polycrystalline In-M-Zn oxide as the sputtering target. Note that the atomic ratio of metal elements in the formed semiconductor layer 108 varies from the above atomic ratios of metal elements of the sputtering targets in a range of ±40%. For example, when a sputtering target with an atomic ratio of In to Ga to Zn of 4:2:4.1 is used to form the semiconductor layer 108, the atomic ratio of In to Ga to Zn in the formed semiconductor layer 108 may be 4:2:3 or the neighborhood of 4:2:3. When a sputtering target with an atomic ratio of In:Ga:Zn=5:1:7 is used to form the semiconductor layer 108, the atomic ratio of In to Ga to Zn in the formed semiconductor layer 108 may be may be 5:1:6 or the neighborhood thereof.

The energy gap of the semiconductor layer 108 is 2 eV or more, preferably 2.5 eV or more. With the use of a metal oxide having such a wide energy gap, the off-state current of the transistor 100 can be reduced.

Furthermore, the semiconductor layer 108 preferably has a non-single-crystal structure. The non-single-crystal structure includes, for example, a CAAC-OS which is described later, a polycrystalline structure, a microcrystalline structure, or an amorphous structure. Among the non-single-crystal structure, the amorphous structure has the highest density of defect states.

[Third Insulating Film]

Furthermore, the insulating layer 116 contains nitrogen or hydrogen. The insulating layer 116 is a nitride insulating film, for example. The nitride insulating film can be formed using a silicon nitride, a silicon nitride oxide, a silicon oxynitride, or the like. The hydrogen concentration in the insulating layer 116 is preferably higher than or equal to $1 \times 10^{22}$ atoms/cm$^3$. The insulating layer 116 is in contact with the regions 108$n$ of the semiconductor layer 108. Thus, the concentration of an impurity (nitrogen or hydrogen) in the regions 108$n$ in contact with the insulating layer 116 is increased, leading to an increase in the carrier density of the regions 108$n$.

[Fourth Insulating Film]

An oxide insulating film, for example, can be used as the insulating layer 118. Alternatively, a stack including an oxide insulating film and a nitride insulating film can be used as the insulating layer 118. The insulating layer 118 can be formed using, for example, a silicon oxide, a silicon oxynitride, a silicon nitride oxide, an aluminum oxide, a hafnium oxide, a gallium oxide, or a Ga—Zn oxide.

Furthermore, the insulating layer 118 preferably serves as a barrier film against hydrogen, water, and the like from the outside.

The thickness of the insulating layer 118 can be greater than or equal to 30 nm and less than or equal to 500 nm, or greater than or equal to 100 nm and less than or equal to 400 nm.

[Example of Manufacturing Method of Transistor]

An example of a manufacturing method of a transistor of one embodiment of the present invention will be described below. Here, description will be made using the transistor 100 in Structure example 2 as an example.

Note that the thin films included in the semiconductor device (i.e., the insulating film, the semiconductor film, the conductive film, and the like) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As an example of the thermal CVD method, a metal organic CVD (MOCVD) method can be given.

Alternatively, the thin films constituting the semiconductor device (i.e., the insulating film, the semiconductor film, the conductive film, and the like) can be formed by a method such as spin coating, dipping, spray coating, inkjet printing, dispensing, screen printing, or offset printing, or with a doctor knife, a slit coater, a roll coater, a curtain coater, or a knife coater.

When thin films included in the semiconductor device are processed, a photolithography method or the like can be used for the processing. Besides, a nanoimprinting method, a sandblasting method, a lift-off method, or the like may be used for the processing of thin films. Alternatively, island-shaped thin films may be formed by a film formation method using a blocking mask such as a metal mask.

There are two typical examples of photolithography methods. In one of the methods, a resist mask is formed over a thin film that is to be processed, and the thin film is processed by etching, so that the resist mask is removed. In the other method, after a photosensitive thin film is deposited, exposure and development is performed, so that the thin film is processed into a desired shape.

As light for exposure in a photolithography method, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

For etching of the thin film, dry etching, wet etching, a sandblast method, or the like can be used.

FIGS. 3A to 3E, FIGS. 4A to 4D, FIGS. 5A to 5C, and FIGS. 6A and 6B are cross-sectional views in the channel length direction illustrating a method for manufacturing the transistor 100.

[Formation of Conductive Layer 106]

Figure 3A:
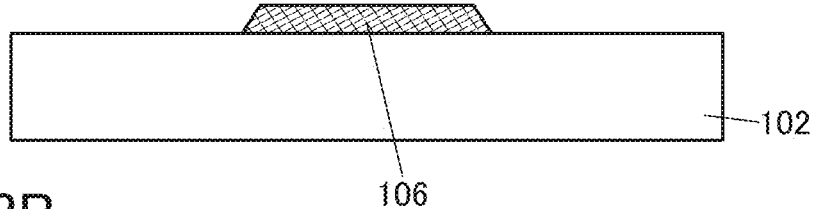
FIGS. 3A to 3E show an example of a method for manufacturing a transistor.

First, the conductive layer 106 is formed over the substrate 102 (FIG. 3A).

The highest temperature in formation of the conductive layer 106 is lower than or equal to 350° C., preferably lower than or equal to 340° C., further preferably lower than or equal to 330° C., still further preferably lower than or equal to 300° C.

[Formation of Insulating Layer 104]

Figure 3B:
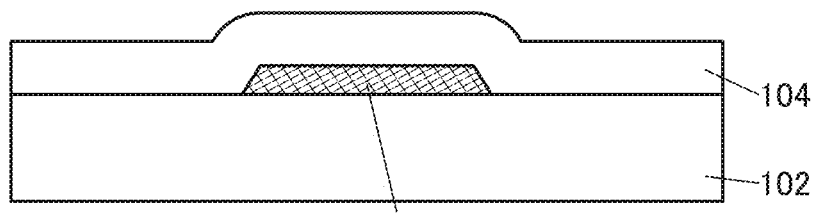

Then, the insulating layer 104 is formed to cover the substrate 102 and the conductive layer 106 (FIG. 3B). The insulating layer 104 is preferably formed by a plasma CVD method or the like.

Figure 3C:
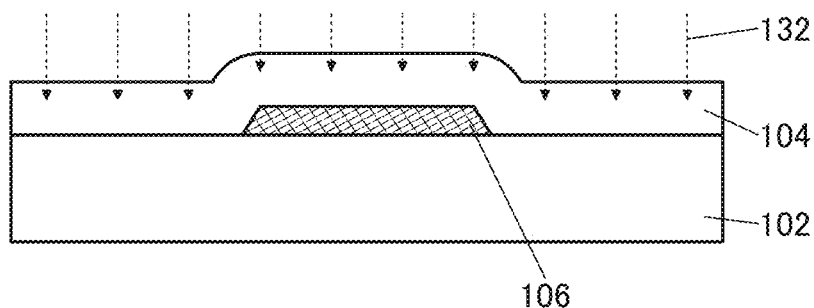
Figure 3D:
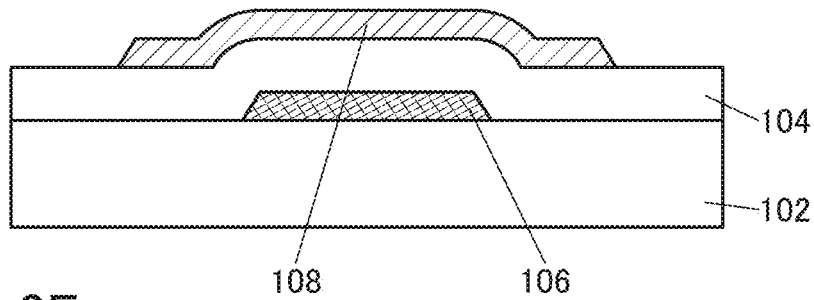

As shown in FIG. 3C, oxygen 132 may be added to the insulating layer 104 after the insulating layer 104 is formed. As oxygen added to the insulating layer 104, an oxygen radical, an oxygen atom, an oxygen atomic ion, an oxygen molecular ion, or the like may be used. Oxygen can be added by an ion doping method, an ion implantation method, a plasma treatment method, or the like. Alternatively, a film that suppresses oxygen release may be formed over the insulating layer 104, and then, oxygen may be added to the insulating layer 104 through the film.

The film that suppresses oxygen release can be formed using a conductive film or a semiconductor film containing one or more of indium, zinc, gallium, tin, aluminum, chromium, tantalum, titanium, molybdenum, nickel, iron, cobalt, and tungsten.

In the case where oxygen is added by plasma treatment in which oxygen is excited by a microwave to generate high-density oxygen plasma, the amount of oxygen added to the insulating layer 104 can be increased. When plasma treatment is performed in an atmosphere containing oxygen, water, hydrogen, or the like adsorbed on the surface of the insulating layer 104 can be removed. Thus, the amount of hydrogen or water which may exist in the semiconductor layer 108 formed later or at an interface between the semiconductor layer 108 and the insulating layer 104 can be reduced.

When a silicon nitride, a silicon nitride oxide, or the like is used as the insulating layer 104, hydrogen may be contained in the insulating layer 104. In this case, with plasma treatment described above, or the like, the hydrogen concentration at least on the semiconductor layer 108 side can be reduced.

The highest temperature in formation of the insulating layer 104 is lower than or equal to 350° C., preferably lower than or equal to 340° C., further preferably lower than or equal to 330° C., still further preferably lower than or equal to 300° C.

[Formation of Semiconductor Layer 108]

Then, the semiconductor layer 108 is formed over the insulating layer 104.

The metal oxide film to be the semiconductor layer 108 is preferably formed by a sputtering method using a metal oxide target.

In forming the metal oxide film, an inert gas (such as a helium gas, an argon gas, or a xenon gas) may be mixed in addition to the oxygen gas. Note that the proportion of the oxygen gas in the whole deposition gas (hereinafter also referred to as an oxygen flow rate ratio) in forming the metal oxide film is higher than or equal to 0% and lower than or equal to 100%, preferably higher than or equal to 5% and lower than or equal to 20%.

When a metal oxide film with relatively low crystallinity is formed with a low oxygen flow rate ratio, a transistor with high on-state current can be obtained.

For example, the metal oxide film is formed at a substrate temperature higher than or equal to room temperature and lower than or equal to 180° C., preferably higher than or equal to room temperature and lower than or equal to 140° C. The substrate temperature when the metal oxide film is formed is preferably, for example, higher than or equal to room temperature and lower than 140° C. because the productivity is increased.

The thickness of the semiconductor layer 108 is greater than or equal to 3 nm and less than or equal to 200 nm, preferably greater than or equal to 3 nm and less than or equal to 100 nm, more preferably greater than or equal to 3 nm and less than or equal to 60 nm.

In the case where a large-sized glass substrate (e.g., the 6th generation to the 10th generation) is used as the substrate 102 and the metal oxide film is formed at a substrate temperature higher than or equal to 200° C. and lower than or equal to 300° C., the substrate 102 might be changed in shape (distorted or warped). Therefore, in the case where a large-sized glass substrate is used, the change in the shape of the glass substrate can be suppressed by forming the metal oxide film at a substrate temperature higher than or equal to room temperature and lower than 200° C.

In addition, increasing the purity of a sputtering gas is necessary. For example, as an oxygen gas or an argon gas used as a sputtering gas, a gas which is highly purified to have a dew point of −40° C. or lower, preferably −80° C. or lower, further preferably −100° C. or lower, still further preferably −120° C. or lower is used, whereby entry of moisture or the like into the metal oxide film can be minimized.

In the case where the metal oxide film is formed by a sputtering method, a chamber in a sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity for the metal oxide, as much as possible. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably $5\times10^{-5}$ Pa.

To process the metal oxide film to be the semiconductor layer 108, a wet etching method and/or a dry etching method can be used.

After the metal oxide film is formed or after the semiconductor layer 108 is formed by processing the metal oxide film, heat treatment may be performed to dehydrogenate or dehydrate the metal oxide film or the semiconductor layer 108. The temperature of the heat treatment is typically higher than or equal to 150° C. and lower than the strain point of the substrate, higher than or equal to 250° C. and lower than or equal to 350° C., or higher than or equal to 300° C. and lower than or equal to 350° C.

The heat treatment can be performed in an inert atmosphere containing nitrogen or a rare gas such as helium, neon, argon, xenon, or krypton. Alternatively, the heat treatment may be performed in an inert atmosphere first, and then, in an oxygen atmosphere. It is preferable that the above inert gas atmosphere and the above oxygen atmosphere do not contain hydrogen, water, and the like. The treatment time may be longer than or equal to 3 minutes and shorter than or equal to 24 hours.

An electric furnace, an RTA apparatus, or the like can be used for the heat treatment. The use of an RTA apparatus allows the heat treatment to be performed at a temperature higher than or equal to the strain point of the substrate if the heating time is short. Therefore, the heat treatment time can be shortened.

By depositing the metal oxide film while it is heated or by performing heat treatment after the deposition of the metal oxide film, the hydrogen concentration in the metal oxide film, which is measured by SIMS, can be $5\times10^{19}$ atoms/cm$^3$ or lower, $1\times10^{19}$ atoms/cm$^3$ or lower, $5\times10^{18}$ atoms/cm$^3$ or lower, $1\times10^{18}$ atoms/cm$^3$ or lower, $5\times10^{17}$ atoms/cm$^3$ or lower, or $1\times10^{16}$ atoms/cm$^3$ or lower.

The highest temperature in formation of the semiconductor layer 108 is lower than or equal to 350° C., preferably lower than or equal to 340° C., further preferably lower than or equal to 330° C., still further preferably lower than or equal to 300° C.

[Formation of Insulating Layer 110]

Figure 3E:
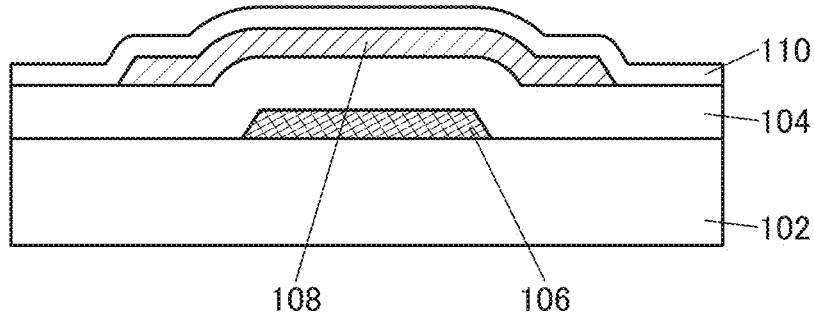

Then, the insulating layer 110 is formed over the semiconductor layer 108 and the insulating layer 104 (see FIG. 3E).

For the insulating layer 110, an oxide film such as a silicon oxide film or a silicon oxynitride film is preferably formed with a plasma-enhanced chemical vapor deposition apparatus (a PECVD apparatus or simply referred to as a plasma CVD apparatus). In this case, a deposition gas including silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

A silicon oxynitride film having few defects can be formed as the insulating layer 110 with the PECVD apparatus under the conditions that the flow rate of the oxidizing gas is more than 20 times and less than 100 times, or more than or equal to 40 times and less than or equal to 80 times the flow rate of the deposition gas and that the pressure in a treatment chamber is lower than 100 Pa or lower than or equal to 50 Pa.

As the insulating layer 110, a dense silicon oxide film or a dense silicon oxynitride film can be formed under the following conditions: the substrate placed in a vacuum-evacuated treatment chamber of a PECVD apparatus is held at a temperature higher than or equal to 280° C. and lower than or equal to 350° C., the pressure in the treatment chamber into which a source gas is introduced is set to be higher than or equal to 20 Pa and lower than or equal to 250 Pa, preferably higher than or equal to 100 Pa and lower than or equal to 250 Pa, and a high-frequency power is supplied to an electrode provided in the treatment chamber.

The insulating layer 110 may be formed by a PECVD method using a microwave. A microwave refers to a wave in the frequency range of 300 MHz to 300 GHz. In a microwave, electron temperature and electron energy are low. Furthermore, in supplied power, the proportion of power used for acceleration of electrons is low, and therefore, power can be used for dissociation and ionization of more molecules. Thus, plasma with high density (high-density plasma) can be excited. This method causes little plasma damage to the deposition surface or a deposit, so that the insulating layer 110 having few defects can be formed.

Alternatively, the insulating layer 110 can also be formed by a CVD method using an organosilane gas. As the organosilane gas, any of the following silicon-containing compound can be used: tetraethyl orthosilicate (TEOS) (chemical formula: Si(OC$_2$H$_5$)$_4$); tetramethylsilane (TMS) (chemical formula: Si(CH$_3$)$_4$); tetramethylcyclotetrasiloxane (TMCTS); octamethylcyclotetrasiloxane (OMCTS); hexamethyldisilazane (HMDS); triethoxysilane (SiH(OC$_2$H$_5$)$_3$); trisdimethylaminosilane (SiH(N(CH$_3$)$_2$)$_3$); or the like. The insulating layer 110 having high coverage can be formed by a CVD method using an organosilane gas.

The highest temperature in formation of the insulating layer 110 is lower than or equal to 350° C., preferably lower than or equal to 340° C., further preferably lower than or equal to 330° C., still further preferably lower than or equal to 300° C.

[Formation of Conductive Film 130]

Figure 4A:
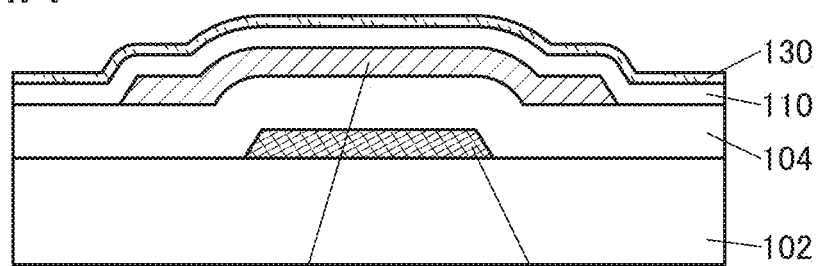
FIGS. 4A to 4D show an example of a method for manufacturing a transistor.

Then, a conductive film 130 is formed to cover the insulating layer 110 (FIG. 4A).

As the conductive film 130, a metal oxide film, a metal film, or an alloy film can be used. An extremely thin film is preferable for the conductive film 130, and the thickness can be, for example, greater than or equal to 1 nm and less than or equal to 20 nm, preferably greater than or equal to 2 nm and less than or equal to 15 nm, further preferably greater than or equal to 3 nm and less than or equal to 10 nm, typically about 5 nm.

Examples of the metal oxide that can be used for the conductive film 130 include an In—Sn oxide, an In—W oxide, an In—W—Zn oxide, an In—Ti oxide, an In—Ti—Sn oxide, an In—Zn oxide, an In—Sn—Si oxide, and an In—Ga—Zn oxide.

Alternatively, as the conductive film 130, a metal film or an alloy film containing one or more of aluminum, titanium, chromium, iron, cobalt, nickel, copper, zinc, gallium, molybdenum, silver, indium, tin, tantalum, tungsten, and the like can be used.

Note that as the conductive film 130, a semiconductor film may be used. Such a semiconductor film includes silicon, germanium, or the like, a compound semiconductor thereof, an oxide semiconductor, or the like.

When the conductive film 130 is formed using a metal oxide in an atmosphere containing oxygen by a sputtering method or the like, oxygen can be supplied to the insulating layer 110 while the conductive film 130 is being formed. Thus, the metal oxide is preferably used.

The highest temperature in formation of the conductive film 130 is lower than or equal to 350° C., preferably lower than or equal to 340° C., further preferably lower than or equal to 330° C., still further preferably lower than or equal to 300° C.

[First Oxygen Supply Treatment]

Figure 4B:
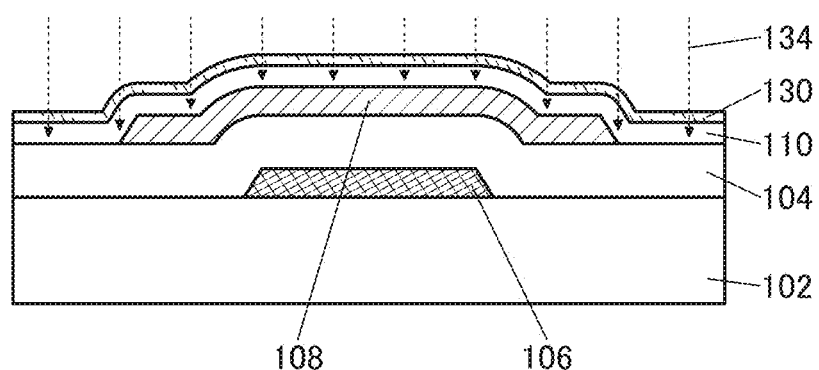

Then, treatment for supplying oxygen 134 to the insulating layer 110 through the conductive film 130 (hereinafter, referred to as oxygen supply treatment) is performed (FIG. 4B).

As the oxygen supply treatment, plasma treatment in an oxygen atmosphere (also referred to as oxygen plasma treatment) is preferably performed. When oxygen is made to be plasma, an oxygen radical, an oxygen atom, or an oxygen ion can be added to the insulating layer 110 through the conductive film 130. The oxygen flow rate ratio in a gas introduced into an apparatus is preferably high, for example, higher than or equal to 50% and lower than or equal to 100%, preferably higher than or equal to 60% and lower than or equal to 100%, further preferably higher than or equal to 80% and lower than or equal to 100%, still further preferably 100%.

In particular, a treatment apparatus including parallel-plate electrodes (a pair of electrodes) is preferably used for the treatment apparatus. In this case, by performing plasma treatment in a state where a bias voltage is applied between the pair of electrodes, a larger amount of oxygen can be supplied to the insulating layer 110. The bias voltage is applied so that the oxygen ion in the oxygen plasma easily transfers on the substrate side, for example. The oxygen ion in the oxygen plasma is easily charged positively to be $O^+$, $O^{2+}$, or the like, for example. Thus, when a bias voltage is applied so that the electrode positioned on the substrate side has a negative potential, the oxygen ion easily transfers toward the substrate side.

If oxygen is supplied directly to the insulating layer 110 in a structure without the conductive film 130, part of the oxygen supplied to the insulating layer 110 is released to the outside in some cases. However, in this manufacturing method example, the conductive film 130 is provided over the insulating layer 110, and thus the oxygen supplied to the insulating layer 110 can be prevented from being released to the outside. Furthermore, with the conductive film 130, the damage to the insulating layer 110 can be alleviated.

The conductive film 130 over the insulating layer 110 brings an effect of drawing the ionized oxygen easily when a bias voltage is applied between the pair of electrodes in the oxygen supply treatment. Thus, with the conductive film 130, the effect obtained by application of the bias voltage is synergistically increased.

As the treatment apparatus, a dry etching apparatus, an ashing apparatus, a PECVD apparatus, or the like is preferably used because the above apparatus can also be used in other treatment. In particular, an ashing apparatus is preferably used.

The oxygen supply treatment is, for example, higher than or equal to room temperature and lower than or equal to 350° C., preferably higher than or equal to 150° C. and lower than 350° C., further preferably higher than or equal to 200° C. and lower than or equal to 340° C.

When a bias voltage is applied between a pair of electrodes in the treatment chamber, the bias voltage may be higher than or equal to 10 V and lower than or equal to 1 kV, for example. The power density of bias voltage may be higher than or equal to 1 W/cm$^2$ and lower than or equal to 5 W/cm$^2$, for example.

The oxygen supply treatment is not limited to the above, and a method enabling the supply of oxygen to the insulating layer 110 through the conductive film 130 can be used. For example, oxygen may be supplied to the insulating film through the conductive film by an ion implantation method, an ion doping method, a plasma immersion ion implantation method, or the like. Alternatively, heat treatment may be performed in an oxygen atmosphere. Even with such treatment, the conductive film 130 can serve as a cap film for preventing the release of the oxygen supplied to the insulating layer 110 and also serve as a relieving layer for reducing the damage to the insulating layer 110.

[Removal of Conductive Film 130]

The conductive film 130 is embrittled through the oxygen supply treatment in some cases. In particular, when a metal or an alloy is used for the conductive film 130, the conductive film 130 is oxidized through the oxygen supply treatment and has high resistance in some cases. Furthermore, the conductive film 130 is partly etched and thus thinned in some cases. In such a case, it is preferable that the conductive film 130 be removed by etching.

Figure 4C:
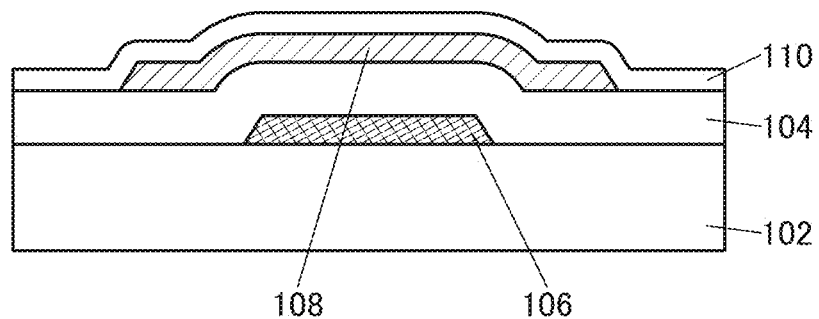

FIG. 4C is a cross-sectional view illustrating a state after the conductive film 130 is etched.

An opening that reaches the conductive layer 106 may be formed by etching a part of the insulating layer 110 after the conductive film 130 is etched. Accordingly, the conductive layer 112 that is formed later can be electrically connected to the conductive layer 106 through the opening.

The highest temperature in etching of the conductive film 130 is lower than or equal to 350° C., preferably lower than or equal to 340° C., further preferably lower than or equal to 330° C., still further preferably lower than or equal to 300° C.

[Formation of Metal Oxide Film 112a (Second Oxygen Supply Treatment)]

Figure 4D:
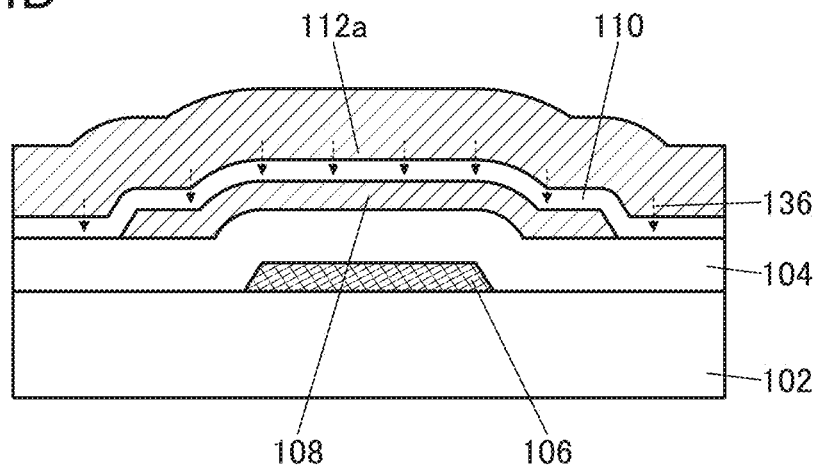

Then, a metal oxide film 112a is formed over the insulating layer 110 (FIG. 4D). The metal oxide film 112a is a film to be the conductive layer 112 serving as a gate electrode.

The metal oxide film 112a is formed by a sputtering method in an atmosphere containing oxygen. In the case where the metal oxide film 112a is formed in this manner, oxygen 136 can be supplied to the insulating layer 110 when the metal oxide film 112a is formed. A reactive sputtering method can be used in which deposition is performed in an oxygen atmosphere using a metal target or an alloy target as a sputtering target. In particular, when a sputtering method is used in which deposition is performed using an oxide target in an atmosphere containing oxygen, oxygen in a deposition gas is not used for reaction, so that the amount of oxygen that can be supplied to the insulating layer 110 can be increased.

At the time of forming the metal oxide film 112a, the higher the proportion of an oxygen flow rate (the oxygen flow rate ratio) to the total flow rate of a deposition gas introduced into a deposition chamber of a deposition apparatus is, or the higher the oxygen partial pressure in a deposition chamber is, the larger the amount of oxygen that is supplied to the insulating layer 110 can be. The oxygen flow rate ratio or the oxygen partial pressure is, for example, higher than or equal to 50% and lower than or equal to 100%, preferably higher than or equal to 65% and lower than or equal to 100%, further preferably higher than or equal to 80% and lower than or equal to 100%, still further preferably higher than or equal to 90% and lower than or equal to 100%. It is particularly preferable that the oxygen flow rate ratio or the oxygen partial pressure be 100%.

The metal oxide film 112a is preferably formed using an oxide target that is the same as the oxide target used to form the semiconductor layer 108, in which case the same deposition apparatus can be used. When a film having a semiconductor property is used as the metal oxide film 112a, the resistance of the film can be reduced in a later step as described later.

Note that the metal oxide film 112a can be formed using a material different from that used to form the semiconductor layer 108. In this case, a conductive material whose resistance is lower than that of the semiconductor layer 108 is preferably used.

The highest temperature in formation of the metal oxide film 112a is lower than or equal to 350° C., preferably lower than or equal to 340° C., further preferably lower than or equal to 330° C., still further preferably lower than or equal to 300° C.

Note that an oxide film having a high insulating property may be used instead of the above-described metal oxide film 112a. For example, an insulating oxide film such as a silicon oxide film or an aluminum oxide film can be used. Oxygen can be supplied to the insulating layer 110 also by forming such an insulating oxide film by a sputtering method in an oxygen atmosphere. The oxide film can serve as a part of the gate insulating layer. In the case of using an insulating oxide film, a conductive film to be a gate electrode is further formed. At this time, the conductive film may be either a metal film or an alloy film; when a metal oxide film is used, oxygen can be supplied to the insulating oxide film serving as the part of the gate insulating layer.

[Etching of Metal Oxide Film 112a and Insulating Layer 110]

Figure 5A:
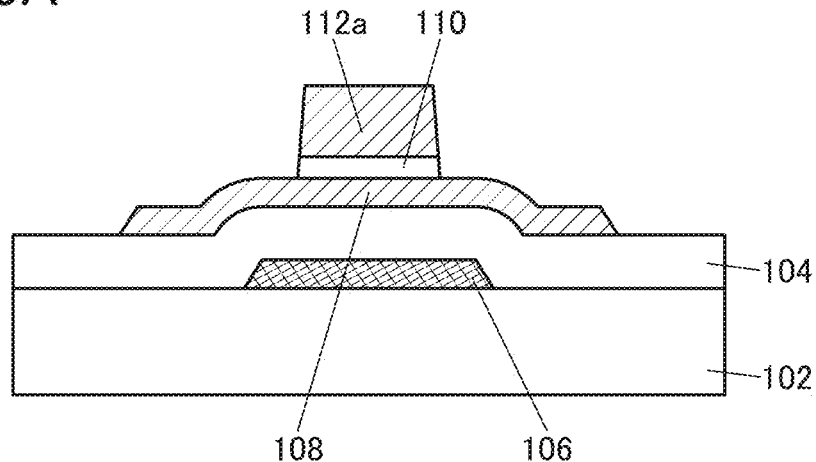
FIGS. 5A to 5C show an example of a method for manufacturing a transistor.
Figure 5B:
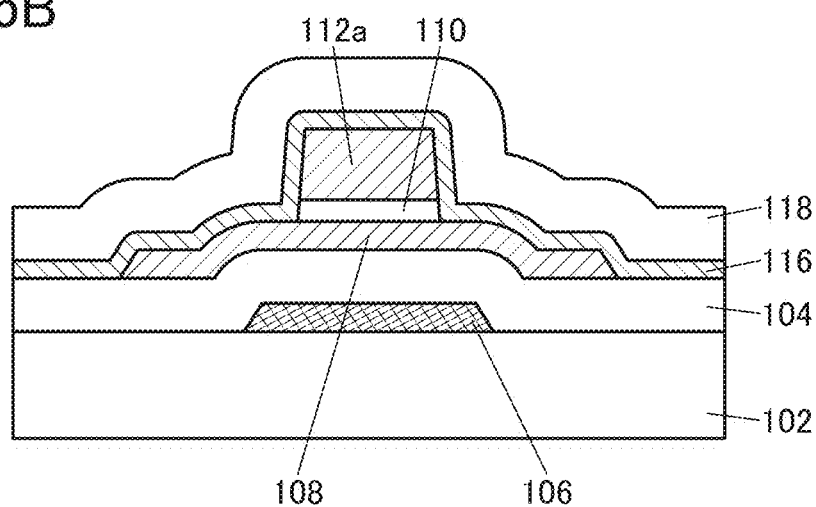

Then, the metal oxide film 112a and the insulating layer 110 are partly etched to expose parts of the semiconductor layer 108 (FIG. 5A).

At this time, the metal oxide film 112a and the insulating layer 110 are preferably processed using the same photomask. Alternatively, the metal oxide film 112a that remains after etching may be used as a hard mask for etching the insulating layer 110.

The highest temperature in the etching step is lower than or equal to 350° C., preferably lower than or equal to 340° C., further preferably lower than or equal to 330° C., still further preferably lower than or equal to 300° C.

[Formation of Insulating Layer 116 and Insulating Layer 118]

Figure 5C:
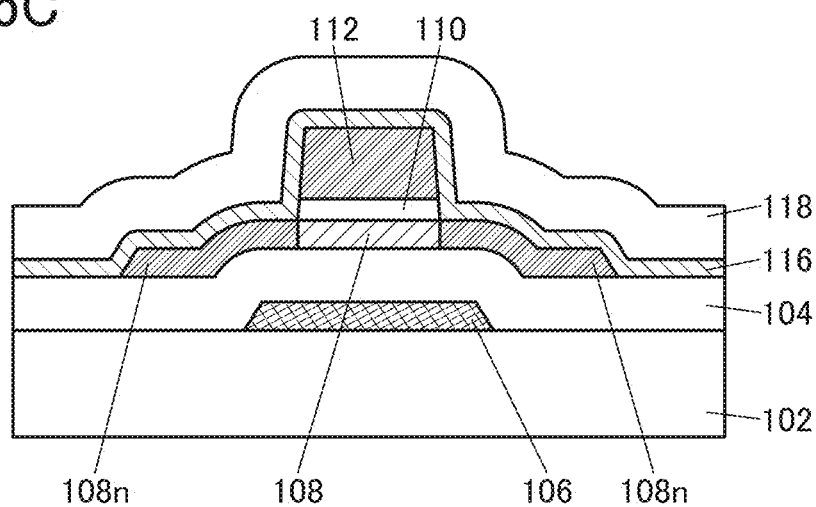

The insulating layer 116 is formed to cover the semiconductor layer 108, the metal oxide film 112a, the insulating layer 104, and the like (FIG. 5B), and then, the insulating layer 118 is formed (FIG. 5C).

It is preferable to perform treatment for forming oxygen vacancy in the exposed parts of the semiconductor layer 108 and the metal oxide film 112a before the insulating layer 116 is formed. For example, plasma treatment or heat treatment can be performed in an atmosphere that does not contain oxygen.

For example, in a PECVD apparatus, plasma treatment is performed in an atmosphere containing a rare gas such as argon, a nitrogen gas, a hydrogen gas, or the like, and then, the insulating layer 116 is formed by introducing a deposition gas for forming the insulating layer 116. It is preferable to form the insulating layer 116 and the insulating layer 118 in succession without exposure to the atmospheric air. The plasma treatment, the formation of the insulating layer 116, and the formation of the insulating layer 118 may be performed in different deposition chambers, or two or more of them may be performed in the same deposition chamber.

A film including at least one of nitrogen and hydrogen is preferably used as the insulating layer 116. For example, it is preferable to use an insulating film of a silicon nitride, a silicon nitride oxide, or a silicon oxynitride that includes hydrogen. When the insulating layer 116 includes such a film and is in contact with the part of the semiconductor layer 108 and the metal oxide film 112a, nitrogen or hydrogen is supplied to the semiconductor layer 108 and the metal oxide film 112a, whereby the conductivity can be increased.

The highest temperature in the plasma treatment and the formation of the insulating layer 116 and the insulating layer 118 is lower than or equal to 350° C., preferably lower than or equal to 340° C., further preferably lower than or equal to 330° C., still further preferably lower than or equal to 300° C.

[Heat Treatment]

Heat treatment is performed after the insulating layer 116 and the insulating layer 118 are formed (FIG. 5C). Through the heat treatment, oxygen can be supplied from the insulating layer 110 to the semiconductor layer 108; thus, oxygen vacancy in the semiconductor layer 108 can be reduced. The insulating layer 110 includes a large amount of excess oxygen, and therefore, a sufficient amount of oxygen can be supplied to the semiconductor layer 108 even by heat treatment at comparatively low temperatures.

Furthermore, by the heat treatment, oxygen vacancy and hydrogen in the part of the semiconductor layer 108 and the metal oxide film 112a are bonded to each other, so that the resistance is reduced. Thus, the region 108n and the conductive layer 112 are formed. Note that the metal oxide film 112a and the part of the semiconductor layer 108 may have reduced resistance at the time when the formation of the insulating layer 116 is finished.

The highest temperature in the heat treatment is lower than or equal to 350° C., preferably lower than or equal to 340° C., further preferably lower than or equal to 330° C., still further preferably lower than or equal to 300° C.

[Formation of Openings 141a and 141b]

Figure 6A:
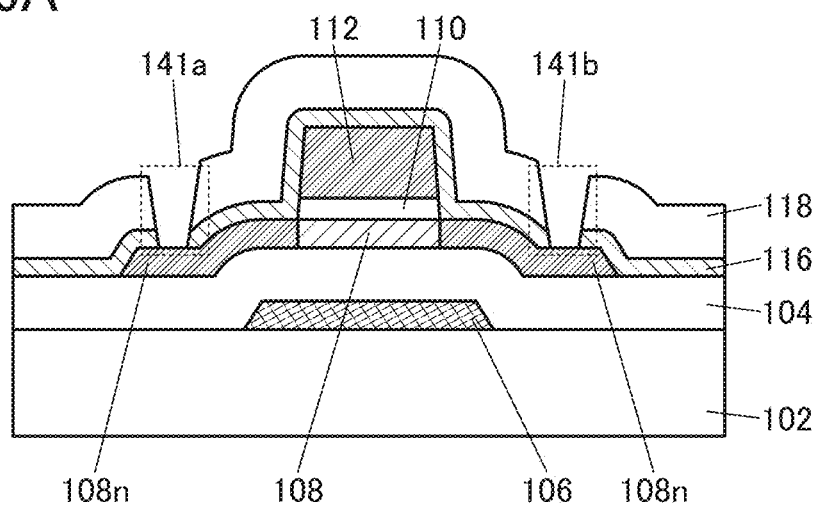
FIGS. 6A and 6B show an example of a method for manufacturing a transistor.

Then, a mask is formed over desired positions of the insulating layer 118 by lithography, and the insulating layer 118 and the insulating layer 116 are partly etched. Thus, the openings 141a and 141b reaching the regions 108n are formed (FIG. 6A).

[Formation of Conductive Layers 120a and 120b]

Figure 6B:
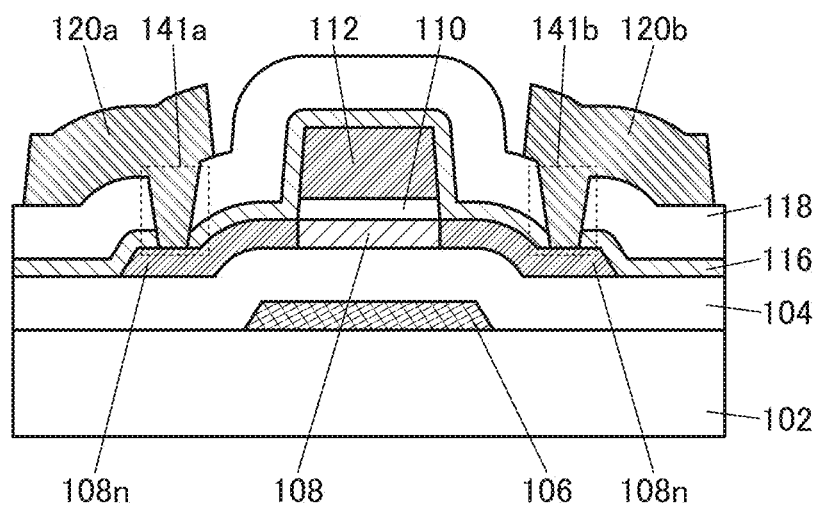

Then, a conductive film is formed over the insulating layer 118 so as to fill the openings 141a and 141b, and the conductive film is processed into desired shapes, so that the conductive layer 120a and the conductive layer 120b are formed (FIG. 6B).

Through the above steps, the transistor 100 can be manufactured. Note that the cross-sectional view shown in FIG. 6B is the same as that shown in FIG. 2B.

By this manufacturing method example, an extremely large amount of oxygen can be supplied to the oxide insulating film in contact with the semiconductor layer. Hence, even when the highest temperature in the manufacturing process is reduced, oxygen vacancy in the semiconductor can be sufficiently reduced, so that a transistor with excellent electrical characteristics can be obtained. For example, the highest temperature in the manufacturing process of the transistor can be lower than or equal to 350° C., lower than or equal to 340° C., lower than or equal to 330° C., or lower than or equal to 300° C., so that the productivity can be increased.

The above is the description of manufacturing method example.

Structure Example 3

In one embodiment of the present invention, a transistor can be formed at low temperatures, and therefore, the transistor can be manufactured over a substrate with comparatively low heat resistance. As an example thereof, a transistor provided over an organic resin substrate that is thin enough to have flexibility is described below.

Figure 7A:
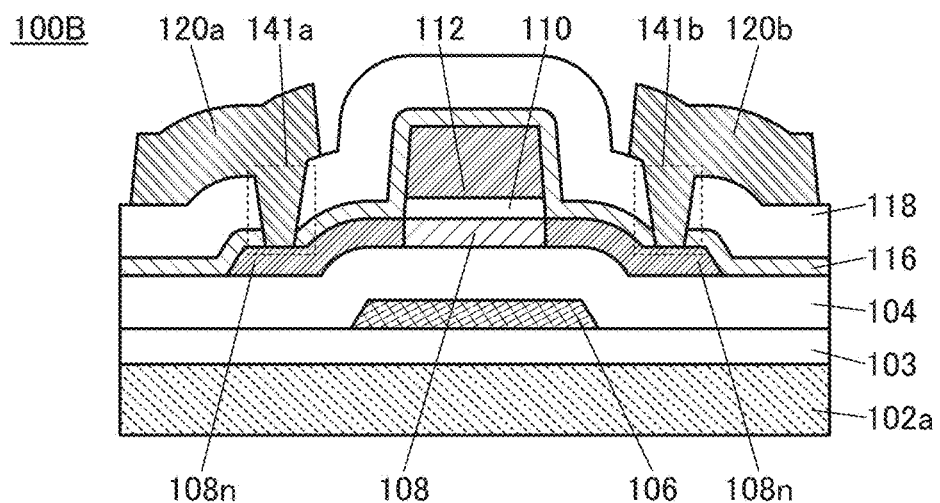
FIGS. 7A to 7C show a structure example of a transistor.
Figure 7B:
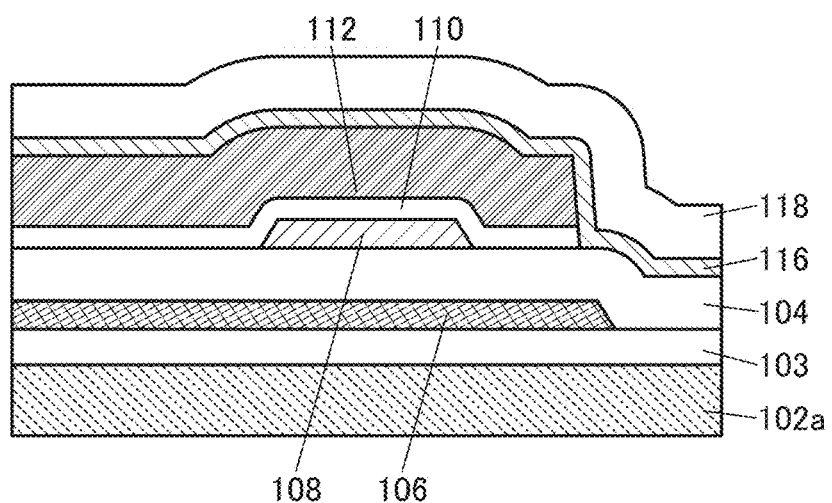

FIGS. 7A and 7B are cross-sectional views of a transistor 100B described below. Note that FIG. 2A can be referred to for the top view. The transistor 100B is different from the transistor 100 of Structure example 2 mainly in that the transistor 100B is provided over a substrate 102a instead of the substrate 102 and includes an insulating layer 103.

As the substrate 102a, a substrate of an organic resin or the like that is thin enough to have flexibility (e.g., with a thickness is 100 nm or more and 100 μm or less) can be used.

Typically, a polyimide resin can be used for the organic resin. The polyimide resin is preferable because of its high heat resistance. An acrylic resin, an epoxy resin, a polyamide resin, a polyimide-amide resin, a siloxane resin, a benzocyclobutene-based resin, a phenol resin, or the like can also be used.

For example, to form the organic resin, a mixed material of a resin precursor and a solvent or a mixed material of a soluble resin material and a solvent is formed over a support substrate by a method such as spin coating, dipping, spray coating, inkjet printing, dispensing, screen printing, or offset printing, or with a doctor knife, a slit coater, a roll coater, a curtain coater, or a knife coater. After that, heat treatment is performed to remove the solvent and the like and cure the material, so that the substrate 102a including the organic resin can be formed.

For example, a resin precursor that can generate an imide bond by dehydration can be used to prepare polyimide. Alternatively, a material containing a soluble polyimide resin may be used.

An inorganic insulating film can be used for the insulating layer 103. The insulating layer 103 preferably serves as a barrier film that prevents diffusion of impurities contained in the substrate 102a into the transistor 100B.

Examples of a material of an inorganic insulating film having a high barrier property include a silicon nitride, a silicon nitride oxide, an aluminum oxide, an aluminum nitride, and an aluminum oxynitride.

In the case where the insulating layer 103 includes stacked films, an inorganic insulating film with a high barrier property is preferably included in at least one of the films. For example, the insulating layer 103 has a two-layer structure in which a silicon nitride film is formed over a silicon oxynitride film over the substrate 102a, or a three-layer structure of a silicon oxynitride film, a silicon nitride film, and a silicon oxynitride film.

An example of a manufacturing method of the transistor 100B is described. First, a resin layer to be the substrate 102a and the insulating layer 103 are stacked over a support substrate such as a glass substrate. Then, a transistor is formed over the insulating layer 103 by a method similar to that in the above-described manufacturing method example. Then, the support substrate and the substrate 102a are separated from each other; accordingly, the transistor 100B can be manufactured over the substrate 102a having flexibility.

The support substrate and the substrate 102a can be separated from each other by a variety of methods. For example, a method may be used in which laser light is emitted from the support substrate side to reduce the adhesiveness between the support substrate and the substrate 102a. When this method is employed, a light absorption layer may be provided between the support substrate and the substrate 102a. A material that can absorb part of light used as the laser light can be used for the light absorption layer. For example, a metal, a semiconductor, an oxide, or the like can be included in the light absorption layer when excimer laser light with a wavelength of 308 nm is used as the laser light. For example, a semiconductor film of silicon or the like, a metal film of titanium, tungsten, or the like, an oxide film of an titanium oxide, a tungsten oxide, an indium oxide, an indium tin oxide, or the like can be used.

Figure 7C:
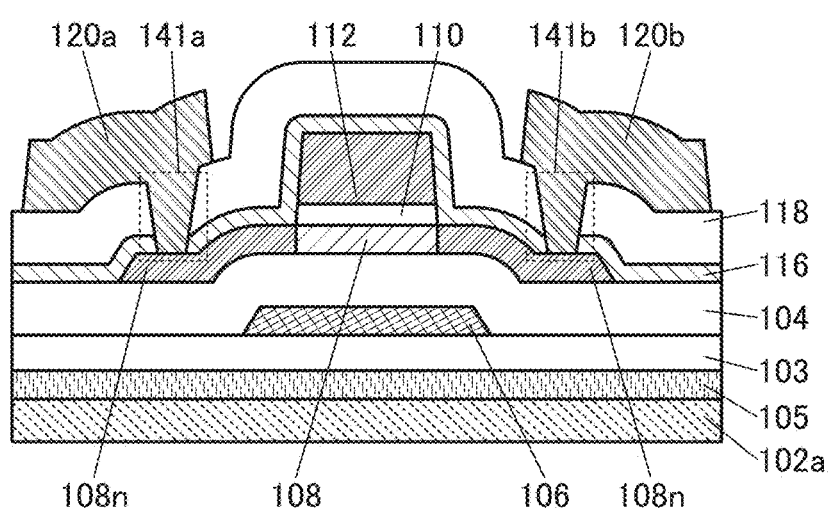

Alternatively, the structure may be obtained as follows: the insulating layer 103 is formed over the support substrate and the transistor is formed; next, separation is performed between the support substrate and the insulating layer 103; and then the insulating layer 103 is attached to the substrate 102a with an adhesive layer 105. The cross-sectional view of this case is shown in FIG. 7C. Here, a separation layer is preferably formed between the insulating layer 103 and the support substrate. For example, as the separation layer, it is possible to use a stack of a layer containing a high-melting-point metal material such as tungsten and a layer containing an oxide of the metal material. As the insulating layer 103 over the separation layer, it is possible to use an insulating layer containing an inorganic insulating material such as a silicon nitride, a silicon oxide, a silicon oxynitride, or a silicon nitride oxide. In that case, separation can be caused at the interface between tungsten and tungsten oxide, in tungsten oxide, or at the interface between tungsten oxide and the insulating layer.

Structure Example 4

Figure 8A:
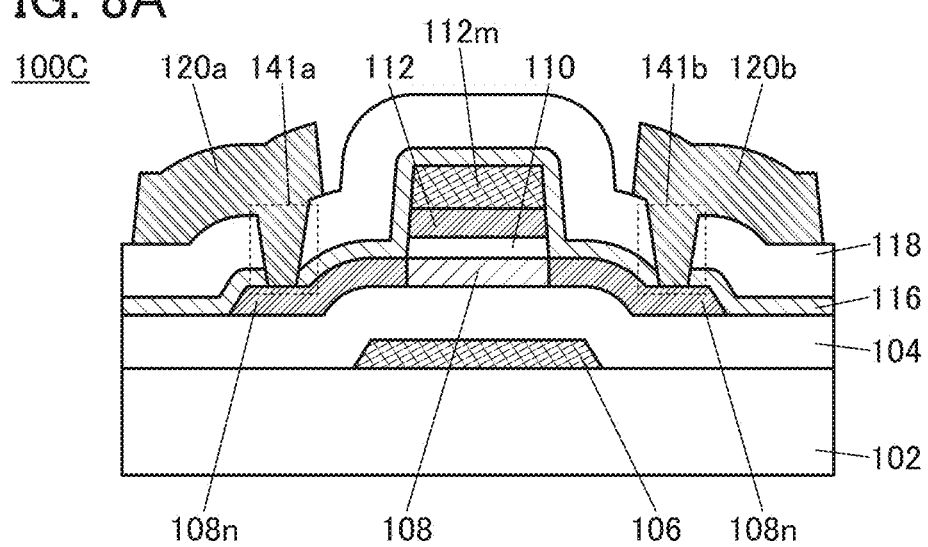
FIGS. 8A and 8B show a structure example of a transistor.
Figure 8B:
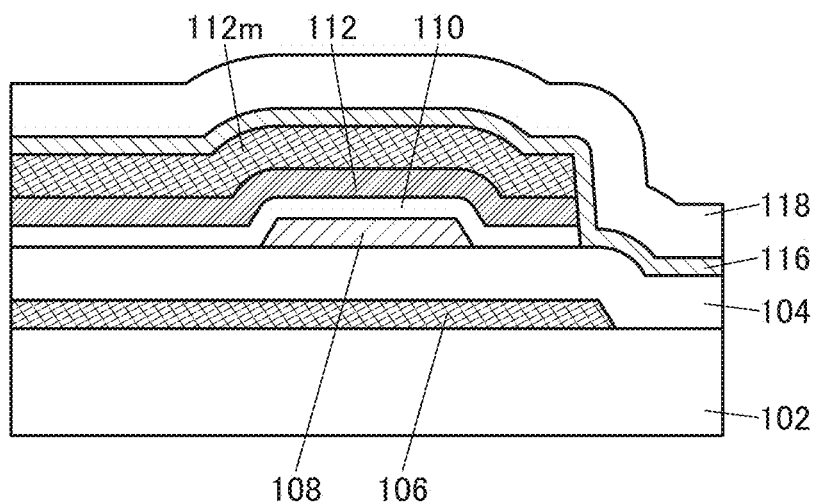

FIGS. 8A and 8B are cross-sectional views of a transistor 100C described below. Note that FIG. 2A can be referred to for the top view. The transistor 100C is different from the transistor 100 of Structure example 2 mainly in that the transistor 100C includes a conductive layer 112m over the conductive layer 112.

The conductive layer 112m includes a conductive material whose resistance is lower than at least the resistance of the conductive layer 112. As the conductive layer 112m, a conductive film similar to the conductive layer 106, the conductive layer 120a, or the like can be used. It is particularly preferable to use a conductive material including a metal or an alloy for the conductive layer 112m.

The conductive layer 112m is in contact with the conductive layer 112 and serves as a part of a gate electrode. The stacked-layer structure of the conductive layer 112 and the conductive layer 112m is preferable in terms of reducing the wiring resistance.

Structure Example 5

Figure 9A:
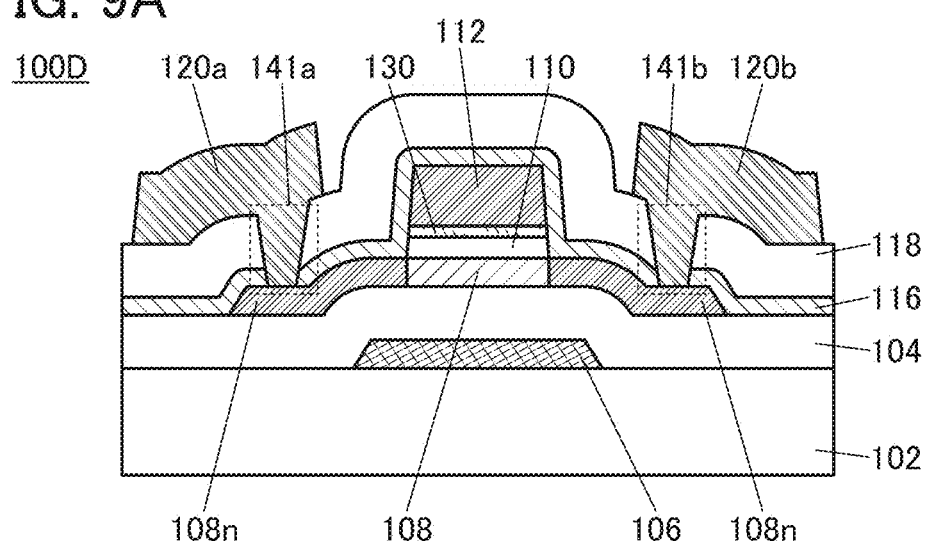
FIGS. 9A and 9B show a structure example of a transistor.
Figure 9B:
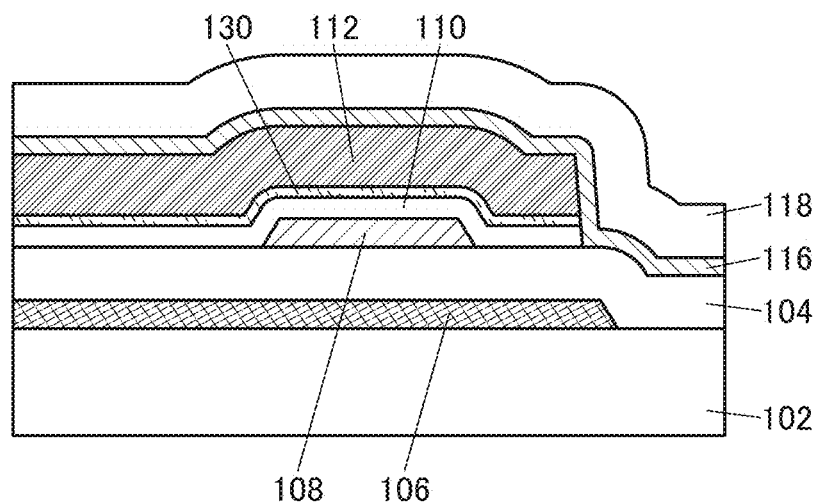

FIGS. 9A and 9B are cross-sectional views of a transistor 100D described below. Note that FIG. 2A can be referred to for the top view. The transistor 100D is different from the transistor 100 of Structure example 2 mainly in that the transistor 100D includes the conductive film 130 between the conductive layer 112 and the insulating layer 110.

The transistor 100D corresponds to a case in which the conductive film 130 is left in the above-described manufacturing method example. As the conductive film 130, an oxide conductor is preferably used. In that case, the step of removing the conductive film 130 in the above-described manufacturing method example can be omitted, whereby the manufacturing cost can be reduced.

Structure Example 6

Figure 10A:
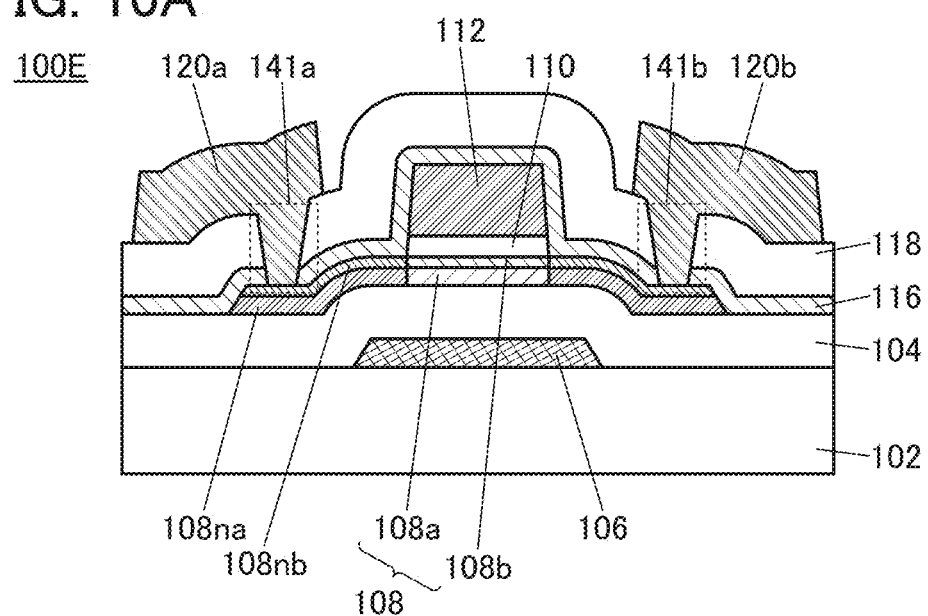
FIGS. 10A and 10B show a structure example of a transistor.
Figure 10B:
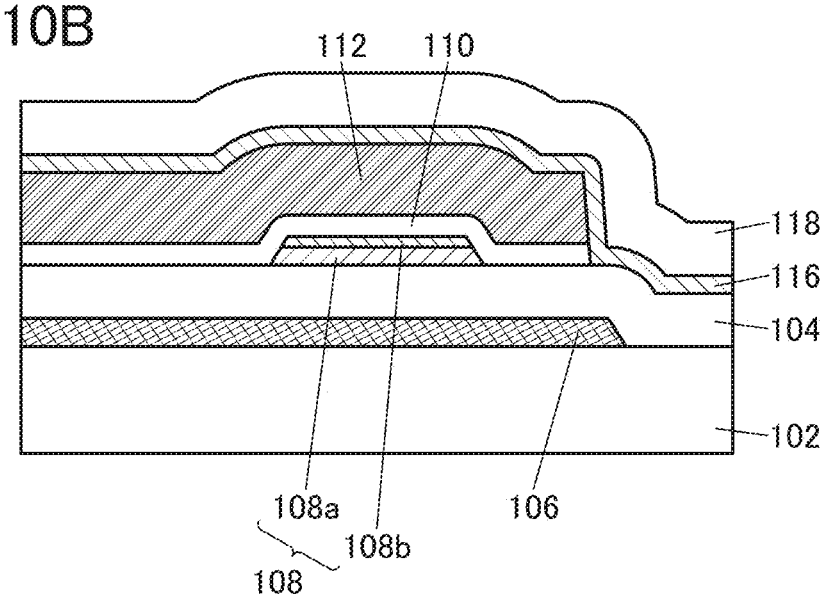

FIGS. 10A and 10B are cross-sectional views of a transistor 100E described below. Note that FIG. 2A can be referred to for the top view. The transistor 100E is different from the transistor 100 of Structure example 2 mainly in that the semiconductor layer 108 of the transistor 100E has a stacked-layer structure.

The semiconductor layer 108 has a stacked-layer structure in which a semiconductor layer 108a and a semiconductor layer 108b are stacked in this order from the insulating layer 104.

The crystallinity of the semiconductor layer 108b is preferably higher than that of the semiconductor layer 108a.

The semiconductor layer 108a and the semiconductor layer 108b are preferably formed in succession without exposure to the atmospheric air using the same oxide target under different deposition conditions.

For example, the oxygen flow rate ratio for formation of the semiconductor layer 108a is lower than the oxygen flow rate ratio for formation of the semiconductor layer 108b. Accordingly, oxygen can be effectively supplied to the semiconductor layer 108a when the semiconductor layer 108b is formed. Furthermore, the semiconductor layer 108a can have low crystallinity and high electrical conductivity compared with the semiconductor layer 108b. Meanwhile, the semiconductor layer 108b provided in the upper portion can have high crystallinity compared with the semiconductor layer 108a, thereby reducing damage that occurs at the time of processing the semiconductor layer 108 or forming the insulating layer 110. The semiconductor layer 108a can be an nc-OS film and the semiconductor layer 108b can be a CAAC-OS film, for example.

Specifically, the oxygen flow rate ratio for formation of the semiconductor layer 108a is higher than 0% and lower than 50%, preferably higher than 0% and lower than or equal to 30%, further preferably higher than 0% and lower than or equal to 20%, typically 10%. The oxygen flow rate ratio for formation of the semiconductor layer 108b is higher than or equal to 50% and lower than or equal to 100%, preferably higher than or equal to 60% and lower than or equal to 100%, further preferably higher than or equal to 80% and lower than or equal to 100%, still further preferably higher than or equal to 90% and lower than or equal to 100%, typically 100%. Furthermore, although the film formation conditions such as pressure, temperature, or power may vary between the semiconductor layer 108a and the semiconductor layer 108b, it is preferable to employ the same condition other than the oxygen flow rate ratio because the time taken for film formation can be shortened.

When the semiconductor layer 108 has such a stacked-layer structure, a transistor with excellent electrical characteristics and high reliability can be obtained.

Note that the compositions of the semiconductor layer 108a and the semiconductor layer 108b may be different from each other. In the case where an In—Ga—Zn oxide is used in each of the semiconductor layer 108a and the semiconductor layer 108b, the semiconductor layer 108a is preferably formed using an oxide target whose In proportion is higher than that of an oxide target used to form the semiconductor layer 108b.

As shown in FIG. 10A, low-resistance regions 108na are provided in regions of the semiconductor layer 108a that do not overlap with the conductive layer 112, and low-resistance regions 108nb are provided in regions of the semiconductor layer 108b that do not overlap with the conductive layer 112.

Structure Example 7

Figure 11A:
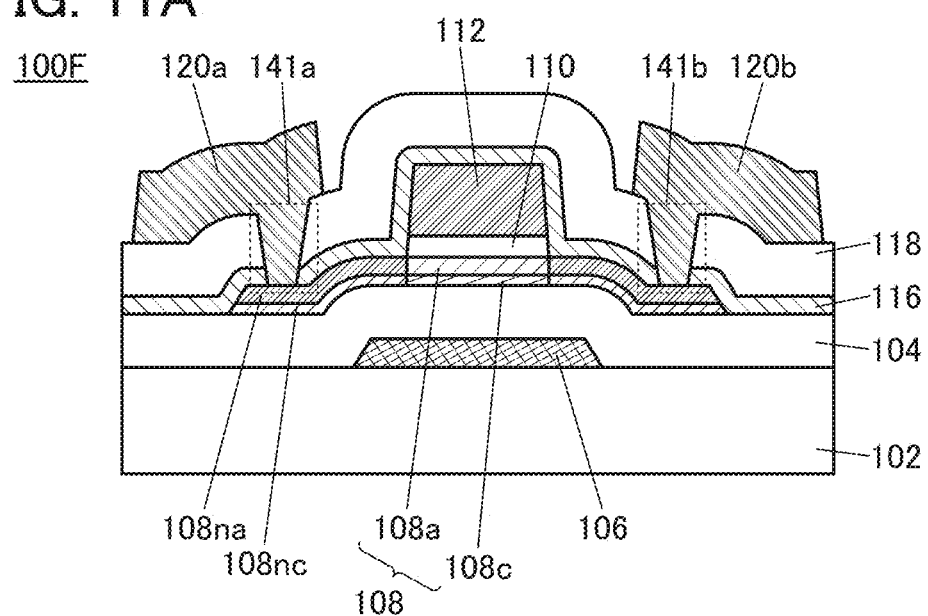
FIGS. 11A and 11B show a structure example of a transistor.
Figure 11B:
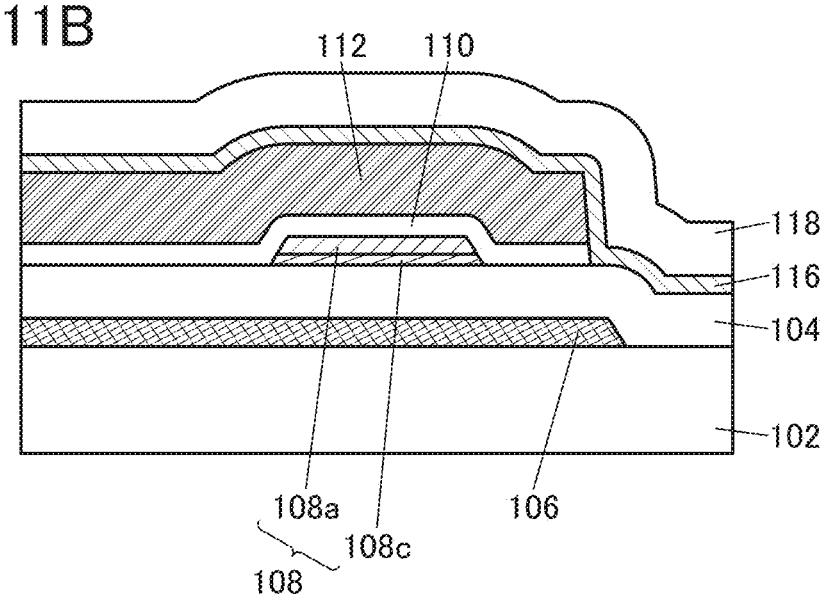

FIGS. 11A and 11B are cross-sectional views of a transistor 100F described below. Note that FIG. 2A can be referred to for the top view. The transistor 100F is different from the transistor 100 of Structure example 2 mainly in that the semiconductor layer 108 of the transistor 100F has a stacked-layer structure.

The semiconductor layer 108 has a stacked-layer structure in which a semiconductor layer 108c and the semiconductor layer 108a are stacked in this order from the insulating layer 104.

The crystallinity of the semiconductor layer 108c is preferably higher than that of the semiconductor layer 108a. Preferably, hydrogen and oxygen are less likely to diffuse in the semiconductor layer 108c than in the semiconductor layer 108a.

In the case where an In—Ga—Zn oxide is used in each of the semiconductor layer 108a and the semiconductor layer 108c, the semiconductor layer 108c is preferably formed using a material whose In proportion is lower than that in a material of the semiconductor layer 108a. Furthermore, the semiconductor layer 108c is preferably formed using a material whose Zn proportion is lower than that in a material of the semiconductor layer 108a. Thus, the semiconductor layer 108c can have a high barrier property with respect to hydrogen and oxygen. In particular, by increasing the Zn proportion, the crystallinity of the semiconductor layer 108c can be increased easily, whereby the barrier property can be improved.

For example, the semiconductor layer 108c is preferably formed using a sputtering target with an atomic ratio of In:M:Zn=1:3:4 or the neighborhood thereof, or an atomic ratio of In:M:Zn=1:3:2 or the neighborhood thereof.

The semiconductor layer 108c having a high barrier property is provided between the semiconductor layer 108a and the insulating layer 104, whereby oxygen and hydrogen can be prevented from diffusing from the insulating layer 104 into the semiconductor layer 108a. Hence, hydrogen in the channel formation region of the semiconductor layer 108a can be reduced, so that a highly reliable transistor can be obtained. Moreover, an increase in the resistance of the low-resistance regions 108na in the semiconductor layer 108a due to the supply of oxygen thereto can be prevented, so that the resistance between a source and a drain can be low.

Note that as shown in FIGS. 11A and 11B, low-resistance regions 108nc may be formed in portions of the semiconductor layer 108c that do not overlap with the conductive layer 112.

Structure Example 8

Figure 12A:
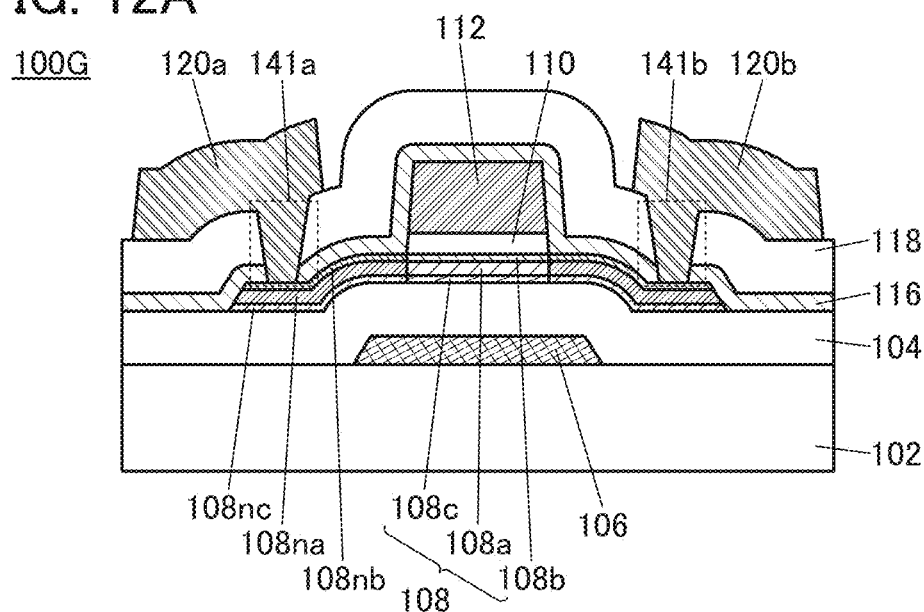
FIGS. 12A to 12D show a structure example of a transistor.
Figure 12B:
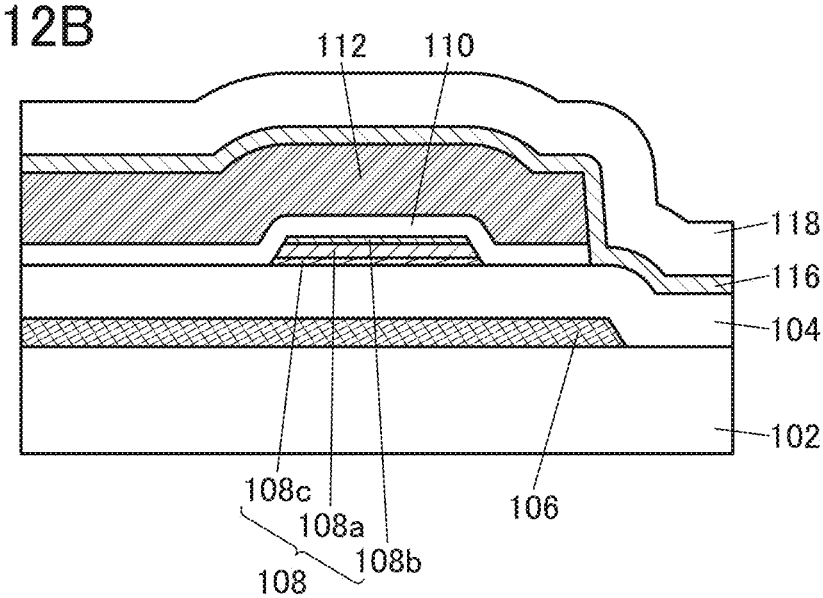

FIGS. 12A and 12B are cross-sectional views of a transistor 100G described below. Note that FIG. 2A can be referred to for the top view. The transistor 100G is different from the transistor 100 of Structure example 2 mainly in that the semiconductor layer 108 of the transistor 100G has a stacked-layer structure.

The semiconductor layer 108 has a stacked-layer structure in which the semiconductor layer 108c, the semiconductor layer 108a, and the semiconductor layer 108b are stacked in this order from the insulating layer 104.

The semiconductor layer 108a and the semiconductor layer 108b can be films similar to those described in Structure example 6. As the semiconductor layer 108c, a film similar to that described in Structure example 7 can be used.

An effective manufacturing method of a structure where the semiconductor layer 108a is positioned between the semiconductor layer 108b and the semiconductor layer 108c, and an effect expected by the structure are described.

First, a semiconductor film 128c to be the semiconductor layer 108c is formed over the insulating layer 104. At this time, the semiconductor film 128c preferably includes a large amount of oxygen vacancy. To form the oxygen vacancy, for example, the film is formed with a low oxygen flow rate ratio (e.g., 30% or lower, or 10% or lower), or heat treatment or plasma treatment is performed in an atmosphere that does not contain oxygen after the semiconductor film 128c is formed.

Figure 12C:
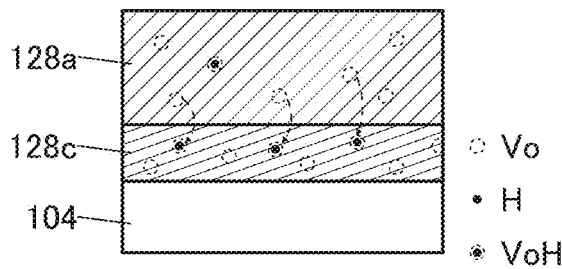

Then, a semiconductor film 128a to be the semiconductor layer 108a is formed (FIG. 12C). At this time, in the case where oxygen vacancy ($V_o$) and hydrogen (H) are included in the semiconductor film 128a, hydrogen may exist in a state where the hydrogen is bonded to the oxygen vacancy (the state is also referred to as $V_oH$). Here, hydrogen in the semiconductor film 128a can be gettered using the semiconductor film 128c that includes a large amount of oxygen vacancy, so that hydrogen in the semiconductor film 128a can be released.

Note that after the semiconductor film 128a is formed, heat treatment may be performed to promote gettering of hydrogen. Although oxygen vacancy might be formed by the heat treatment in the semiconductor film 128a, the oxygen vacancy formed here can be filled by oxygen later supplied when a semiconductor film 128b is formed or when oxygen supply treatment is performed.

Figure 12D:
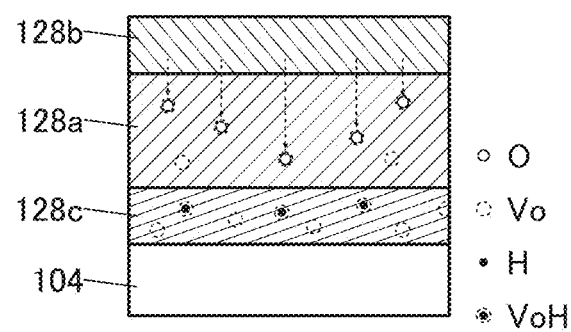

Then, the semiconductor film 128b to be the semiconductor layer 108b is formed under the conditions with a high oxygen flow rate ratio, whereby oxygen (O) can be supplied to the semiconductor film 128a (FIG. 12D). Since the hydrogen concentration in the semiconductor film 128a is reduced, most of the oxygen vacancies in the film exist in isolation without being bonded to hydrogen. Accordingly, the oxygen vacancies can be filled more effectively. As a result, the semiconductor layer 108a with reduced carrier concentration can be obtained.

That is, the semiconductor layer 108c has a function of blocking hydrogen diffused from the insulating layer 104 side and a function of gettering hydrogen bonded to oxygen vacancies in the semiconductor layer 108a. Moreover, the semiconductor layer 108b formed over the semiconductor layer 108a enables effective oxygen supply to the semiconductor layer 108a. Accordingly, oxygen vacancies in the semiconductor layer 108a can be reduced effectively, whereby a highly reliable transistor can be obtained.

The above is the description of each structure example.

At least part of any of the structural examples, the manufacturing method examples, the drawings corresponding thereto, and the like described in this embodiment can be implemented in combination with any of the other structural examples, the other manufacturing method examples, the other drawings corresponding thereto, and the like as appropriate.

At least part of this embodiment can be implemented in combination with any of the other embodiments described in this specification as appropriate.

Embodiment 2

In this embodiment, examples of a display device that includes the semiconductor device described in the above embodiments are described below with reference to FIG. 14 to FIG. 19.

Figure 14:
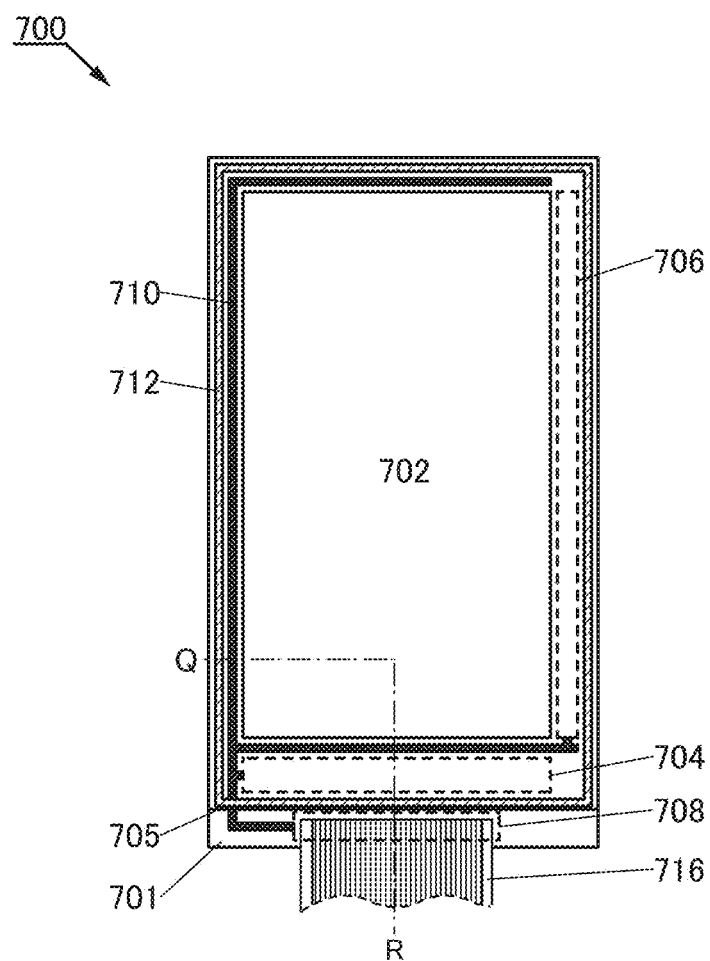
FIG. 14 is a top view of a display device.

FIG. 14 is a top view illustrating an example of a display device. A display device 700 in FIG. 14 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Although not illustrated in FIG. 14, a display element is provided between the first substrate 701 and the second substrate 705.

In the display device 700, a flexible printed circuit (FPC) terminal portion 708 that is electrically connected to the pixel portion 702, the source driver circuit portion 704, and the gate driver circuit portion 706 is provided in a region different from the region that is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. The structure of the display device 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single crystal semiconductor film or a polycrystalline semiconductor film) may be formed on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display device 700 include a plurality of transistors.

The display device 700 can include a variety of elements. As examples of the elements, an electroluminescent (EL) element (e.g., an EL element containing organic and inorganic materials, an organic EL element, an inorganic EL element, or an LED), a light-emitting transistor element (a transistor that emits light depending on current), an electron emitter, a liquid crystal element, an electronic ink element, an electrophoretic element, an electrowetting element, a plasma display panel (PDP), micro electro mechanical systems (MEMS) display (e.g., a grating light valve (GLV), a digital micromirror device (DMD), a digital micro shutter (DMS) element, or an interferometric modulator display (IMOD) element), a piezoelectric ceramic display, and the like can be given.

An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an electronic ink element or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display device 700, a progressive system, an interlace system, or the like can be employed. Furthermore, color elements controlled in pixels at the time of color display are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ depending on the color elements. Alternatively, one or more colors of yellow, cyan, magenta, and the like may be added to RGB. Note that the size of a display region may differ between dots of color elements. One embodiment of the disclosed invention is not limited to a color display device; the disclosed invention can also be applied to a monochrome display device.

A coloring layer (also referred to as a color filter) may be used to obtain a color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be suppressed, and power consumption can be reduced by approximately 20% to 30% in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

Figure 15:
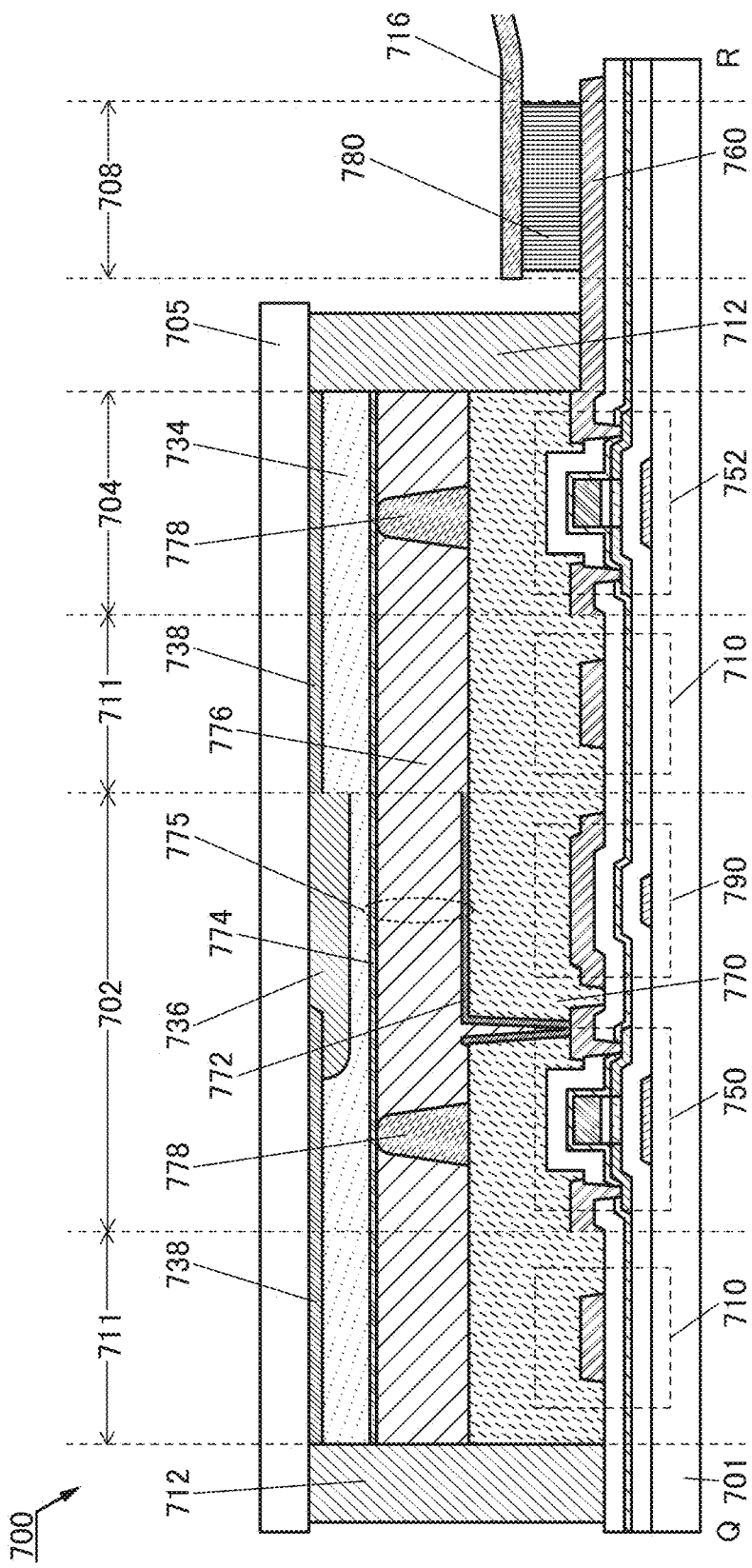
FIG. 15 is a cross-sectional view of a display device.
Figure 16:
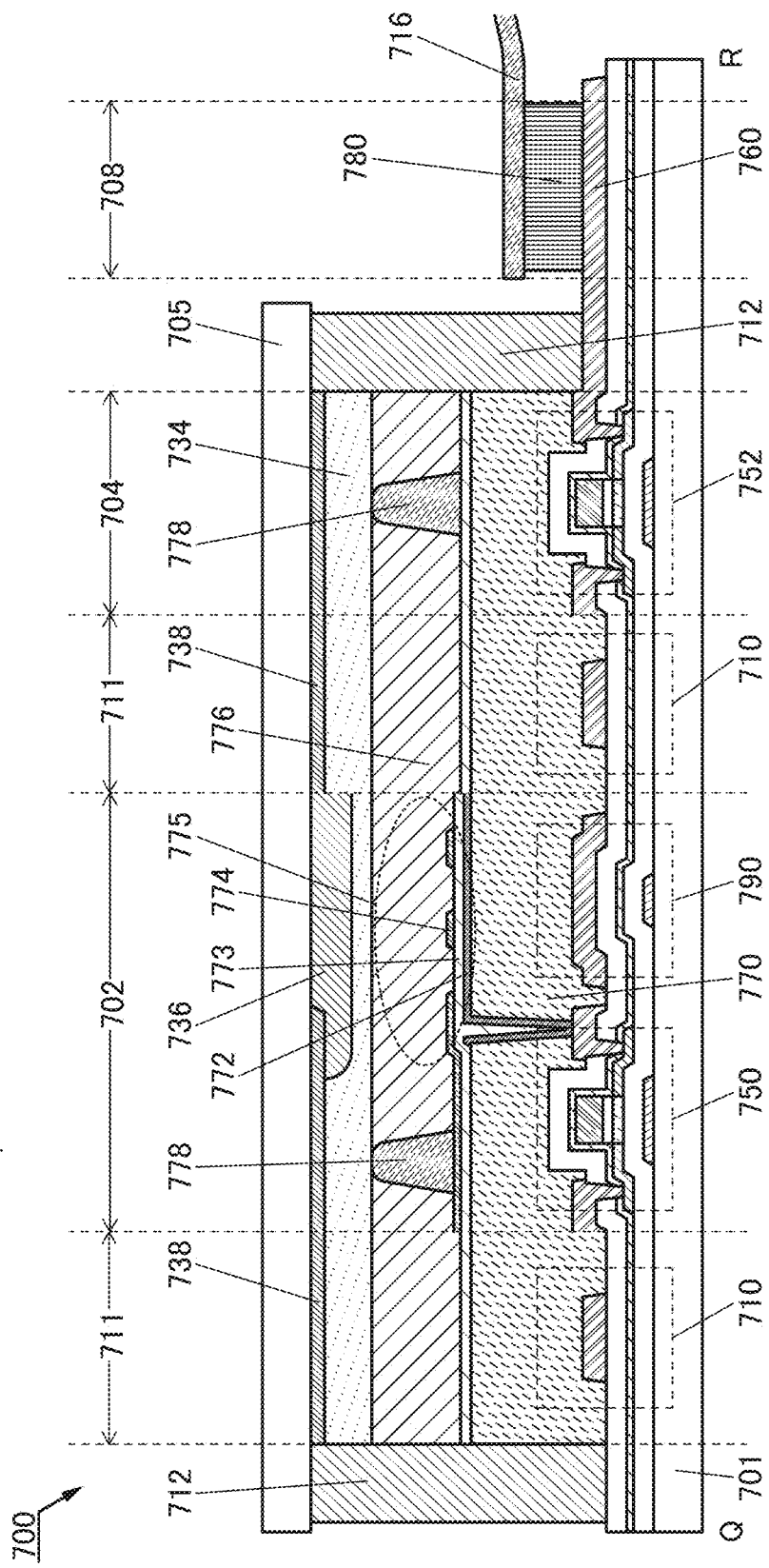
FIG. 16 is a cross-sectional view of a display device.
Figure 17:
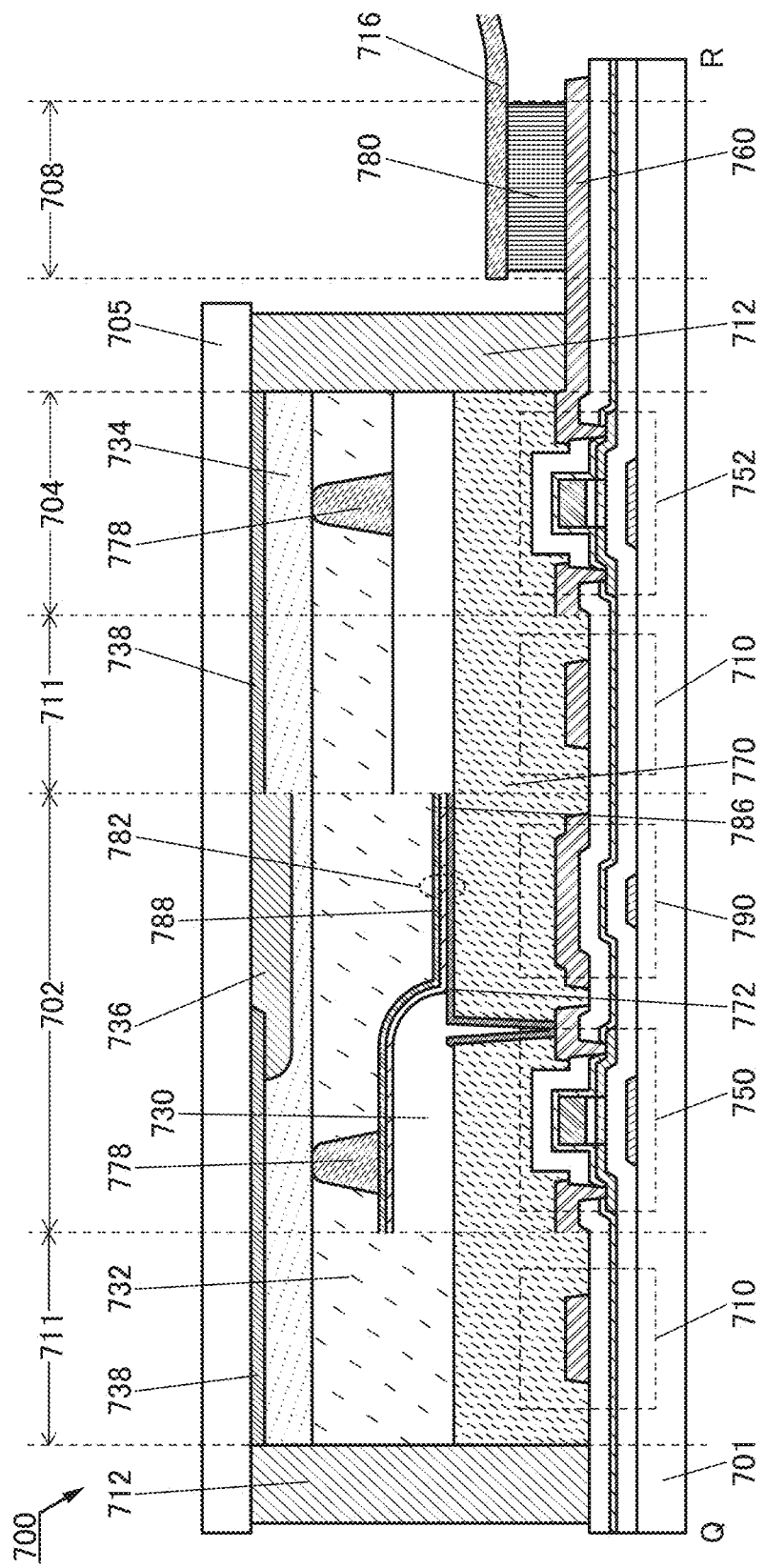
FIG. 17 is a cross-sectional view of a display device.

In this embodiment, a structure including a liquid crystal element as a display element and a structure including an EL element as a display element are described with reference to FIG. 15 to FIG. 17. FIG. 15 and FIG. 16 are cross-sectional views taken along the dashed-dotted line Q-R in FIG. 14 and illustrate the structure including a liquid crystal element as a display element. FIG. 17 is a cross-sectional view taken along the dashed-dotted line Q-R in FIG. 14 and illustrates the structure including an EL element as a display element.

Portions common to FIG. 15 to FIG. 17 are described first, and then, different portions are described.

<2-1. Portions Common to Display Devices>

Display devices 700 in FIG. 15 to FIG. 17 each include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 100 described above. Note that the transistor 750 and the transistor 752 may each have the structure of any of the other transistors described in the above embodiments.

The transistor used in this embodiment includes an oxide semiconductor film that is highly purified and in which formation of oxygen vacancies is inhibited. The transistor can have a low off-state current. Accordingly, an electrical signal such as an image signal can be held for a long time, and a long writing interval can be set in an on state. Accordingly, the frequency of refresh operation can be reduced, which suppresses power consumption.

In addition, the transistor used in this embodiment can have relatively high field-effect mobility and thus is capable of high-speed operation. For example, in a display device that includes such a transistor capable of high-speed operation, a switching transistor in a pixel portion and a driver transistor in a driver circuit portion can be formed over one substrate. That is, no additional semiconductor device formed using a silicon wafer or the like is needed as a driver circuit; therefore, the number of components of the semiconductor device can be reduced. In addition, by using the transistor capable of high-speed operation in the pixel portion, a high-quality image can be provided.

The capacitor 790 includes a lower electrode and an upper electrode. The lower electrode is formed through a step of processing a conductive film to be a conductive film functioning as a first gate electrode of the transistor 750. The upper electrode is formed through a step of processing a conductive film to be a conductive film functioning as a second gate electrode of the transistor 750. Between the lower electrode and the upper electrode, an insulating film formed through a step of forming an insulating film to be an insulating film functioning as a first gate insulating film of the transistor 750 and insulating films formed through a step of forming insulating films to be insulating films functioning as protective insulating films over the transistor 750 are provided. That is, the capacitor 790 has a stacked-layer structure in which an insulating film functioning as a dielectric film is positioned between the pair of electrodes.

In FIG. 15 to FIG. 17, a planarization insulating film 770 is provided over the transistor 750, the transistor 752, and the capacitor 790.

Although FIG. 15 to FIG. 17 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a top-gate transistor is used in the pixel portion 702 and a bottom-gate transistor is used in the source driver circuit portion 704, or a structure in which the bottom-gate transistor is used in the pixel portion 702 and the top-gate transistor is used in the source driver circuit portion 704 may be employed. Note that the term "source driver circuit portion 704" can be replaced by the term "gate driver circuit portion".

The signal line 710 is formed through the same process as the conductive films functioning as source electrodes and drain electrodes of the transistors 750 and 752. In the case where the signal line 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, glass substrates can be used as the first substrate 701 and the second substrate 705. As the first substrate 701 and the second substrate 705, flexible substrates may also be used. An example of the flexible substrate is a plastic substrate.

A structure 778 is provided between the first substrate 701 and the second substrate 705. The structure 778 is a columnar spacer and is provided to control the distance (cell gap) between the first substrate 701 and the second substrate 705. Alternatively, a spherical spacer may also be used as the structure 778.

A light-blocking film 738 functioning as a black matrix, a coloring film 736 functioning as a color filter, and an insulating film 734 in contact with the light-blocking film 738 and the coloring film 736 are provided on the second substrate 705 side.

<2-2. Structure Example of Display Device Using Liquid Crystal Element>

The display device 700 in FIG. 15 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 15 can display an image in such a manner that transmission or non-transmission of light is controlled by the alignment state in the liquid crystal layer 776 that is changed depending on the voltage applied between the conductive film 772 and the conductive film 774.

The conductive film 772 is electrically connected to the conductive film functioning as a source electrode or a drain electrode included in the transistor 750. The conductive film 772 is formed over the planarization insulating film 770 to function as a pixel electrode, i.e., one electrode of the display element.

A conductive film that transmits visible light or a conductive film that reflects visible light can be used for the conductive film 772. For example, a material including one kind selected from indium (In), zinc (Zn), and tin (Sn) is preferably used for the conductive film that transmits visible light. For example, a material including aluminum or silver may be used for the conductive film that reflects visible light.

In the case where a conductive film that reflects visible light is used as the conductive film 772, the display device 700 is a reflective liquid crystal display device. In the case where a conductive film that transmits visible light is used as the conductive film 772, the display device 700 is a transmissive liquid crystal display device. In the case of a reflective liquid crystal display device, a polarizing plate is provided in the viewer side. In the case of a transmissive liquid crystal display device, a pair of polarizing plates between which a liquid crystal element is sandwiched is provided.

When a structure over the conductive film 772 is changed, a driving method of a liquid crystal element can vary. An example in that case is shown in FIG. 16. The display device 700 illustrated in FIG. 16 is an example of employing a transverse electric field mode (e.g., an FFS mode) as a driving mode of the liquid crystal element. In the structure illustrated in FIG. 16, an insulating film 773 is provided over the conductive film 772, and the conductive film 774 is provided over the insulating film 773. In such a structure, the conductive film 774 functions as a common electrode, and an electric field generated between the conductive film 772 and the conductive film 774 through the insulating film 773 can control the alignment state in the liquid crystal layer 776.

Although not illustrated in FIG. 15 and FIG. 16, the conductive film 772 and/or the conductive film 774 may be provided with an alignment film on a side in contact with the liquid crystal layer 776. Although not illustrated in FIG. 15 and FIG. 16, an optical member (optical substrate) and the like such as a polarizing member, a retardation member, or an anti-reflection member may be provided as appropriate. For example, circular polarization may be employed by using a polarizing substrate and a retardation substrate. In addition, a backlight, a side light, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is a liquid crystal phase, which is generated just before transition from a cholesteric phase to an isotropic phase when the temperature of a cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material that exhibits a blue phase has small viewing angle dependence.

In the case where a liquid crystal element is used as a display element, a twisted nematic (TN) mode, an in-plane switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Furthermore, a normally black liquid crystal display device such as a vertical alignment (VA) mode transmissive liquid crystal display device may also be used. There are some examples of a vertical alignment mode; for example, a multi-domain vertical alignment (MVA) mode, a patterned vertical alignment (PVA) mode, and an ASV mode, or the like can be employed.

<2-3. Display Device Including Light-Emitting Element>

The display device 700 illustrated in FIG. 17 includes the light-emitting element 782. The light-emitting element 782 includes a conductive film 772, an EL layer 786, and a conductive film 788. The display device 700 illustrated in FIG. 17 can display an image by utilizing light emission from the EL layer 786 of the light-emitting element 782 provided in each pixel. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

In the display device 700 in FIG. 17, an insulating film 730 is provided over the planarization insulating film 770 and the conductive film 772. The insulating film 730 covers part of the conductive film 772. Note that the light-emitting element 782 has a top-emission structure. Thus, the conductive film 788 has a light-transmitting property and transmits light emitted from the EL layer 786. Although the top-emission structure is described as an example in this embodiment, the structure is not limited thereto. For example, a bottom-emission structure in which light is emitted to the conductive film 772 side or a dual-emission structure in which light is emitted to both the conductive film 772 side and the conductive film 788 side may also be employed.

The coloring film 736 is provided to overlap with the light-emitting element 782, and the light-blocking film 738 is provided in the lead wiring portion 711 and the source driver circuit portion 704 to overlap with the insulating film 730. The coloring film 736 and the light-blocking film 738 are covered with the insulating film 734. A space between the light-emitting element 782 and the insulating film 734 is filled with a sealing film 732. The structure of the display device 700 is not limited to the example in FIG. 17, in which the coloring film 736 is provided. For example, a structure without the coloring film 736 may also be employed in the case where the EL layer 786 is formed by separate coloring, i.e., formed into an island shape per pixel.

<2-4. Structure Example of Display Device Provided with Input/Output Device>

An input/output device may be provided in the display device 700 illustrated in FIG. 16 and FIG. 17. As an example of the input/output device, a touch panel or the like can be given.

Figure 18:
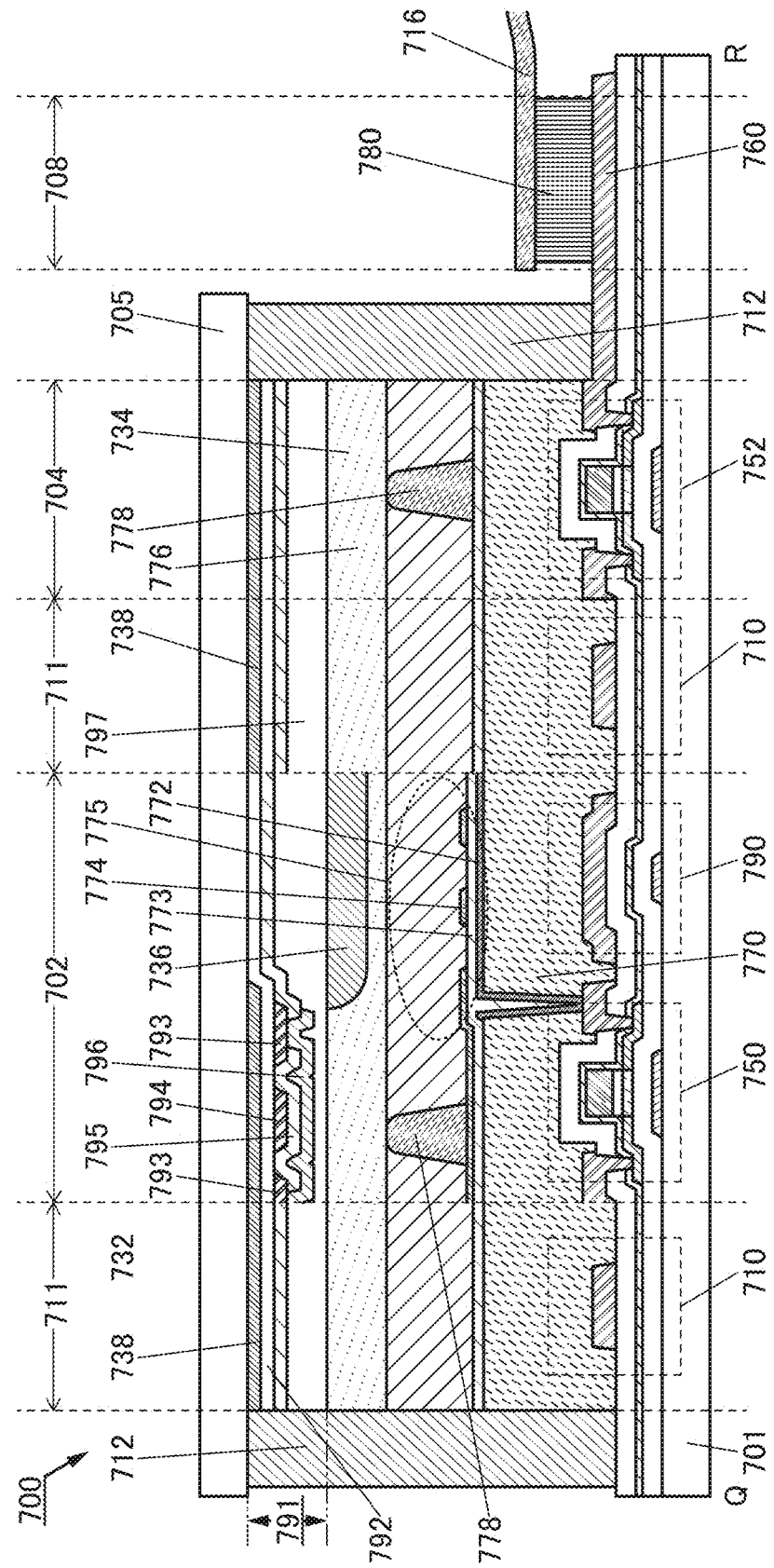
FIG. 18 is a cross-sectional view of a display device.
Figure 19:
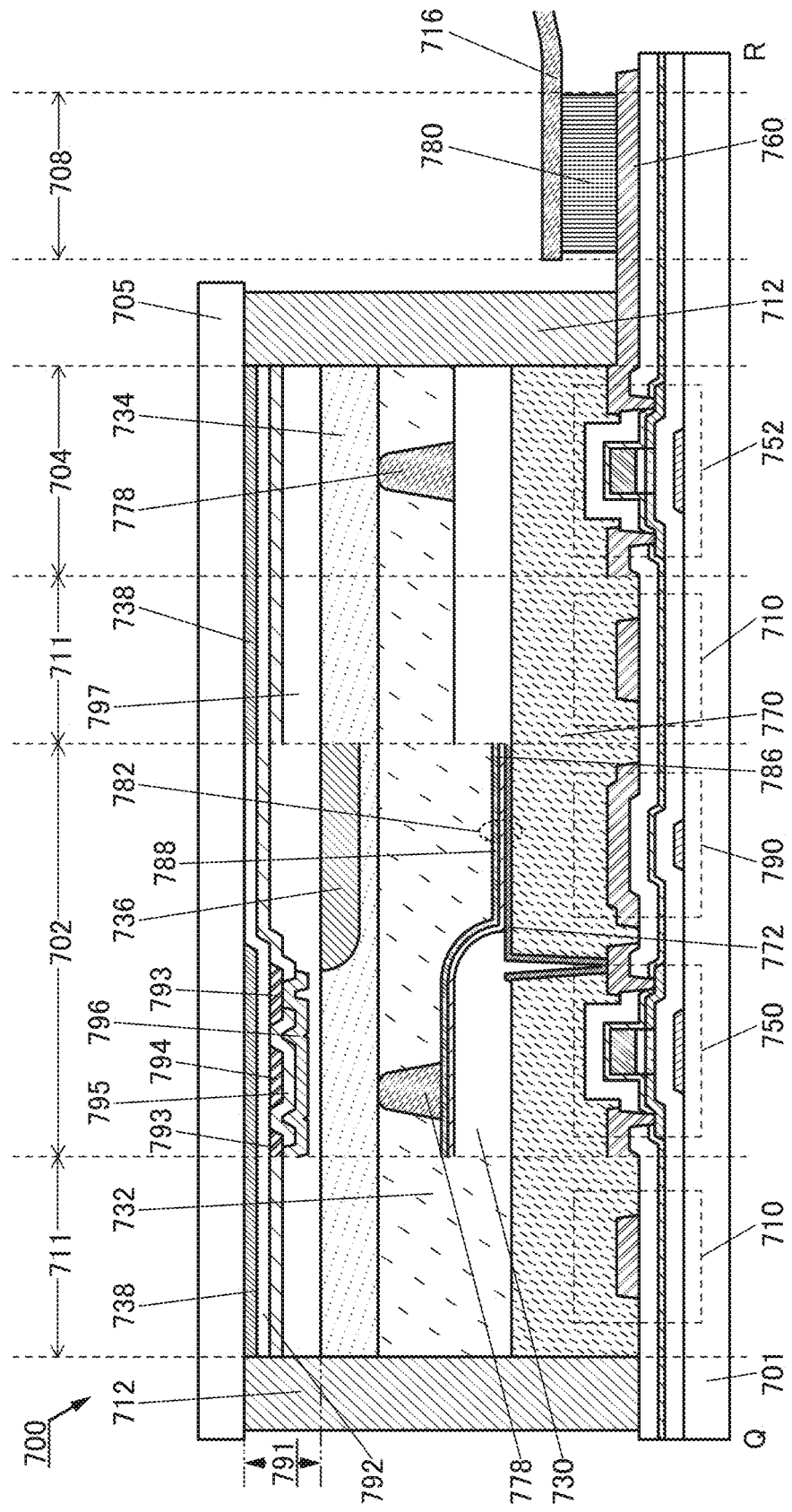
FIG. 19 is a cross-sectional view of a display device.

FIG. 18 illustrates a structure in which the display device 700 shown in FIG. 16 includes a touch panel 791. FIG. 19 illustrates a structure in which the display device 700 shown in FIG. 17 includes the touch panel 791.

FIG. 18 is a cross-sectional view of the structure in which the touch panel 791 is provided in the display device 700 illustrated in FIG. 16. FIG. 19 is a cross-sectional view of the structure in which the touch panel 791 is provided in the display device 700 illustrated in FIG. 17.

First, the touch panel 791 illustrated in FIG. 18 and FIG. 19 is described below.

The touch panel 791 illustrated in FIG. 18 and FIG. 19 is an in-cell touch panel provided between the second substrate 705 and the coloring film 736. The touch panel 791 is formed on the second substrate 705 side before the light-blocking film 738 and the coloring film 736 are formed.

The touch panel 791 includes the light-blocking film 738, an insulating film 792, an electrode 793, an electrode 794, an insulating film 795, an electrode 796, and an insulating film 797. A change in the capacitance between the electrode 793 and the electrode 794, which can occur as a result of the approach of an object such as a finger or a stylus, for example, can be sensed.

A portion in which the electrode 793 intersects with the electrode 794 is illustrated in the upper portion of the transistor 750 illustrated in FIG. 18 and FIG. 19. Through openings in the insulating film 795, the electrode 796 is electrically connected to the two electrodes 793 between which the electrode 794 is positioned. Note that a structure in which a region where the electrode 796 is provided is provided in the pixel portion 702 is illustrated in FIG. 18 and FIG. 19 as an example; however, one embodiment of the present invention is not limited thereto. For example, the region where the electrode 796 is provided may be provided in the source driver circuit portion 704.

The electrodes 793 and 794 are provided in a region overlapping with the light-blocking film 738. As illustrated in FIG. 18, it is preferable that the electrode 793 do not overlap with the light-emitting element 782. As illustrated in FIG. 19, it is preferable that the electrode 793 do not overlap with the liquid crystal element 775. In other words, the electrode 793 has an opening in its region overlapping with the light-emitting element 782 and the liquid crystal element 775. That is, the electrode 793 has a mesh shape. With this structure, the electrode 793 does not block light emitted from the light-emitting element 782. Alternatively, the electrode 793 can have a structure which does not block light transmitted through the liquid crystal element 775. Thus, since luminance is hardly reduced even when the touch panel 791 is placed, a display device with high visibility and low power consumption can be achieved. Note that the electrode 794 can have a similar structure.

In addition, since the electrodes 793 and 794 do not overlap with the light-emitting element 782, the electrodes 793 and 794 can be formed using a metal material with low visible light transmittance. In the case where the electrode 793 and the electrode 794 do not overlap with the liquid crystal element 775, a metal material having low transmittance with respect to visible light can be used for the electrode 793 and the electrode 794.

Accordingly, the resistance of the electrodes 793 and 794 can be reduced as compared with an electrode using an oxide material with high visible light transmittance, so that the sensitivity of the touch panel can be increased.

For example, conductive nanowires may be used for the electrodes 793, 794, and 796. The nanowires may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of the electrodes 664, 665, and 667, the transmittance of visible light can be greater than or equal to 89% and the sheet resistance can be greater than or equal to 40 Ω/square and less than or equal to 100 Ω/square.

Although the structure of the in-cell touch panel is illustrated in FIG. 18 and FIG. 19, one embodiment of the present invention is not limited thereto. For example, a touch panel formed over the display device 700 (an on-cell touch panel), or a touch panel attached to the display device 700 (an out-cell touch panel) may be used.

In this manner, the display device of one embodiment of the present invention can be combined with various types of touch panels.

At least part of any of the structural examples, the drawings corresponding thereto, and the like described in this embodiment can be implemented in combination with any of the other structural examples, the other drawings corresponding thereto, and the like as appropriate.

At least part of this embodiment can be implemented in combination with any of the other embodiments described in this specification as appropriate.

Embodiment 3

In this embodiment, a display device including a semiconductor device of one embodiment of the present invention is described with reference to FIGS. 20A to 20C.

A display device illustrated in FIG. 20A includes a region including pixels (hereinafter referred to as a pixel portion 502), a circuit portion that is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X (X is a natural number of 2 or more) rows and Y (Y is a natural number of 2 or more) columns (hereinafter, the circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, another signal can be supplied from the gate driver 504a.

The source driver 504b includes a shift register or the like. The source driver 504b receives a signal (image signal) from which a data signal is generated, as well as a signal for driving the shift register, through the terminal portion 507. The source driver 504b has a function of generating a data signal to be written to the pixel circuit 501 from the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter referred to as data lines DL_1 to DL_Y). Alternatively, the source driver 504b has a function of supplying an initialization signal. Without being limited thereto, another signal can be supplied from the source driver 504b.

The source driver 504b includes a plurality of analog switches, for example. The source driver 504b can output, as data signals, time-divided image signals obtained by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal in each of the plurality of pixel circuits 501 are controlled by the gate driver 504a. For example, to the pixel circuit 501 in the m-th row and the n-th column (m is a natural number of X or less, and n is a natural number of Y or less), a pulse signal is input from the gate driver 504a through the scan line GL_m, and a data signal is input from the source driver 504b through the data line DL_n in accordance with the potential of the scan line GL_m.

Figure 20A:
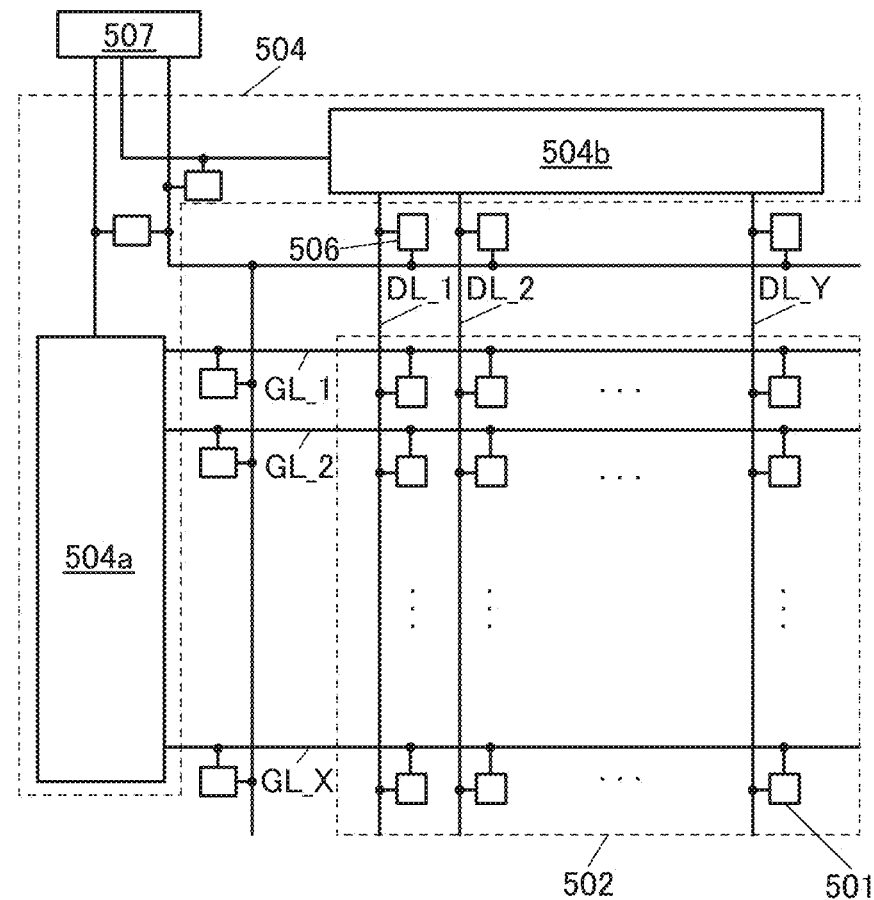
FIGS. 20A to 20C are a block diagram and circuit diagrams of a display device.

The protection circuit 506 in FIG. 20A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers to a portion having terminals for inputting power, control signals, and image signals from external circuits to the display device.

The protection circuit 506 electrically connects a wiring connected to the protection circuit to another wiring when a potential out of a certain range is supplied to the wiring connected to the protection circuit.

As shown in FIG. 20A, the protection circuits 506 provided for the pixel portion 502 and the driver circuit portion 504 can improve the resistance of the display device to overcurrent generated by electrostatic discharge (ESD) or the like. Note that the configuration of the protection circuits 506 is not limited thereto; for example, the protection circuit 506 can be connected to the gate driver 504a or the source driver 504b. Alternatively, the protection circuit 506 can be connected to the terminal portion 507.

One embodiment of the present invention is not limited to the example in FIG. 20A, in which the driver circuit portion 504 includes the gate driver 504a and the source driver 504b. For example, only the gate driver 504a may be formed, and a separately prepared substrate over which a source driver circuit is formed (e.g., a driver circuit board formed using a single crystal semiconductor film or a polycrystalline semiconductor film) may be mounted.

Figure 20B:
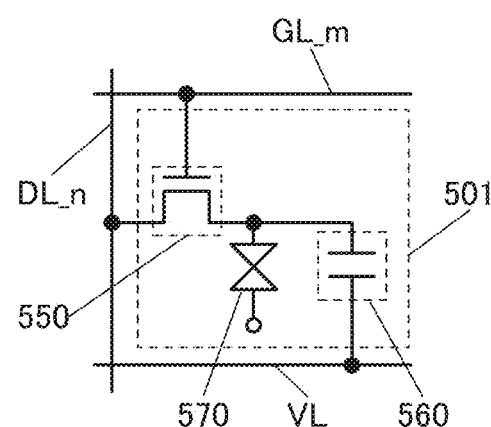

Each of the plurality of pixel circuits 501 in FIG. 20A can have the configuration illustrated in FIG. 20B, for example.

The pixel circuit 501 in FIG. 20B includes a liquid crystal element 570, a transistor 550, and a capacitor 560. As the transistor 550, the transistor described in the above embodiment can be used.

The potential of one of a pair of electrodes of the liquid crystal element 570 is set as appropriate in accordance with the specifications of the pixel circuit 501. The alignment state of the liquid crystal element 570 depends on data written thereto. A common potential may be supplied to the one of the pair of electrodes of the liquid crystal element 570 included in each of the plurality of pixel circuits 501. The potential supplied to the one of the pair of electrodes of the liquid crystal element 570 in the pixel circuit 501 may differ between rows.

Examples of a method for driving the display device including the liquid crystal element 570 include a TN mode, an STN mode, a VA mode, an axially symmetric aligned micro-cell (ASM) mode, an optically compensated birefringence (OCB) mode, a ferroelectric liquid crystal (FLC) mode, an anti-ferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other of the source electrode and the drain electrode of the transistor 550 is electrically connected to the other of the pair of electrodes of the liquid crystal element 570. A gate electrode of the transistor 550 is electrically connected to the scan line GL_m. The transistor 550 is configured to control whether a data signal is written.

One of a pair of electrodes of the capacitor 560 is electrically connected to a wiring through which a potential is supplied (hereinafter referred to as a potential supply line VL), and the other of the pair of electrodes of the capacitor 560 is electrically connected to the other of the pair of electrodes of the liquid crystal element 570. The potential of the potential supply line VL is set as appropriate in accordance with the specifications of the pixel circuit 501. The capacitor 560 functions as a storage capacitor for storing written data.

For example, in the display device including the pixel circuits 501 in FIG. 20B, the gate driver 504a in FIG. 20A sequentially selects the pixel circuits 501 row by row to turn on the transistors 550, and data signals are written.

When the transistor 550 is turned off, the pixel circuit 501 to which the data has been written is brought into a holding state. This operation is sequentially performed row by row; thus, an image can be displayed.

Figure 20C:
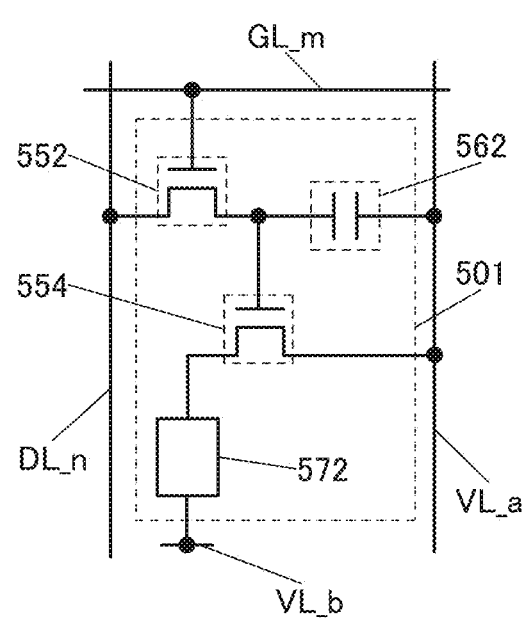

Alternatively, each of the plurality of pixel circuits 501 in FIG. 20A can have the configuration illustrated in FIG. 20C, for example.

The pixel circuit 501 in FIG. 20C includes transistors 552 and 554, a capacitor 562, and a light-emitting element 572.

The transistor described in the above embodiment can be used as the transistor 552 and/or the transistor 554.

One of a source electrode and a drain electrode of the transistor 552 is electrically connected to a data line DL_n, and a gate electrode of the transistor 552 is electrically connected to a scan line GL_m.

The transistor 552 is configured to control whether a data signal is written.

One of a pair of electrodes of the capacitor 562 is electrically connected to a potential supply line VL_a, and the other of the pair of electrodes of the capacitor 562 is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other of the anode and the cathode of the light-emitting element 572 is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

A high power supply potential $V_{DD}$ is supplied to one of the potential supply line VL_a and the potential supply line VL_b, and a low power supply potential $V_{SS}$ is supplied to the other of the potential supply line VL_a and the potential supply line VL_b.

In the display device including the pixel circuits 501 in FIG. 20C, the gate driver 504a in FIG. 20A sequentially selects the pixel circuits 501 row by row to turn on the transistors 552, and data signals are written.

When the transistor 552 is turned off, the pixel circuit 501 to which the data has been written is brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

At least part of any of the structural examples, the drawings corresponding thereto, and the like described in this embodiment can be implemented in combination with any of the other structural examples, the other drawings corresponding thereto, and the like as appropriate.

At least part of this embodiment can be implemented in combination with any of the other embodiments described in this specification as appropriate.

Embodiment 4

In this embodiment, a display module and electronic devices, each of which includes a semiconductor device of one embodiment of the present invention, are described with reference to FIG. 21, FIGS. 22A to 22E, and FIGS. 23A to 23G.

<4-1. Display Module>

Figure 21:
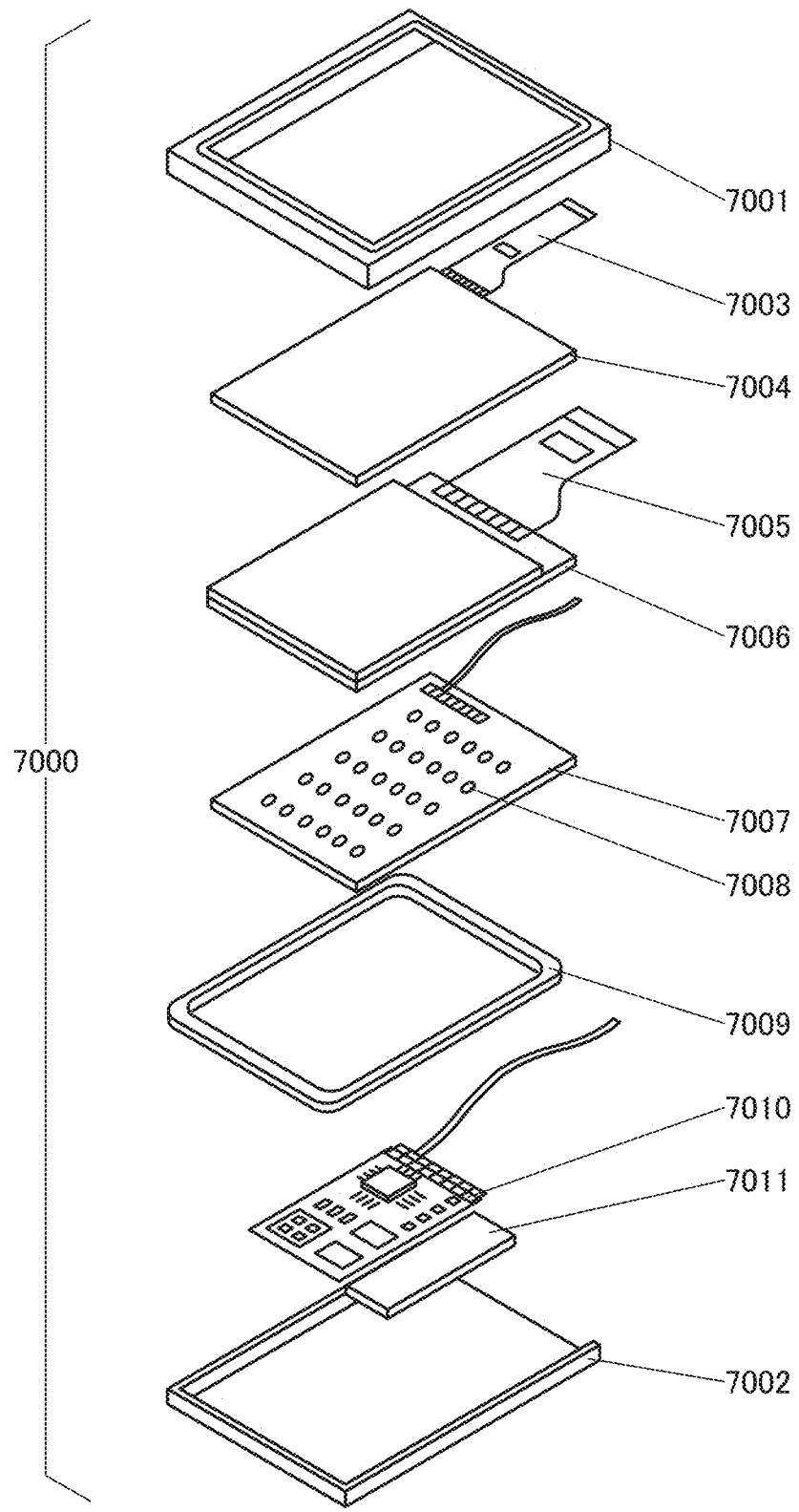
FIG. 21 shows a structure example of a display module.

In a display module 7000 illustrated in FIG. 21, a touch panel 7004 connected to an FPC 7003, a display panel 7006 connected to an FPC 7005, a backlight 7007, a frame 7009, a printed-circuit board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive touch panel or a capacitive touch panel and overlap with the display panel 7006. Alternatively, a counter substrate (sealing substrate) of the display panel 7006 can have a touch panel function. Alternatively, a photosensor may be provided in each pixel of the display panel 7006 to form an optical touch panel.

The backlight 7007 includes a light source 7008. One embodiment of the present invention is not limited to the structure in FIG. 21, in which the light source 7008 is provided over the backlight 7007. For example, a structure in which the light source 7008 is provided at an end portion of the backlight 7007 and a light diffusion plate is further provided may be employed. Note that the backlight 7007 need not be provided in the case where a self-luminous light-emitting element such as an organic EL element is used or in the case where a reflective panel or the like is employed.

The frame 7009 protects the display panel 7006 and functions as an electromagnetic shield for blocking electromagnetic waves generated by the operation of the printed-circuit board 7010. The frame 7009 may also function as a radiator plate.

The printed-circuit board 7010 includes a power supply circuit and a signal processing circuit for outputting a video signal and a clock signal. As a power source for supplying power to the power supply circuit, an external commercial power source or the separate battery 7011 may be used. The battery 7011 can be omitted in the case where a commercial power source is used.

The display module 7000 may be additionally provided with a member such as a polarizing plate, a retardation plate, or a prism sheet.

<4-2. Electronic Device 1>

Next, FIGS. 22A to 22E illustrate examples of electronic devices.

Figure 22A:
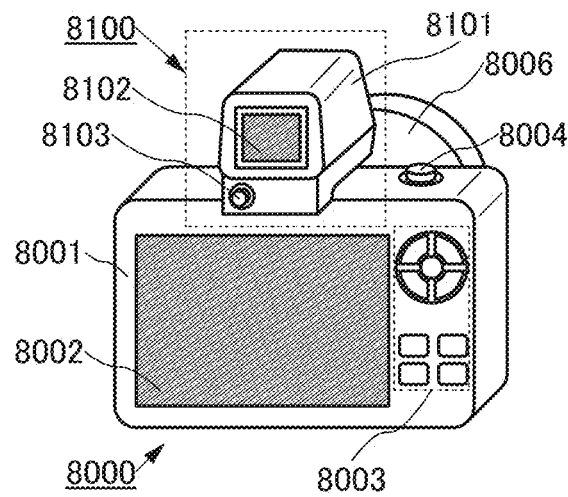
FIGS. 22A to 22E show structure examples of an electronic device.

FIG. 22A is an external view of a camera 8000 to which a finder 8100 is attached.

The camera 8000 includes a housing 8001, a display portion 8002, an operation button 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing.

Images can be taken with the camera 8000 at the press of the shutter button 8004. In addition, images can be taken at the touch of the display portion 8002 that serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 serves as a power button. The display portion 8102 can be turned on and off with the button 8103.

A display device of one embodiment of the present invention can be used in the display portion 8002 of the camera 8000 and the display portion 8102 of the finder 8100.

Although the camera 8000 and the finder 8100 are separate and detachable electronic devices in FIG. 22A, the housing 8001 of the camera 8000 may include a finder having a display device.

Figure 22B:
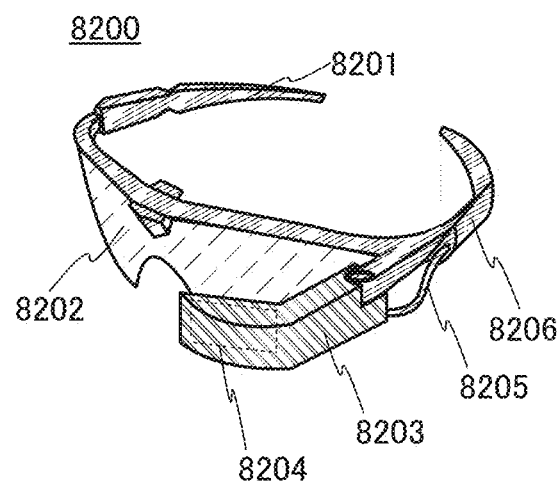

FIG. 22B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input unit.

The mounting portion 8201 may include a plurality of electrodes so as to be in contact with the user. The main body 8203 may be configured to sense current flowing through the electrodes with the movement of the user's eyeball to recognize the points the user looks at. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 22C:
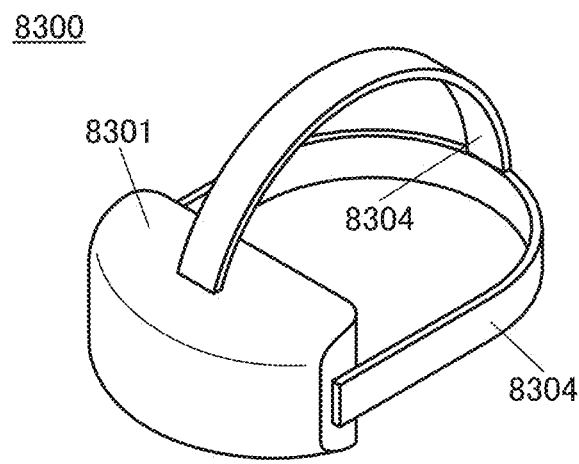
Figure 22D:
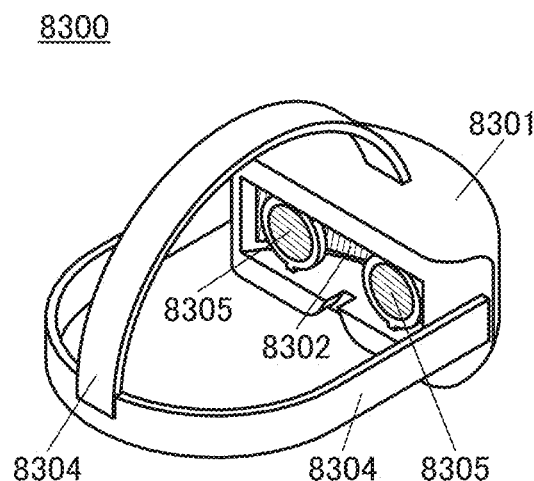
Figure 22E:
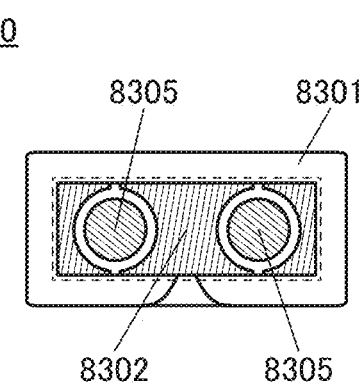

FIGS. 22C to 22E are external views of a head-mounted display 8300. The head-mounted display 8300 includes a housing 8301, a display portion 8302, an object for fixing, such as a band, 8304, and a pair of lenses 8305.

A user can see display on the display portion 8302 through the lenses 8305. It is favorable that the display portion 8302 be curved. When the display portion 8302 is curved, a user can feel high realistic sensation of images. Although the structure described in this embodiment as an example has one display portion 8302, the number of the display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device including the semiconductor device of one embodiment of the present invention has an extremely high resolution; thus, even when an image is magnified using the lenses 8305 as illustrated in FIG. 22E, the user does not perceive pixels, and thus a more realistic image can be displayed.

<8-3. Electronic Device 2>

Next, FIGS. 23A to 23G illustrate examples of electronic devices that are different from those illustrated in FIGS. 22A to 22E.

Electronic devices illustrated in FIGS. 23A to 23G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIGS. 23A to 23G have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices in FIGS. 23A to 23G are not limited thereto, and the electronic devices can have a variety of functions. Although not illustrated in FIGS. 23A to 23G, the electronic devices may each have a plurality of display portions. Furthermore, the electronic devices may each be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 23A to 23G are described in detail below.

Figure 23A:
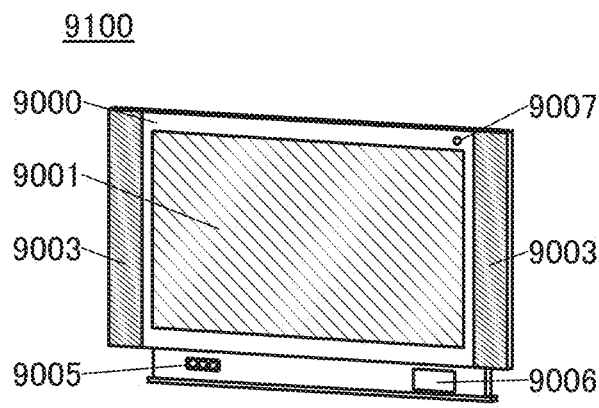
FIGS. 23A to 23G show structure examples of an electronic device.

FIG. 23A is a perspective view illustrating a television device 9100. The television device 9100 can include the display portion 9001 having a large screen size of, for example, 50 inches or more, or 100 inches or more.

Figure 23D:
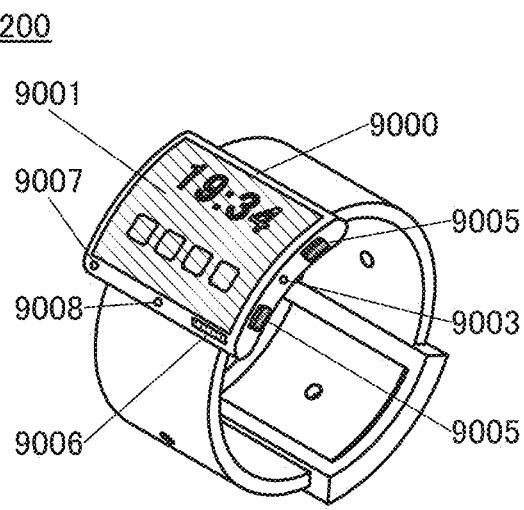
Figure 23B:
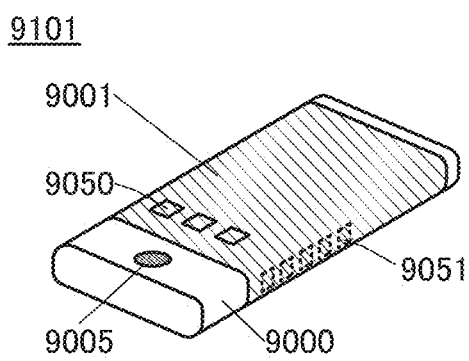

FIG. 23B is a perspective view of a portable information terminal 9101. The portable information terminal 9101 functions as, for example, one or more of a telephone set, a notebook, and an information browsing system. Specifically, the portable information terminal 9101 can be used as a smartphone. Note that the portable information terminal 9101 may include the speaker 9003, the connection terminal 9006, the sensor 9007, or the like. The portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Examples of the information 9051 include display indicating reception of an e-mail, a social networking service (SNS) message, or a telephone call, the title and sender of an e-mail or an SNS message, date, time, remaining battery, and reception strength of an antenna. Alternatively, the operation buttons 9050 or the like may be displayed in place of the information 9051.

Figure 23E:
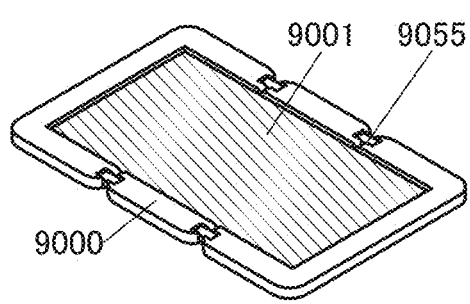
Figure 23C:
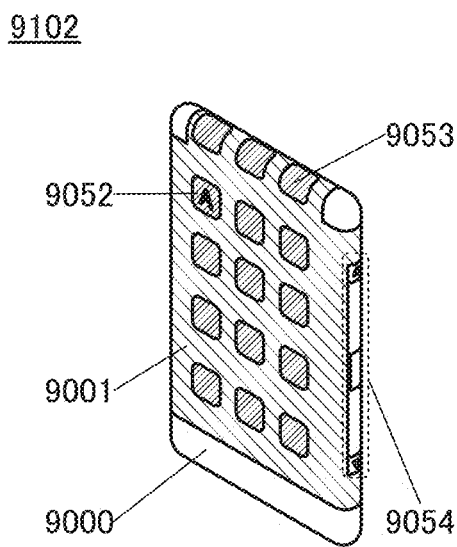

FIG. 23C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) on the portable information terminal 9102 put in a breast pocket of his/her clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 23D is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is curved, and display can be performed on the curved display surface. The portable information terminal 9200 can employ near field communication conformable to a communication standard. For example, hands-free calling can be achieved by mutual communication between the portable information terminal 9200 and a headset capable of wireless communication. Moreover, the portable information terminal 9200 includes the connection terminal 9006 and can perform direct data communication with another information terminal via a connector. Charging through the connection terminal 9006 is also possible. Note that the charging operation may be performed by wireless power feeding without using the connection terminal 9006.

Figure 23F:
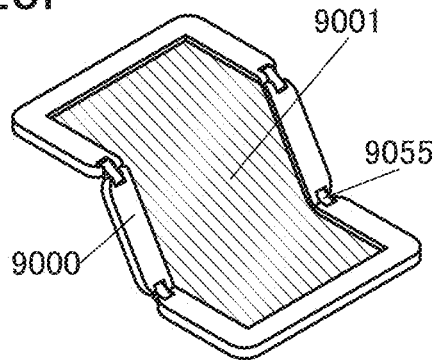
Figure 23G:
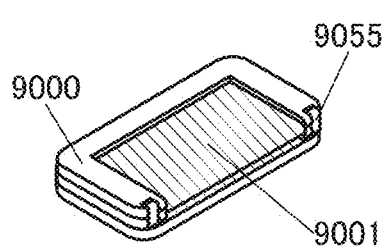

FIGS. 23E, 23F, and 23G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region is highly browsable. The display portion 9001 of the portable information terminal 9201 is supported by three housings 9000 joined by hinges 9055. By being folded at the hinges 9055 between the two adjacent housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

The electronic devices described in this embodiment each include the display portion for displaying some sort of data. Note that the semiconductor device of one embodiment of the present invention can also be used for an electronic device that does not have a display portion.

At least part of any of the structural examples, the drawings corresponding thereto, and the like described in this embodiment can be implemented in combination with any of the other structural examples, the other drawings corresponding thereto, and the like as appropriate.

At least part of this embodiment can be implemented in combination with any of the other embodiments described in this specification as appropriate.

Example 1

In this example, oxygen was supplied to oxide insulating films under different conditions, and the amounts of oxygen released from the oxide insulating films were evaluated.

[Sample Fabrication]

First, sample fabrication is described. First, an approximately 150-nm-thick silicon oxynitride film was formed over a glass substrate by a plasma CVD method. Then, heat treatment was performed in a nitrogen atmosphere at 350° C. for 1 hour. After that, methods given below were used, so that Samples A1 to A4 were fabricated. In addition, a reference sample (REF) was fabricated. In the fabrication process of the reference sample, a silicon oxynitride film was formed in the above-described manner, and the treatment after the formation of the silicon oxynitride film was not performed.

[Sample A1]

In the fabrication process of Sample A1, oxygen plasma treatment was performed on the silicon oxynitride film with a plasma CVD apparatus. The oxygen plasma treatment was performed under the conditions of a temperature of 350° C., a pressure of 40 Pa, a power supply of 3000 W, an oxygen flow rate ratio of 100%, and a treatment time of 250 seconds.

[Sample A2]

In the fabrication process of Sample A2, an oxide semiconductor film (hereinafter also referred to as an IGZO film) was formed over the silicon oxynitride film in an atmosphere containing oxygen. The oxide semiconductor film was formed by a sputtering method using an In—Ga—Zn oxide target under the conditions of a temperature of 170° C., a pressure of 0.6 Pa, and a power supply of 2.5 kW. Here, an oxide semiconductor film was formed to a thickness of 10 nm with an oxygen flow rate ratio of 100%, and then, an oxide semiconductor film was formed to a thickness of approximately 90 nm with an oxygen flow rate ratio of 10%. Then, the oxide semiconductor film was removed by etching to expose a surface of the silicon oxynitride film.

[Sample A3]

In the fabrication process of Sample A3, oxygen radical doping treatment was performed on the silicon oxynitride film with an ashing apparatus. The oxygen radical doping treatment was performed under the conditions of an ICP power of 0 W, a bias power of 4500 W, a pressure of 15 Pa, an oxygen flow rate ratio of 100%, a lower electrode temperature of 40° C., and a treatment time of 300 seconds.

[Sample A4]

In the fabrication process of Sample A4, an oxide conductive film was formed over the silicon oxynitride film, and then, oxygen radical doping treatment was performed with an ashing apparatus. As the oxide conductive film, an oxide conductive film was formed to a thickness of approximately 5 nm by a sputtering method using an indium tin oxide target including silicon. The oxide conductive film is hereinafter also referred to as an ITSO film. The oxygen radical doping treatment was performed under the conditions similar to those used for fabricating Sample A3. Then, the oxide conductive film was removed by etching to expose a surface of the silicon oxynitride film.

[Analysis]

Then, thermal desorption spectroscopy (TDS) was performed on the fabricated samples. FIGS. 24A to 24E show the TDS analysis results of the samples. In each of the graphs, the vertical axis represents the detection intensity of a mass-to-charge ratio of 32 that corresponds to an oxygen molecule, and the horizontal axis represents the temperature. Note that only the graph in FIG. 24E (Sample A4) has a different scale of the vertical axis.

The amount of released oxygen molecules of each of Samples A1 to A4 was larger than the amount of released oxygen molecules of the reference sample not subjected to the treatment. In particular, in Sample A4 on which the oxygen radical doping treatment was performed through the oxide conductive film, the amount of released oxygen had a peak value larger than the peak values of the amounts of released oxygen in the other samples by one or more orders of magnitude. This suggests that the oxide conductive film serves as a cap film that suppresses the release of oxygen supplied to the silicon oxynitride film.

Furthermore, as shown in FIG. 24E, a peak is observed at a temperature of approximately 200° C. in Sample A4. This suggests that the temperature of the heat treatment for supplying oxygen from the oxide insulating film to the semiconductor film can be lowered.

The quantitative values of the amounts of released gas corresponding to a mass-to-charge ratio of 32 that were estimated from the TDS analysis results were as follows. The quantitative value in the reference sample was approximately $4.2 \times 10^{13}/cm^2$, the quantitative value in Sample A1 was approximately $5.1 \times 10^{14}/cm^2$, the quantitative value in Sample A2 was approximately $7.4 \times 10^{14}/cm^2$, the quantitative value in Sample A3 was approximately $1.2 \times 10^{14}/cm^2$, and the quantitative value in Sample A4 was approximately $1.6 \times 10^{16}/cm^2$. This suggests that the oxygen supply amount in Sample A4 is extremely large as compared to the oxygen supply amounts in the samples fabricated under the other conditions.

Thus, it can be seen that the oxygen supply treatment performed through the conductive film enables supply of an extremely large amount of oxygen to the oxide insulating film.

Example 2

In this example, samples were fabricated under different conditions of oxygen supply treatment in which oxygen radical doping was performed through a conductive film, and the fabricated samples were compared with each other.

[Conductive Film Kind]

Conductive films formed over the silicon oxynitride films were varied, and the oxygen supply amounts were compared with each other. For the comparison, three kinds of conductive films, i.e., an aluminum film, an ITSO film, and an IGZO film, were formed. The samples were each obtained by the following method: a conductive film was formed over a silicon oxynitride film to a thickness of approximately 5 nm by a sputtering method, oxygen radical doping treatment was performed with an ashing apparatus, and then the conductive film was removed by etching.

Figure 25A:
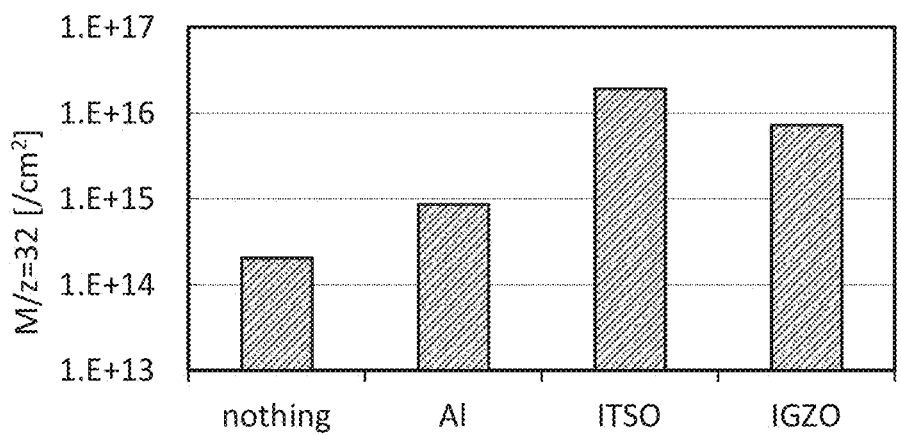
FIGS. 25A and 25B show TDS measurement results.

FIG. 25A shows TDS analysis results obtained under the different conditions. It can be seen from the results that the oxygen release amount, i.e., the oxygen supply amount, is larger in the case of using the oxide films, such as an ITSO film and an IGZO film, than in the case of using an aluminum film. Furthermore, of the two oxide films, the ITSO film with higher conductivity achieved a larger oxygen supply amount.

[Conductive Film Thickness]

ITSO films with different thicknesses were used as the conductive films formed over the silicon oxynitride films, and the oxygen release amounts were compared with each other. For the comparison, six kinds of samples were fabricated such that the thicknesses of the ITSO films in the samples varied from 5 nm to 10 nm in increments of 1 nm and oxygen radical doping treatment was performed through the conductive films. TDS measurement was performed in a state where the silicon oxynitride films were exposed by etching the conductive films, as described above.

Figure 25B:
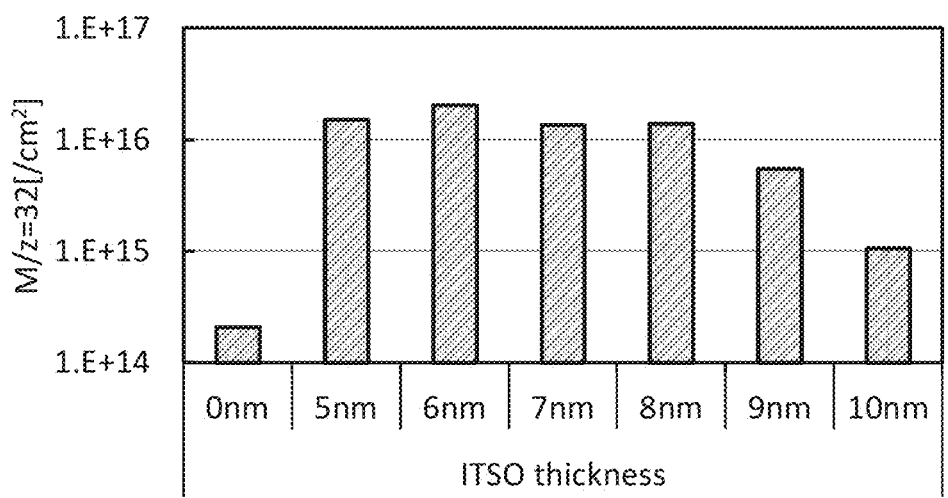

FIG. 25B shows the TDS analysis results of the samples. It can be seen from the results that the oxygen release amounts obtained under all of the thickness conditions were larger than the oxygen release amount obtained under the conditions where the ITSO film was not provided. It is also confirmed that, in the case where the thickness is larger than or equal to 9 nm, the oxygen release amount (the oxygen supply amount) was decreased along with the thickness increase.

[Oxygen Radical Doping Conditions]

Oxygen radical doping treatment was performed on silicon oxynitride films under different conditions through ITSO films each having a thickness of approximately 5 nm, and the oxygen release amounts were compared with each other. TDS measurement was performed in a manner similar to that described above, i.e., in a state where the silicon oxynitride films were exposed by etching the ITSO films. Shown below are the results of the measurement performed with different bias powers, different pressures, and different treatment times.

Figure 26A:
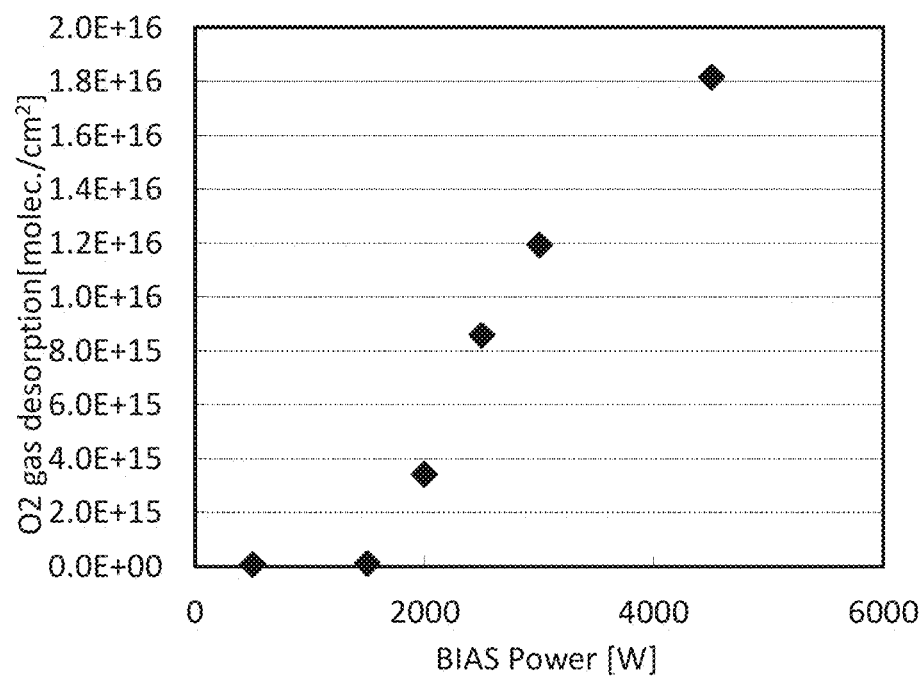
FIGS. 26A and 26B show TDS measurement results.

FIG. 26A shows the measurement results where the horizontal axis represents the bias power and the vertical axis represents the released amount of an oxygen gas. It can be seen from the results that the oxygen supply amount increases in proportion to the bias power.

Figure 26B:
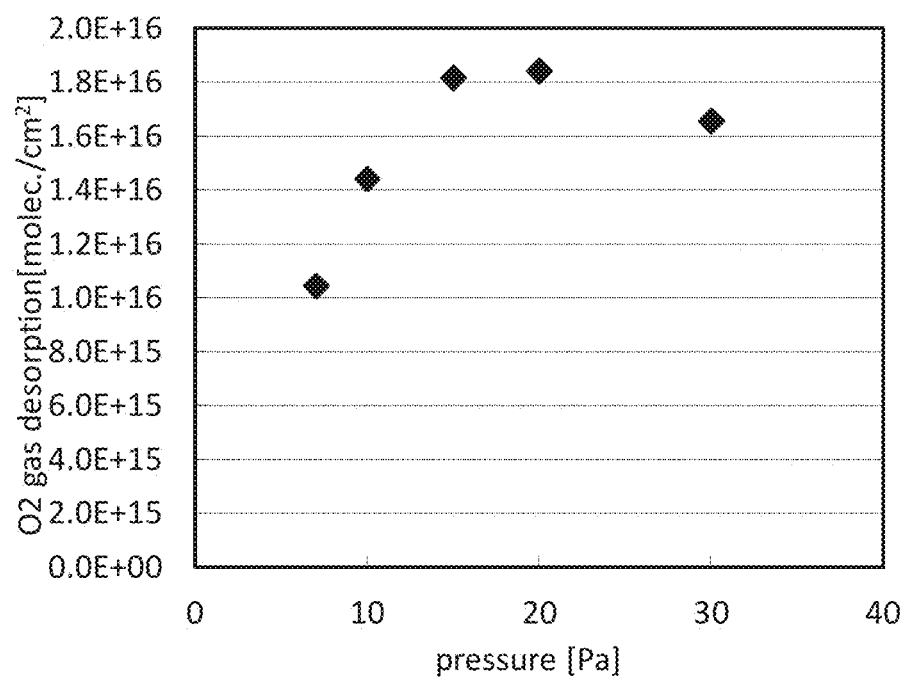

FIG. 26B shows the measurement results where the horizontal axis represents the pressure and the vertical axis represents the released amount of an oxygen gas. It can be seen from the results that the oxygen supply amount is not simply proportional to the pressure, and that there are optimal conditions achieving the largest oxygen supply amount.

Furthermore, although not shown here, the oxygen supply amount increases simply in proportion to the treatment time.

Example 3

In this example, conditions for fabricating transistors were partly varied, and the electrical characteristics of the thus fabricated transistors were compared with each other.

[Sample Fabrication]

For the structures of the fabricated transistors, the transistor 100 described in Embodiment 1 and shown in FIGS. 2A to 2C can be referred to. In this example, the highest temperature in the fabrication process and an oxygen supply treatment method were varied to fabricate six kinds of samples (Samples B1 to B6).

First, fabrication steps common to Samples B1 to B6 are described. A tungsten film was formed over a glass substrate to a thickness of 100 nm by a sputtering method, and the tungsten film was processed to form a first gate electrode. Then, a silicon nitride film was formed to a thickness of approximately 400 nm as a first gate insulating layer by a plasma CVD method.

Then, a metal oxide film was formed to a thickness of approximately 40 nm by a sputtering method using an In—Ga—Zn oxide target (an atomic ratio of In:Ga:Zn=4:2:4.1), and the metal oxide film was processed to form a semiconductor layer. Then, a silicon oxynitride film was formed to a thickness of approximately 150 nm as a second gate insulating layer by a plasma CVD method. Then, first heat treatment was performed in a nitrogen atmosphere.

Then, oxygen supply treatment described later was performed.

After that, a metal oxide film was formed to a thickness of approximately 100 nm by a sputtering method using an In—Ga—Zn oxide target (an atomic ratio of In:Ga:Zn=4:2:4.1). Then, the metal oxide film and the silicon oxynitride film were processed in succession to form a second gate electrode and a second gate insulating layer. Then, plasma treatment was performed on an exposed part of the semiconductor layer and the second gate electrode in an argon and nitrogen atmosphere.

Then, as a protective insulating layer for covering the transistor, an approximately 100-nm-thick silicon nitride film and an approximately 300-nm-thick silicon oxynitride film were formed in succession by a plasma CVD method. Note that the formation temperature of the protective insulating layer was 220° C. Then, second heat treatment was performed in a nitrogen atmosphere. Then, an opening was formed in the part of the insulating layer covering the transistor. Then, a titanium film, an aluminum film, and a titanium film were formed by a sputtering method in this order, and the films were processed. Thus, a source electrode and a drain electrode were formed.

[Sample B1]

In the fabrication process of Sample B1, oxygen plasma treatment was performed at a temperature of 300° C. with a plasma CVD apparatus as the oxygen supply treatment. Furthermore, in the fabrication process of Sample B1, the formation temperature of the first gate insulating layer and the second gate insulating layer was 300° C., the temperature of the first heat treatment and the second heat treatment was 300° C., and the highest temperature in the other fabrication steps was lower than 300° C.

[Sample B2]

In the fabrication process of Sample B2, oxygen plasma treatment was performed at a temperature of 320° C. with a plasma CVD apparatus as the oxygen supply treatment. Furthermore, in the fabrication process of Sample B2, the formation temperature of the first gate insulating layer and the second gate insulating layer was 320° C., the temperature of the first heat treatment and the second heat treatment was 320° C., and the highest temperature in the other fabrication steps was lower than 300° C.

[Sample B3]

In the fabrication process of Sample B3, oxygen plasma treatment was performed at a temperature of 350° C. with a plasma CVD apparatus as the oxygen supply treatment. Furthermore, in the fabrication process of Sample B3, the formation temperature of the first gate insulating layer and the second gate insulating layer was 350° C., the temperature of the first heat treatment and the second heat treatment was 350° C., and the highest temperature in the other fabrication steps was lower than 300° C.

[Sample B4]

In the fabrication process of Sample B4, oxygen radical doping treatment was performed as the oxygen supply treatment through a 5-nm-thick ITSO film with an ashing apparatus, and then, the ITSO film was removed. Furthermore, in the fabrication process of Sample B4, the formation temperature of the first gate insulating layer and the second gate insulating layer was 300° C., the temperature of the first heat treatment and the second heat treatment was 300° C., and the highest temperature in the other fabrication steps was lower than 300° C.

[Sample B5]

In the fabrication process of Sample B5, oxygen radical doping treatment was performed as the oxygen supply treatment through a 5-nm-thick ITSO film with an ashing apparatus, and then, the ITSO film was removed. Furthermore, in the fabrication process of Sample B5, the formation temperature of the first gate insulating layer and the second gate insulating layer was 320° C., the temperature of the first heat treatment and the second heat treatment was 320° C., and the highest temperature in the other fabrication steps was lower than 300° C.

[Sample B6]

In the fabrication process of Sample B6, oxygen radical doping treatment was performed as the oxygen supply treatment through a 5-nm-thick ITSO film with an ashing apparatus, and then, the ITSO film was removed. Furthermore, in the fabrication process of Sample B6, the formation temperature of the first gate insulating layer and the second gate insulating layer was 350° C., the temperature of the first heat treatment and the second heat treatment was 350° C., and the highest temperature in the other fabrication steps was lower than 300° C.

[Electrical Characteristics of Transistors]

Next, $I_d$-$V_g$ characteristics of transistors of the fabricated samples were measured. As conditions for measuring the $I_d$-$V_g$ characteristics of each transistor, a voltage applied to the conductive film serving as a first gate electrode of each transistor (hereinafter the voltage is also referred to as gate voltage ($V_g$)) and a voltage applied to the conductive film serving as a second gate electrode of each transistor (hereinafter the voltage is also referred to as back gate voltage ($V_{bg}$)) changed from −15 V to +20 V in increments of 0.25 V. A voltage applied to the conductive film serving as a source electrode (the voltage is also referred to as source voltage (Vs)) was 0 V (comm), and a voltage applied to the conductive film serving as a drain electrode (the voltage is also referred to as drain voltage ($V_d$)) was 0.1 V and 20 V. The number of measured transistors was 20 for each sample.

Figure 27:
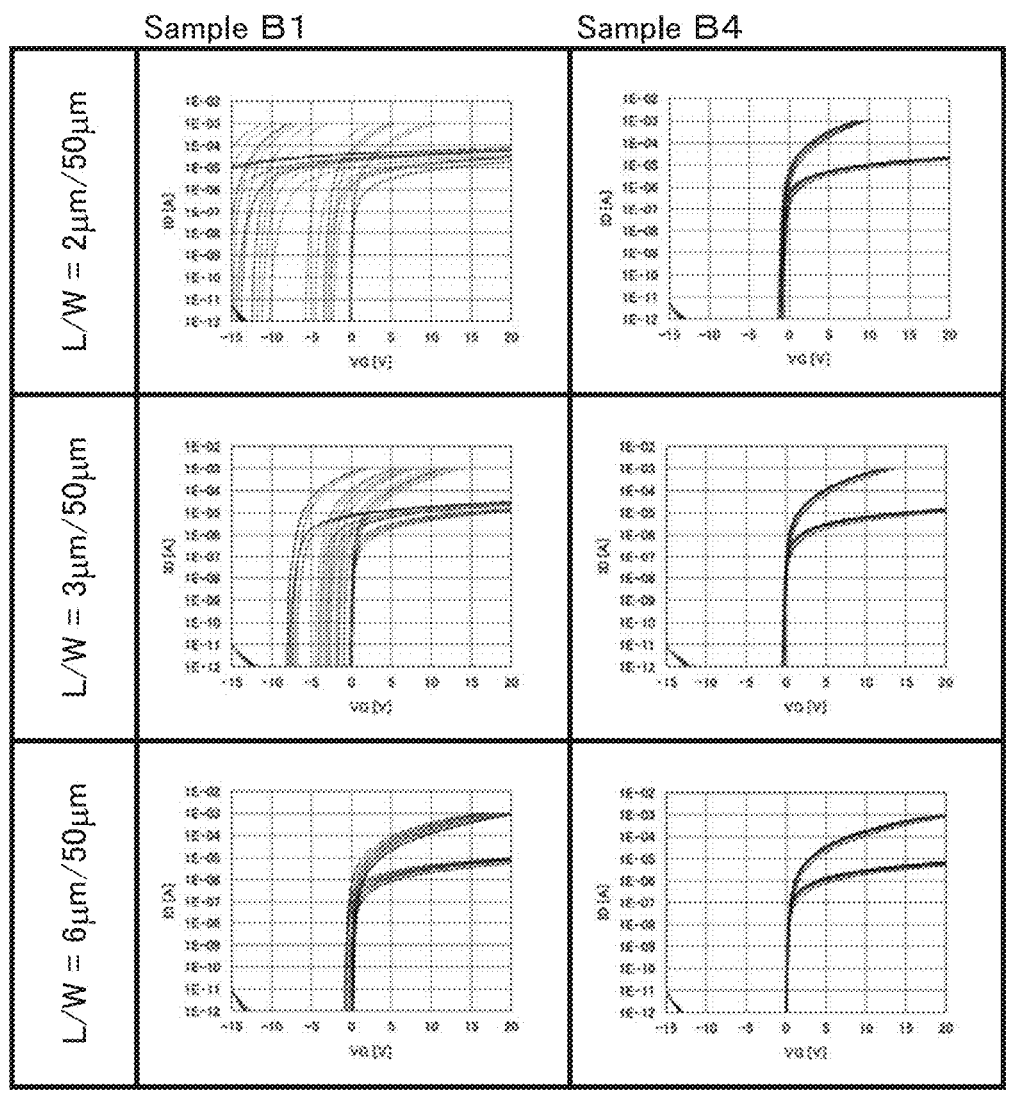
FIG. 27 shows electrical characteristics of transistors.
Figure 28:
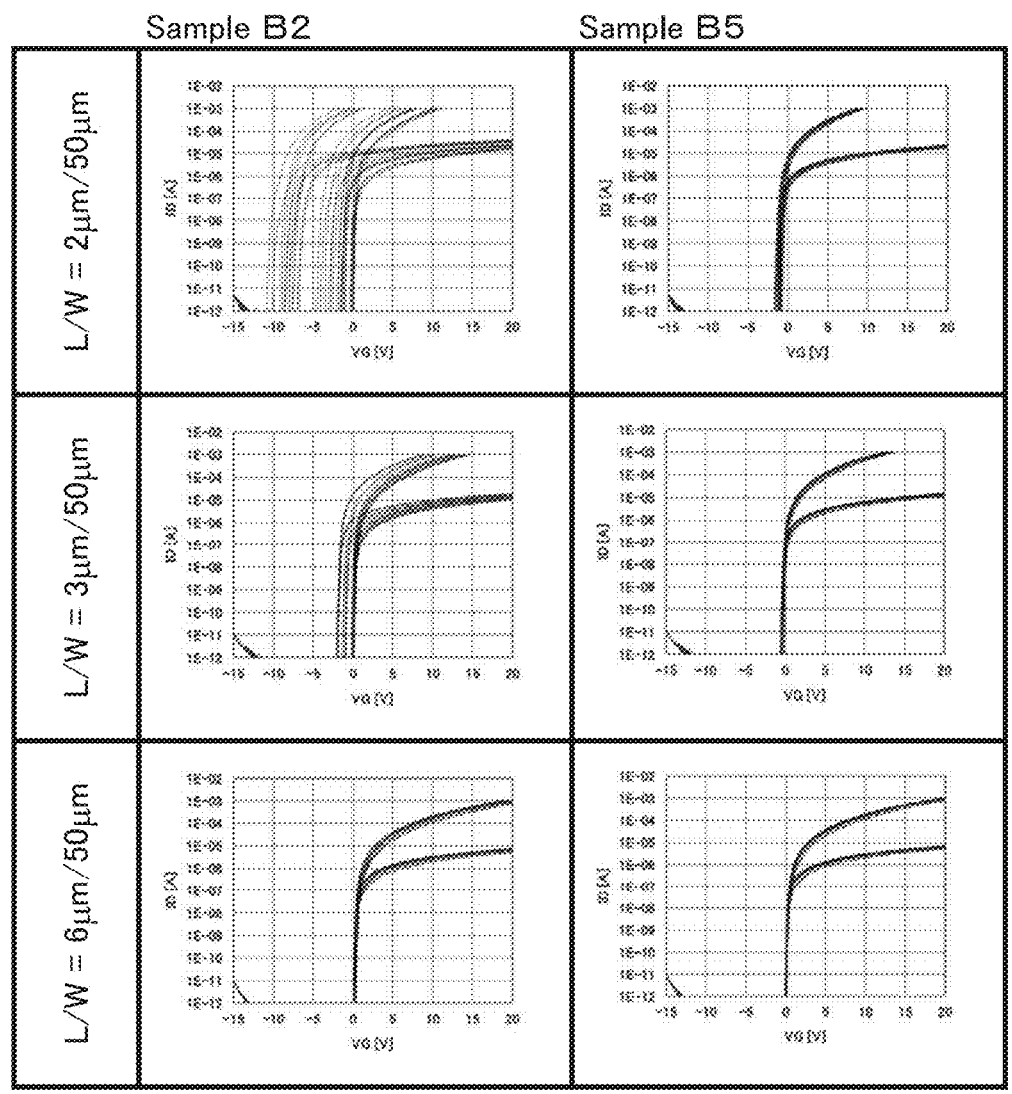
FIG. 28 shows electrical characteristics of transistors.
Figure 29:
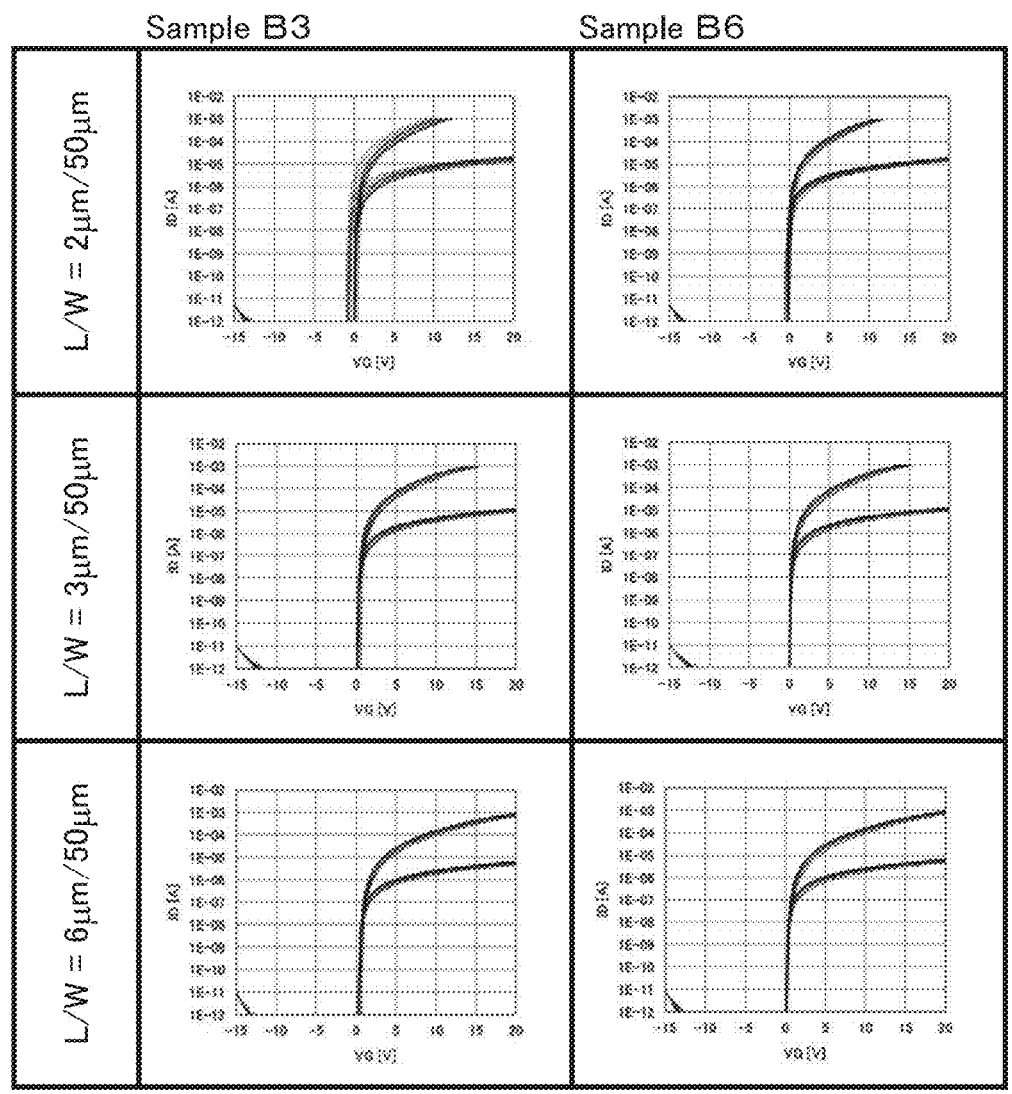
FIG. 29 shows electrical characteristics of transistors.

FIG. 27, FIG. 28, and FIG. 29 show the electrical characteristics of the transistors of the samples. FIG. 27 shows the results of Sample B1 and Sample B4 of which the highest temperature in the fabrication process was 300° C. FIG. 28 shows the results of Sample B2 and Sample B5 of which the highest temperature in the fabrication process was 320° C. FIG. 29 shows the results of Sample B3 and Sample B6 of which the highest temperature in the fabrication process was 350° C. In the results of the transistors shown in each of the drawings, the channel lengths L of the transistors are 2 μm, 3 μm, and 6 μm from the above. Note that the channel widths W of the transistors are each 50 μm.

As shown in FIG. 27, the characteristics of Sample B1 were significantly varied when the channel length L is shorter than or equal to 3 μm, whereas the characteristics of Sample B4 are favorable and less varied even when the channel length L is as short as 2 μm.

A tendency similar to that in FIG. 27 is shown in FIG. 28 and FIG. 29. That is, in Sample B2 and Sample B3, the variations in the characteristics are comparatively larger as the channel length L is shorter. Meanwhile, Sample B5 and Sample B6 have favorable characteristics with small variations.

The above results show that the transistor on which oxygen radical doping treatment is performed through the conductive film as the oxygen supply treatment can have favorable electrical characteristics even when the channel length is short and the highest temperature in the fabrication process is extremely low.

Example 4

In this example, oxygen was supplied to oxide insulating films under different conditions, and the amounts of oxygen released from the oxide insulating films were evaluated. Furthermore, the barrier properties of films formed over the oxide insulating films were also evaluated.

[Sample Fabrication]

First, sample fabrication is described. First, an approximately 150-nm-thick silicon oxynitride film was formed over a glass substrate by a plasma CVD method. Then, heat treatment was performed in a nitrogen atmosphere at 350° C. for 1 hour. After that, methods given below were used, so that Samples C1 to C4 were fabricated. In addition, a reference sample (REF) was fabricated. In the fabrication process of the reference sample, a silicon oxynitride film was formed in the above-described manner, and the treatment after the formation of the silicon oxynitride film was not performed.

[Sample C1]

In the fabrication process of Sample C1, oxygen plasma treatment was performed on the silicon oxynitride film with a plasma CVD apparatus. The oxygen plasma treatment was performed under the conditions of a temperature of 350° C., a pressure of 40 Pa, a power supply of 3000 W, an oxygen flow rate ratio of 100%, and a treatment time of 250 seconds.

[Sample C2]

In the fabrication process of Sample C2, an oxide semiconductor film (an IGZO film) was formed over the silicon oxynitride film in an atmosphere containing oxygen. The oxide semiconductor film was formed by a sputtering method using an In—Ga—Zn oxide target under the conditions of a temperature of 170° C., a pressure of 0.6 Pa, and a power supply of 2.5 kW. Here, an oxide semiconductor film was formed to a thickness of 20 nm with an oxygen flow rate ratio of 100%. Then, the oxide semiconductor film was removed by etching to expose a surface of the silicon oxynitride film.

[Sample C3]

In the fabrication process of Sample C3, an aluminum oxide film was formed over the silicon oxynitride film by a sputtering method in an atmosphere containing oxygen. The aluminum oxide film was formed by a reactive sputtering method using an aluminum target and using an oxygen gas as a deposition gas at a room temperature with a pressure of 0.8 Pa and a power supply of 3 kW. The aluminum oxide film described here was formed to a thickness of approximately 5 nm with an oxygen flow rate ratio of 60%. Then, the aluminum oxide film was removed by etching to expose a surface of the silicon oxynitride film.

[Sample C4]

In the fabrication process of Sample C4, an oxide conductive film was formed over the silicon oxynitride film, and then, oxygen radical doping treatment was performed with an ashing apparatus. As the oxide conductive film, an ITSO film was formed to a thickness of approximately 5 nm by a sputtering method. The oxygen radical doping treatment was performed under the conditions of an ICP power of 0 W, a bias power of 4500 W, a pressure of 15 Pa, an oxygen flow rate ratio of 100%, a lower electrode temperature of 40° C., and a treatment time of 120 seconds. Then, the oxide conductive film was removed by etching to expose a surface of the silicon oxynitride film.

[Analysis]

Figure 30:
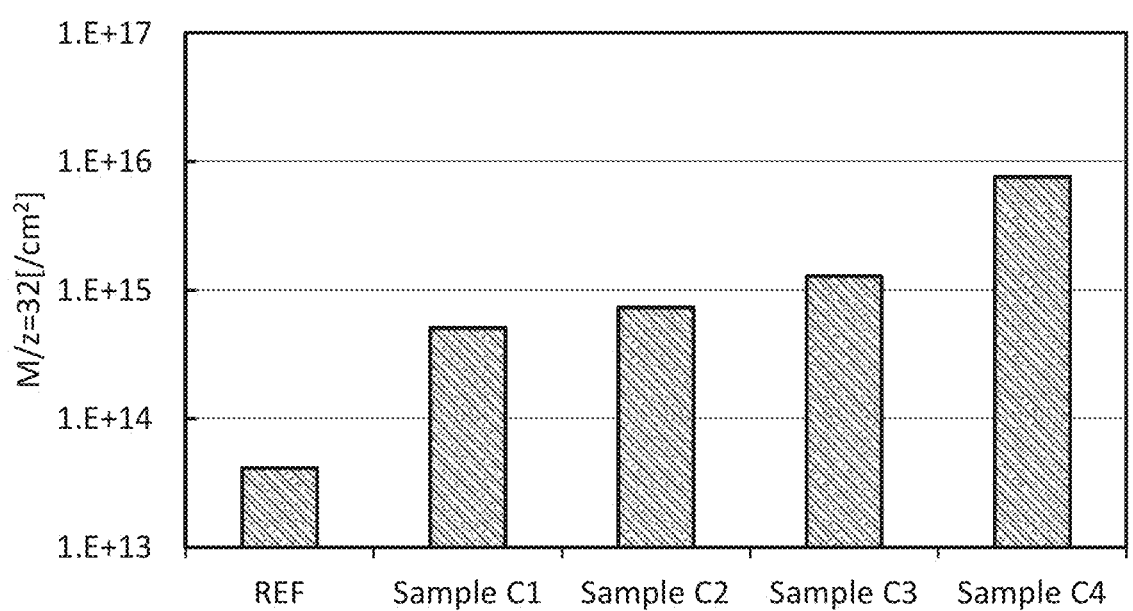
FIG. 30 shows TDS measurement results.

Then, thermal desorption spectroscopy (TDS) was performed on the fabricated samples. FIG. 30 shows the TDS analysis results of the samples. The vertical axis represents the released amount of a gas with a mass-to-charge ratio of 32 that corresponds to an oxygen molecule.

The amount of released oxygen molecules of each of Samples C1 to C4 was larger than the amount of released oxygen molecules of the reference sample REF not subjected to the treatment. In particular, in Sample C4 on which the oxygen radical doping treatment was performed through the oxide conductive film, the amount of released oxygen was larger than the amounts of released oxygen in the other samples.

Furthermore, in the results of Sample C3 in which the aluminum oxide film was formed, the oxygen release amount is larger than that in the results of Sample C2 in which the IGZO film was formed. This suggests that the aluminum oxide film is superior to the IGZO film in the function of a cap film (a barrier film) for suppressing the release of oxygen supplied to the silicon oxynitride film.
[Evaluation of Barrier Property of Aluminum Oxide Film]

Next, the barrier property of an aluminum oxide film with respect to oxygen was evaluated.

A sample used for the evaluation is described below. First, a silicon oxynitride film supplied with oxygen was formed under the conditions similar to those used for fabricating Sample C4. Then, an aluminum oxide film was formed over the silicon oxynitride film to a thickness of approximately 5 nm under the conditions similar to those used for fabricating Sample C3. In this state, first TDS analysis was performed. Then, the aluminum oxide film was removed in a manner similar to that described above, and second TDS analysis was performed.

FIG. 31A shows the TDS analysis results before the aluminum oxide film ($AlO_X$ in the drawing) is removed. FIG. 31B shows the TDS analysis results after the aluminum oxide film is removed.

As shown in the drawing, oxygen is hardly released from the silicon oxynitride film covered with the aluminum oxide film. Furthermore, the aluminum oxide film has an extremely high barrier property even with an extremely small thickness of 5 nm.

Thus, it can be seen that the aluminum oxide film formed over the oxide insulating film supplied with oxygen can favorably suppress the release of oxygen from the oxide insulating film in the treatment performed later, e.g., in heat treatment.

Example 5

In this example, transistors were fabricated under different conditions, and the electrical characteristics thereof were evaluated.
[Sample Fabrication 1]

In this example, two kinds of samples (Sample D1 and Sample D2) with different structures were fabricated.

First, fabrication steps common to Samples D1 and D2 are described. A tungsten film was formed over a glass substrate to a thickness of 100 nm by a sputtering method, and the tungsten film was processed to form a first gate electrode. Then, a silicon nitride film was formed to a thickness of approximately 400 nm as a first gate insulating layer by a plasma CVD method.

Then, a metal oxide film was formed to a thickness of approximately 40 nm by a sputtering method using an In—Ga—Zn oxide target (an atomic ratio of In:Ga:Zn=4:2:4.1), and the metal oxide film was processed to form a semiconductor layer. Then, a silicon oxynitride film was formed to a thickness of approximately 150 nm as a second gate insulating layer by a plasma CVD method. Then, first heat treatment was performed in a nitrogen atmosphere.

Then, an ITSO film with a thickness of approximately 5 nm was formed by a sputtering method over the second gate insulating layer, and oxygen radical doping treatment was performed with an ashing apparatus through the ITSO film. The oxygen radical doping treatment was performed under the conditions of an ICP power of 0 W, a bias power of 4500 W, a pressure of 15 Pa, an oxygen flow rate ratio of 100%, a lower electrode temperature of 40° C., and a treatment time of 120 seconds.

Then, oxygen supply treatment and the formation of a second gate electrode were performed by a method described later.

Then, plasma treatment was performed on an exposed part of the semiconductor layer in an argon and nitrogen atmosphere. Then, as a protective insulating layer for covering the transistor, an approximately 100-nm-thick silicon nitride film and an approximately 300-nm-thick silicon oxynitride film were formed in succession by a plasma CVD method. Note that the formation temperature of the protective insulating layer was 220° C. Then, second heat treatment was performed in a nitrogen atmosphere. Then, an opening was formed in the part of the insulating layer covering the transistor. Then, a titanium film, an aluminum film, and a titanium film were formed by a sputtering method in this order, and the films were processed. Thus, a source electrode and a drain electrode were formed.
[Sample D1]

In the method for forming the second gate electrode in Sample D1, first, a metal oxide film was formed to a thickness of approximately 100 nm by a sputtering method. The metal oxide film was formed using an In—Ga—Zn oxide target under the conditions of a temperature of 170° C., a pressure of 0.6 Pa, and a power supply of 2.5 kW. Here, an oxide semiconductor film was formed to a thickness of 10 nm with an oxygen flow rate ratio of 100%, and then, an oxide semiconductor film was formed to a thickness of approximately 90 nm with an oxygen flow rate ratio of 10%. Then, the metal oxide film and the silicon oxynitride film were processed in succession to form a second gate electrode and a second gate insulating layer. Then, plasma treatment was performed on an exposed part of the semiconductor layer and the second gate electrode in an argon and nitrogen atmosphere.

That is, Sample D1 is a transistor in which the metal oxide film was used as the second gate electrode.
[Sample D2]

In the fabrication process of Sample D2, first, an aluminum oxide film was formed over the silicon oxynitride film by a sputtering method in an atmosphere containing oxygen. The aluminum oxide film was formed by a reactive sputtering method using an aluminum target and using an oxygen gas as a deposition gas at a room temperature with a pressure of 0.8 Pa and a power supply of 3 kW. The aluminum oxide film described here was formed to a thickness of approximately 5 nm with an oxygen flow rate ratio of 60%.

Then, a molybdenum film was formed by a sputtering method to a thickness of approximately 100 nm over the aluminum oxide film.

That is, Sample D2 is a transistor in which the molybdenum film was used as the second gate electrode. Furthermore, Sample D2 is a transistor including the aluminum oxide film serving as a barrier film between the second gate insulating layer and the second gate electrode.
[Electrical Characteristics 1 of Transistor]

Next, $I_d$-$V_g$ characteristics of transistors of the fabricated samples were measured. As conditions for measuring the $I_d$-$V_g$ characteristics of each transistor, a gate voltage ($V_g$) and a gate voltage ($V_{bg}$) changed from −15 V to +20 V in increments of 0.25 V. Furthermore, the source voltage ($V_s$) was 0 V (comm), and the drain voltage ($V_d$) was 0.1 V and 20 V. The number of measured transistors was 20 for each sample.

Figure 32:
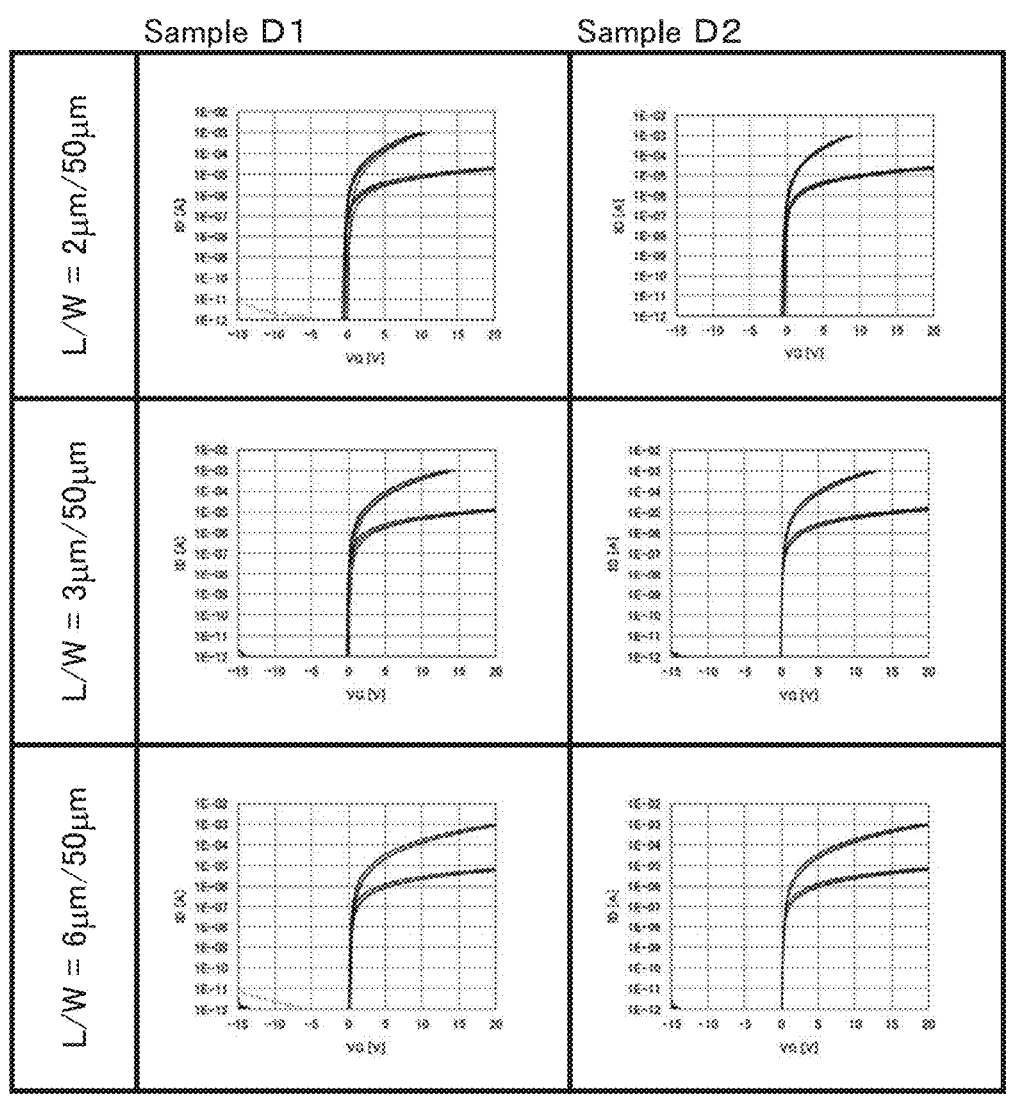
FIG. 32 shows electrical characteristics of transistors.

FIG. 32 shows the electrical characteristics of the transistors of the samples. FIG. 32 shows the results of Sample D1 and Sample D2. In the results of the transistors shown in each of the drawings, the channel lengths L of the transistors are 2 μm, 3 μm, and 6 μm from the above. Note that the channel widths W of the transistors are each 50 μm.

As shown in FIG. 32, the transistors fabricated under all of the conditions had favorable electrical characteristics. In particular, in Sample D2 in which the second gate electrode including a metal material is used and the aluminum oxide film serving as a barrier film is used, the variations in the characteristics are more reduced.

Figure 33:
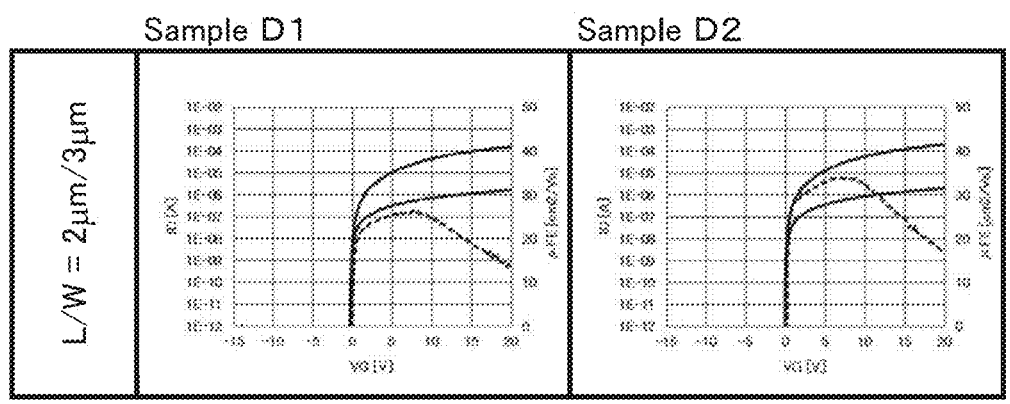
FIG. 33 shows electrical characteristics of transistors.

FIG. 33 shows the results of transistors each having a channel length of 2 μm and a channel width of 3 μm. Note that the drain voltage ($V_d$) was 0.1 V and 10 V here. In each of the graphs, the field-effect mobility at $V_d$=10 V is also shown.

As shown in FIG. 33, the field-effect mobility of Sample D2 is higher than that of Sample D1. The maximum value of the field-effect mobility at a drain voltage ($V_d$) of 10 V in Sample D1 was approximately 26.4 [$cm^2/V_s$], whereas the maximum value of the field-effect mobility at a drain voltage ($V_d$) of 10 V in Sample D2 was approximately 34.1 [$cm^2/Vs$].

Sample D1 and Sample D2 were subjected to a gate bias-temperature stress test (GBT test). In the GBT test, a substrate over which the transistor was formed was held at 60° C., a voltage of 0 V was applied to a source and a drain of the transistor, and a voltage of 20 V or −20 V was applied to a gate; this state was held for 1 hour. A test in which a positive voltage is applied to the gate and the test environment is dark is referred to as positive GBT or PBTS, and a test in which a negative voltage is applied to the gate and the test environment is dark is referred to as negative GBT or NBTS. A positive GBT in a state where a sample is irradiated with light is referred to as PBITS, and a negative GBT in a state where a sample is irradiated with light is referred to as NBITS. For the light irradiation, white LED light with approximately 10000 lx was used.

Figure 34:
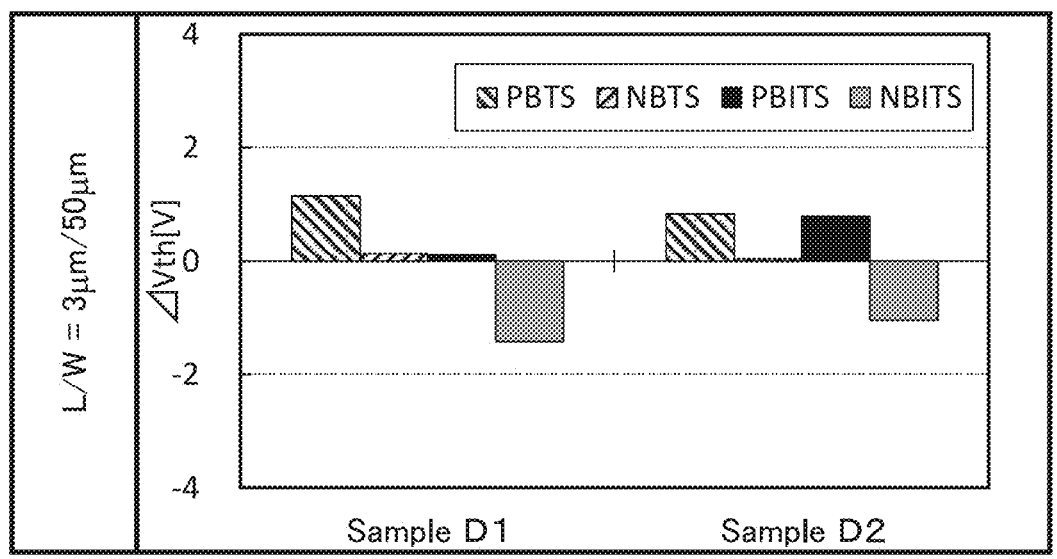
FIG. 34 shows reliability test results of transistors.

FIG. 34 shows the GBT test results of transistors each having a channel length of 3 μm and a channel width of 50 μm. The vertical axis represents the amount of change in the threshold voltage ($V_{th}$). It can be seen from the results that the amount of change in the threshold voltage is extremely small in each of the samples.

When the oxide insulating film of a silicon oxide or the like is in contact with a metal film, oxygen in the oxide insulating film is diffused into the metal film and is reduced in some cases. Hence, when the second gate electrode including the metal film is in contact with the second gate insulating layer, the amount of oxygen to be supplied to the semiconductor layer is reduced, and the electrical characteristics of the transistor deteriorate in some cases. However, with the use of the aluminum oxide film, which serves as a barrier film for preventing the diffusion of oxygen, extremely favorable electrical characteristics and high reliability can be achieved as described above.

[Sample Fabrication 2]

Next, two kinds of transistors (Sample D3 and Sample D4) each including a second gate electrode formed using a material different from that used to form the second gate electrode of Sample D2 were fabricated.

[Sample D3]

Sample D3 is a transistor in which stacked films of an aluminum film and a titanium film were used as the second gate electrode. In Sample D3, an approximately 200-nm-thick aluminum film and an approximately 50-nm-thick titanium film were each formed by a sputtering method.

[Sample D4]

Sample D4 is a transistor in which stacked films of a titanium film, an aluminum film, and a titanium film were used as the second gate electrode. In Sample D4, an approximately 50-nm-thick titanium film, an approximately 200-nm-thick aluminum film, and an approximately 50-nm-thick titanium film were each formed by a sputtering method.

[Electrical Characteristics 2 of Transistor]

Figure 35:
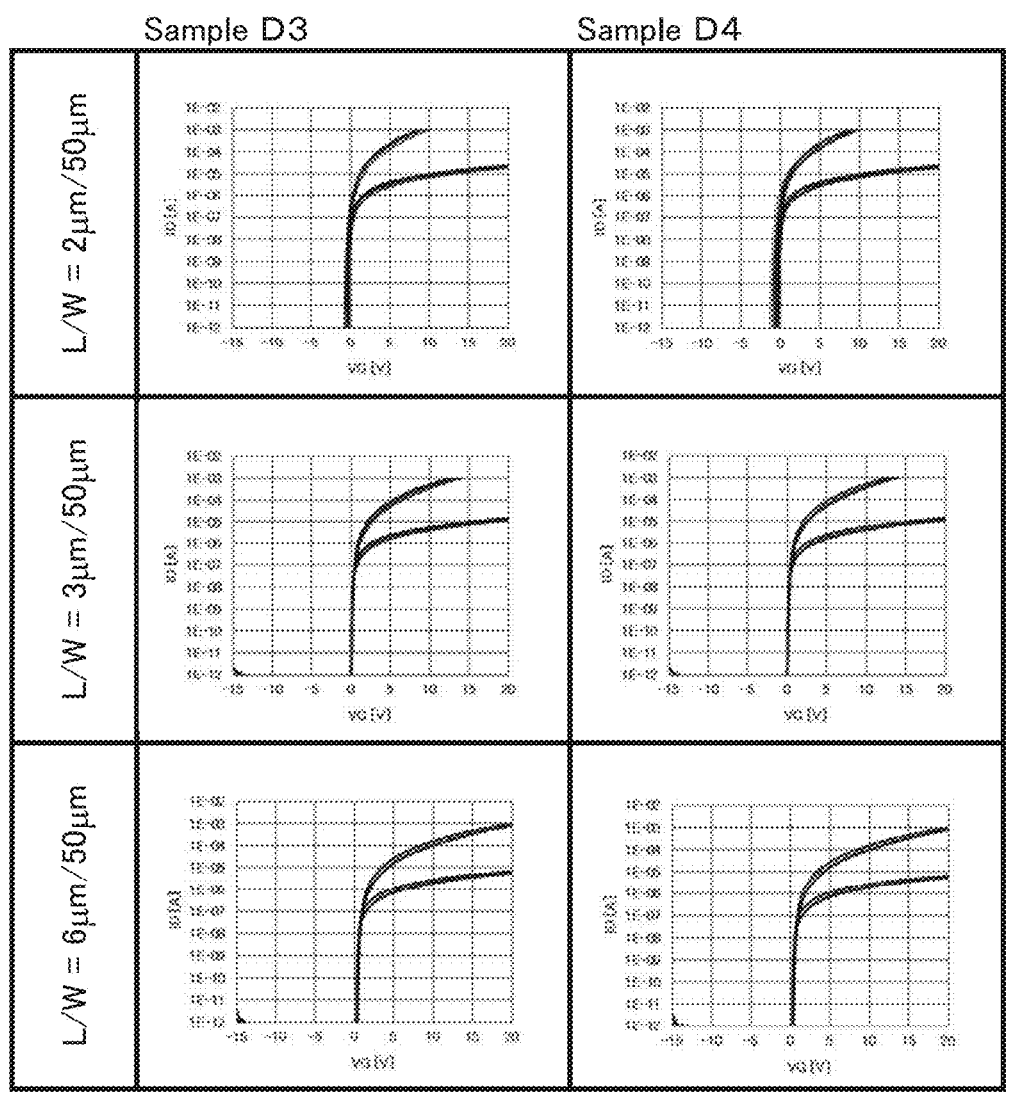
FIG. 35 shows electrical characteristics of transistors.

FIG. 35 shows the electrical characteristics of the transistors of Sample D3 and Sample D4. In the results of the transistors shown in each of the drawings, the channel lengths L of the transistors are 2 μm, 3 μm, and 6 μm from the above. Note that the channel widths W of the transistors are each 50 μm. The measurement conditions are similar to those used to measure Sample D1 and Sample D2.

As shown in FIG. 35, favorable electrical characteristics can be obtained also in the case where the metal film of the second gate electrode was changed.

Thus, it can be seen that, when the aluminum oxide film that serves as a barrier film for preventing the diffusion of oxygen is used, a variety of metal materials can be used for the second gate electrode, and thus, a material of the second gate electrode can be selected more freely.

This application is based on Japanese Patent Application Serial No. 2016-250246 filed with Japan Patent Office on Dec. 23, 2016 and Japanese Patent Application Serial No. 2017-012309 filed with Japan Patent Office on Jan. 26, 2017, the entire contents of which are hereby incorporated by reference.

What is claimed is:

1. A manufacturing method of a semiconductor device, comprising:
   a first step of forming an oxide semiconductor layer over a first insulating film;
   a second step of forming a second insulating film and a first conductive film in this order to cover the oxide semiconductor layer;
   a third step of supplying oxygen to the second insulating film through the first conductive film;
   a fourth step of removing the first conductive film;
   a fifth step of forming a metal oxide film over the second insulating film in an atmosphere containing oxygen;
   a sixth step of forming a first gate electrode by processing the metal oxide film;
   a seventh step of forming a third insulating film to cover the first gate electrode and the second insulating film; and
   an eighth step of performing a first heat treatment,
   wherein the second insulating film and the third insulating film each include an oxide,
   wherein the first to the eighth steps are performed in this order, and
   wherein the highest temperature in the first to the eighth steps is lower than or equal to 340° C.

2. The manufacturing method of a semiconductor device, according to claim 1, further comprising:
   a ninth step of forming a first layer including an organic compound over a substrate and forming the first insulating film over the first layer; and
   a tenth step of separating the substrate and the first layer from each other,
   wherein the ninth step is performed before the first step, and
   wherein the tenth step is performed after the eighth seventh step.

3. The manufacturing method of a semiconductor device, according to claim 1,
wherein, in the third step, oxygen plasma treatment is performed with an apparatus including a pair of parallel-plate electrodes in a state where a bias voltage is applied between the pair of electrodes.

4. The manufacturing method of a semiconductor device, according to claim 1,
wherein, in the fifth step, the metal oxide film is formed by a sputtering method in an atmosphere in which oxygen partial pressure is higher than or equal to 50% and lower than or equal to 100%.

5. The manufacturing method of a semiconductor device, according to claim 1,
wherein, in the second step, the first conductive film is formed to include a metal or a metal oxide and have a thickness of greater than or equal to 2 nm and less than or equal to 10 nm.

6. The manufacturing method of a semiconductor device, according to claim 1, further comprising an eleventh step of performing a second heat treatment,
wherein the eleventh step is performed between the first step and the second step,
wherein the second heat treatment is performed in an atmosphere containing nitrogen, and
wherein the highest temperature in the second heat treatment is lower than or equal to 340° C.

7. The manufacturing method of a semiconductor device, according to claim 1, further comprising a twelfth step of forming a second gate electrode,
wherein the twelfth step is performed before the first step, and
wherein the first insulating film is formed to cover the second gate electrode.

8. The manufacturing method of a semiconductor device, according to claim 1,
wherein, in the sixth step, the metal oxide film and the second insulating film are processed so that a part of the oxide semiconductor layer is exposed,
wherein a thirteenth step of forming a fourth insulating film including hydrogen in contact with the exposed part of the oxide semiconductor layer is included, and
wherein the thirteenth step is performed between the sixth step and the seventh step.

9. The manufacturing method of a semiconductor device, according to claim 1, further comprising:
a fourteenth step of supplying an impurity to the part of the oxide semiconductor layer that is not covered with the first gate electrode, through the second insulating film,
wherein the fourteenth step is performed between the sixth step and the seventh step.

10. A manufacturing method of a semiconductor device, comprising:
forming an oxide semiconductor layer;
forming a first insulating film over the oxide semiconductor layer;
forming a conductive film over the first insulating film;
supplying oxygen to the first insulating film through the conductive film;
removing the conductive film; and
forming a gate electrode.

11. A manufacturing method of a semiconductor device, comprising:
forming an oxide semiconductor layer;
forming a first insulating film over the oxide semiconductor layer;
forming a conductive film over the first insulating film;
supplying oxygen to the first insulating film through the conductive film;
removing the conductive film;
forming a metal oxide film over the first insulating film in an atmosphere containing oxygen;
forming a gate electrode by processing the metal oxide film;
forming a second insulating film over the gate electrode; and
performing a heat treatment.

* * * * *